US012757628B2

(12) United States Patent
Lee et al.

(10) Patent No.: US 12,757,628 B2
(45) Date of Patent: Oct. 6, 2026

(54) LIGHT-EMITTING DEVICE INCLUDING HETEROCYCLIC COMPOUND, ELECTRONIC APPARATUS INCLUDING THE SAME, AND THE HETEROCYCLIC COMPOUND

(71) Applicant: Samsung Display Co., Ltd., Yongin-si (KR)

(72) Inventors: Yeseul Lee, Yongin-si (KR); Hyeongmin Kim, Yongin-si (KR); Youngjin Park, Yongin-si (KR); Heechoon Ahn, Yongin-si (KR); Hyunah Um, Yongin-si (KR); Juhui Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 893 days.

(21) Appl. No.: 18/175,459

(22) Filed: Feb. 27, 2023

(65) Prior Publication Data

US 2023/0284519 A1 Sep. 7, 2023

(30) Foreign Application Priority Data

Mar. 3, 2022 (KR) ........................ 10-2022-0027647

(51) Int. Cl.
*H10K 85/40* (2023.01)
*C07F 7/08* (2006.01)
(Continued)

(52) U.S. Cl.
CPC ........... *H10K 85/40* (2023.02); *C07F 7/0812* (2013.01); *H10K 10/46* (2023.02); *H10K 10/84* (2023.02);
(Continued)

(58) Field of Classification Search
CPC .. H10K 85/40; H10K 85/657; H10K 85/6572; C07D 471/10; C07D 491/107; C07F 7/0812
See application file for complete search history.

(56) References Cited

U.S. PATENT DOCUMENTS 11,050,026 B2 6/2021 Cha et al.

FOREIGN PATENT DOCUMENTS

KR 10-2012-0015883 A 2/2012
KR 20120015883 A * 2/2012 ......... H10K 85/6572
(Continued)

*Primary Examiner* — Vu A Nguyen
(74) *Attorney, Agent, or Firm* — Womble Bond Dickinson (US) LLP

(57) ABSTRACT

A light-emitting device includes a first electrode; a second electrode facing the first electrode; an interlayer between the first electrode and the second electrode, the interlayer including an emission layer, and a heterocyclic compound represented by Formula 1, and an electronic apparatus includes the light-emitting device:

Formula 1

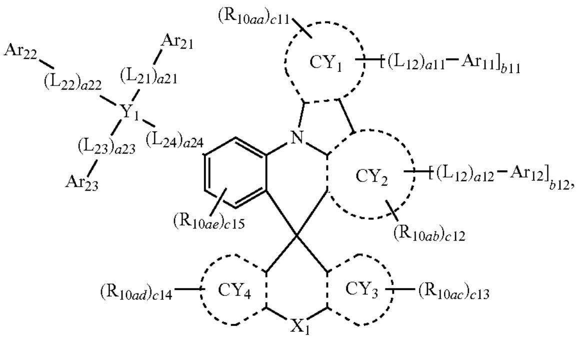

wherein Formula 1 is as defined in the present specification.

20 Claims, 3 Drawing Sheets

(51) Int. Cl.

| | |
|---|---|
| ***H10K 10/46*** | (2023.01) |
| ***H10K 10/84*** | (2023.01) |
| ***H10K 85/60*** | (2023.01) |
| ***H10K 101/10*** | (2023.01) |
| ***H10K 101/30*** | (2023.01) |

(52) U.S. Cl.
CPC ....... *H10K 85/657* (2023.02); *H10K 85/6572* (2023.02); *H10K 85/6574* (2023.02); *H10K 85/6576* (2023.02); *C07B 2200/05* (2013.01); *H10K 2101/10* (2023.02); *H10K 2101/30* (2023.02)

(56) References Cited

FOREIGN PATENT DOCUMENTS

| | | | | | |
|---|---|---|---|---|---|
| KR | 10-2016-0034832 | A | | 3/2016 | |
| KR | 10-2017-0057856 | A | | 5/2017 | |
| KR | 10-2019-0113664 | A | | 10/2019 | |
| KR | 20190113664 | A | * | 10/2019 | ........... C07D 491/20 |

* cited by examiner

LIGHT-EMITTING DEVICE INCLUDING HETEROCYCLIC COMPOUND, ELECTRONIC APPARATUS INCLUDING THE SAME, AND THE HETEROCYCLIC COMPOUND

CROSS-REFERENCE TO RELATED APPLICATION

This application claims priority to and the benefit of Korean Patent Application No. 10-2022-0027647, filed on Mar. 3, 2022, in the Korean Intellectual Property Office, the entire content of which is incorporated herein by reference.

BACKGROUND

1. Field

One or more aspects of embodiments of the present disclosure relate to a light-emitting device including a heterocyclic compound, an electronic apparatus including the light-emitting device, and the heterocyclic compound.

2. Description of the Related Art

Self-emissive devices among light-emitting devices have relatively wide viewing angles, high contrast ratios, short response times, and excellent or desirable characteristics in terms of luminance, driving voltage, and/or response speed.

In a light-emitting device, a first electrode is provided on a substrate, and a hole transport region, an emission layer, an electron transport region, and a second electrode are sequentially provided on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons are transitioned from an excited state to a ground state to thereby generate light.

SUMMARY

One or more aspects of embodiments of the present disclosure are directed toward a light-emitting device including a heterocyclic compound, an electronic apparatus including the light-emitting device, and the heterocyclic compound.

Additional aspects will be set forth in part in the description which follows and, in part, will be apparent from the description, or may be learned by practice of the presented embodiments of the disclosure.

According to one or more embodiments, provided is a light-emitting device including:

a first electrode, a second electrode facing the first electrode, an interlayer located between the first electrode and the second electrode and including an emission layer, and a heterocyclic compound represented by Formula 1

Formula 1

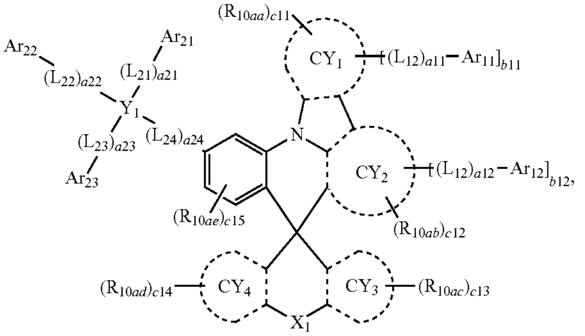

wherein $X_1$ may be a single bond, O, S, $N(Q_1)$, $P(Q_1)$, $C(Q_1)(Q_2)$, or $Si(Q_1)(Q_2)$, $Y_1$ may be C or Si, rings $CY_1$ to $CY_4$ may each independently be a $C_6$-$C_{60}$ carbocyclic group or a $C_3$-$C_{60}$ heterocyclic group, $L_{11}$, $L_{12}$, $L_{21}$, $L_{22}$, $L_{23}$, $L_{24}$, $Ar_{11}$, $Ar_{12}$, $Ar_{21}$, $Ar_{22}$, and $Ar_{23}$ may each independently be a $C_6$-$C_{60}$ carbocyclic group unsubstituted or substituted with at least one $R_{10a}$ or a $C_3$-$C_{60}$ heterocyclic group unsubstituted or substituted with at least one $R_{10a}$, a11, a12, a21, a22, a23, and a24 may each independently be an integer from 0 to 3,

*-$(L_{11})_{a11}$-*' may be a single bond when a11 is 0,

*-$(L_{12})_{a12}$-*' may be a single bond when a12 is 0,

*-$(L_{21})_{a21}$-*' may be a single bond when a21 is 0,

*-$(L_{22})_{a22}$-*' may be a single bond when a22 is 0,

*-$(L_{23})_{a23}$-*' may be a single bond when a23 is 0,

*-$(L_{24})_{a24}$-*' may be a single bond when a24 is 0,

* and *' each indicate a binding site to a neighboring atom, b11 and b12 may each independently be an integer from 0 to 4, $R_{10a}$, $R_{10aa}$, $R_{10ab}$, $R_{10ac}$, $R_{10ad}$, and $R_{10ae}$ may each independently be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof, or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, c11 to c14 may each independently be an integer from 0 to 8, c15 may be an integer from 0 to 3, a sum of b11+c11 is 8 or less, a sum of b12+c12 is 8 or less, $Q_1$, $Q_2$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

According to one or more embodiments, provided is an electronic apparatus including the light-emitting device.

According to one or more embodiments, provided is the heterocyclic compound represented by Formula 1.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
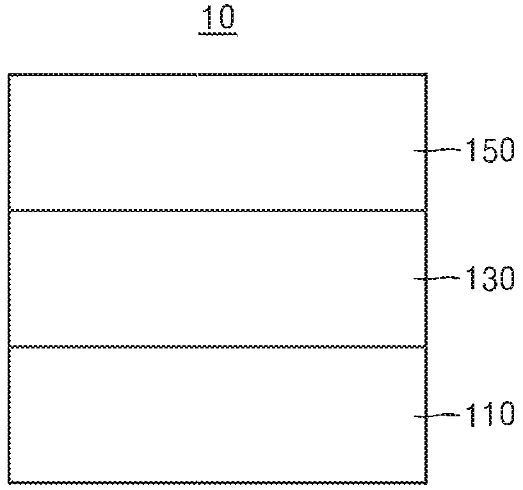
FIG. 1 is a schematic view of a light-emitting device according to one or more embodiments.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description.

As utilized herein, the term "and/or" includes any and all combinations of one or more of the associated listed items.

As used herein, expressions such as "at least one of", "one of", and "selected from", when preceding a list of elements, modify the entire list of elements and do not modify the individual elements of the list. For example, throughout the disclosure, the expressions "at least one selected from a, b and c", "at least one of a, b or c", and "at least one of a, b and/or c" indicate only a, only b, only c, both (e.g., simultaneously) a and b, both (e.g., simultaneously) a and c, both (e.g., simultaneously) b and c, all of a, b, and c, or variations thereof.

As used herein, the singular forms "a", "an" and "the" (e.g., a film, a quantum dot, etc.,) are intended to include the plural forms as well, unless the context clearly indicates otherwise.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate.

Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

One or more embodiments of the present disclosure provide a light-emitting device including: a first electrode; a second electrode facing the first electrode; an interlayer located between the first electrode and the second electrode and including an emission layer; and a heterocyclic compound represented by Formula 1:

Formula 1

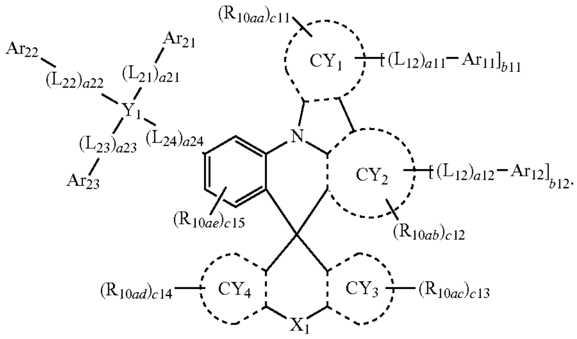

In Formula 1, $X_1$ may be a single bond, O, S, $N(Q_1)$, $P(Q_1)$, $C(Q_1)(Q_2)$, or $Si(Q_1)(Q_2)$, $Y_1$ may be C or Si, rings $CY_1$ to $CY_4$ may each independently be a $C_6$-$C_{60}$ carbocyclic group or a $C_3$-$C_{60}$ heterocyclic group, $L_{11}$, $L_{12}$, $L_{21}$, $L_{22}$, $L_{23}$, $L_{24}$, $Ar_{11}$, $Ar_{12}$, $Ar_{21}$, $Ar_{22}$, and $Ar_{23}$ may each independently be a $C_6$-$C_{60}$ carbocyclic group unsubstituted or substituted with at least one $R_{10a}$ or a $C_3$-$C_{60}$ heterocyclic group unsubstituted or substituted with at least one $R_{10a}$, a11, a12, a21, a22, a23, and a24 may each independently be an integer from 0 to 3, $*-(L_{11})_{a11}-*'$ may be a single bond when a11 is 0, $*-(L_{12})_{a12}-*'$ may be a single bond when a12 is 0, $*-(L_{21})_{a21}-*'$ may be a single bond when a21 is 0, $*-(L_{22})_{a22}-*'$ may be a single bond when a22 is 0, $*-(L_{23})_{a23}-*'$ may be a single bond when a23 is 0, $*-(L_{24})_{a24}-*'$ may be a single bond when a24 is 0,

* and *' each indicate a binding site to a neighboring atom, b11 and b12 may each independently be an integer of 0 to 4, $R_{10a}$, $R_{10aa}$, $R_{10ab}$, $R_{10ac}$, $R_{10ad}$, and $R_{10ae}$ may each independently be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or any combination thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$, c11 to c14 may each independently be an integer from 0 to 8, c15 may be an integer from 0 to 3, a sum of b11+c11 may be 8 or less, a sum of b12+c12 may be 8 or less, $Q_1$, $Q_2$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In the light-emitting device according to one or more embodiments, the interlayer may include the heterocyclic compound represented by Formula 1.

In the light-emitting device according to one or more embodiments, the emission layer may include the heterocyclic compound represented by Formula 1.

In the light-emitting device according to one or more embodiments, the first electrode may be an anode, the second electrode may be a cathode, the interlayer may further include a hole transport region arranged between the first electrode and the emission layer, and an electron transport region arranged between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In the light-emitting device according to one or more embodiments, a first capping layer and/or a second capping layer may be further included, wherein at least one of the first capping layer and/or the second capping layer may be arranged on a surface of the second electrode, and the second capping layer may be arranged on the first capping layer.

In the light-emitting device according to one or more embodiments, one of the first capping layer and/or the second capping layer may include the heterocyclic compound represented by Formula 1.

In the light-emitting device according to one or more embodiments, the emission layer may further include a phosphorescence emitter.

In the light-emitting device according to one or more embodiments, the emission layer may further include a delayed fluorescence emitter.

In the light-emitting device according to one or more embodiments, the emission layer may be to emit blue light.

The present disclosure also provides for an electronic apparatus including the light-emitting device according to one or more embodiments.

The electronic apparatus according to one or more embodiments may further include a thin-film transistor, wherein the thin-film transistor may include a source electrode and a drain electrode, and the first electrode of the light-emitting device may be electrically connected to one of the source or drain electrodes of the thin-film transistor.

The electronic apparatus according to one or more embodiments may further include a color filter, a color conversion layer, a touch screen layer, a polarizing layer, or any combination thereof.

One or more embodiments of the present disclosure provide for the heterocyclic compound represented by Formula 1:

Formula 1

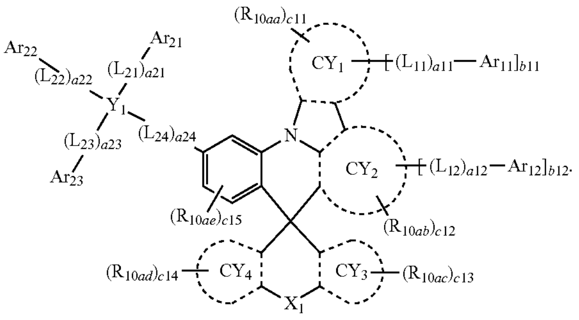

In Formula 1, $X_1$ may be a single bond, O, S, $N(Q_1)$, $P(Q_1)$, $C(Q_1)(Q_2)$, or $Si(Q_1)(Q_2)$, $Y_1$ may be C or Si, rings $CY_1$ to $CY_4$ may each independently be a $C_6$-$C_{60}$ carbocyclic group or a $C_3$-$C_{60}$ heterocyclic group, $L_{11}$, $L_{12}$, $L_{21}$, $L_{22}$, $L_{23}$, $L_{24}$, $Ar_{11}$, $Ar_{12}$, $Ar_{21}$, $Ar_{22}$, and $Ar_{23}$ may each independently be a $C_6$-$C_{60}$ carbocyclic group unsubstituted or substituted with at least one $R_{10a}$ or a $C_3$-$C_{60}$ heterocyclic group unsubstituted or substituted with at least one $R_{10a}$, a11, a12, a21, a22, a23, and a24 may each independently be an integer from 0 to 3, $*-(L_{11})_{a11}-*'$ may be a single bond when a11 is 0, $*-(L_{12})_{a12}-*'$ may be a single bond when a12 is 0, $*-(L_{21})_{a21}-*'$ may be a single bond when a21 is 0, $*-(L_{22})_{a22}-*'$ may be a single bond when a22 is 0, $*-(L_{23})_{a23}-*'$ may be a single bond when a23 is 0, $*-(L_{24})_{a24}-*'$ may be a single bond when a24 is 0,

* and *' each indicate a binding site to a neighboring atom, b11 and b12 may each independently be an integer of 0 to 4, $R_{10a}$, $R_{10aa}$, $R_{10ab}$, $R_{10ac}$, $R_{10ad}$, and $R_{10ae}$ may each independently be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, c11 to c14 may each independently be an integer from 0 to 8, c15 may be an integer from 0 to 3, a sum of b11+c11 may be 8 or less, a sum of b12+c12 may be 8 or less, $Q_1$, $Q_2$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

The heterocyclic compound according to one or more embodiments may satisfy at least one of Conditions i) to iv):

i) ring $CY_1$ is a benzene group and a sum of b11+c11 is 4 or less, or ring $CY_1$ is a naphthalene group and a sum of b11+c11 is 6 or less;

ii) ring $CY_2$ is a benzene group and a sum of b12+c12 is 4 or less, or ring $CY_2$ is a naphthalene group and a sum of b12+c12 is 6 or less;

iii) ring $CY_3$ is a benzene group and c13 is 4 or less, or ring $CY_3$ is a naphthalene group and c13 is 6 or less; and iv) ring $CY_4$ is a benzene group and c14 is 4 or less, or ring $CY_4$ is a naphthalene group and c14 is 6 or less.

In the heterocyclic compound according to one or more embodiments, $L_{11}$, $L_{12}$, $L_{21}$, $L_{22}$, $L_{23}$, $L_{24}$, $Ar_{11}$, $Ar_{12}$, $Ar_{21}$, $Ar_{22}$, and $Ar_{23}$ may each independently be one of a benzene group unsubstituted or substituted with at least one $R_{10a}$, a naphthalene group unsubstituted or substituted with at least one $R_{10a}$, or a π electron-rich $C_3$-$C_{60}$ cyclic group unsubstituted or substituted with at least one $R_{10a}$.

In the heterocyclic compound according to one or more embodiments, $L_{11}$, $L_{12}$, $L_{21}$, $L_{22}$, $L_{23}$, and $L_{24}$ may each independently be one of Formulae 1-5-1 to 1-5-3:

1-5-1

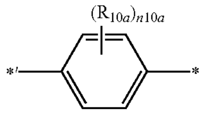

1-5-2

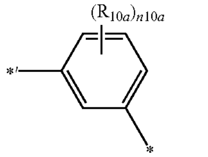

1-5-3

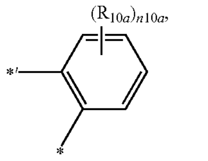

wherein, in Formulae 1-5-1 to 1-5-3, $R_{10a}$ may be the same as described in connection with Formula 1, n10a may be an integer from 0 to 4, and

*and *' each indicate a binding site to a neighboring atom.

In the heterocyclic compound according to one or more embodiments, $L_{11}$, $L_{12}$, $L_{21}$, $L_{22}$, $L_{23}$, and $L_{24}$ may each independently be one of Formulae 1-5-4 to 1-5-6:

1-5-4

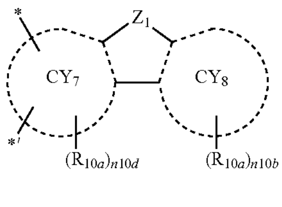

1-5-5

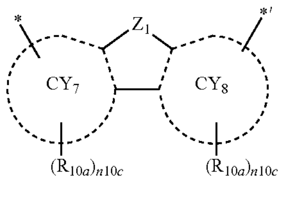

-continued 1-5-6

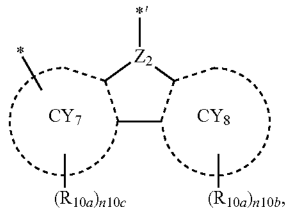

wherein, in Formulae 1-5-4 to 1-5-6, $Z_1$ may be O, S, $N(Q_5)$, $P(Q_5)$, $C(Q_5)(Q_6)$, or $Si(Q_5)(Q_6)$, $Z_2$ may be N, P, $C(Q_5)$, or $Si(Q_6)$, $CY_7$ and $CY_8$ may each independently be a $C_3$-$C_{30}$ carbocyclic group or a $C_1$-$C_{30}$ heterocyclic group, n10b may be an integer from 0 to 6, n10c may be an integer from 0 to 5, n10d may be an integer from 0 to 4,

* and *' each indicate a binding site to a neighboring atom, and $Q_5$ and $Q_6$ may respectively be the same as described in connection with $Q_1$ and $Q_2$.

In the heterocyclic compound according to one or more embodiments, a portion represented by

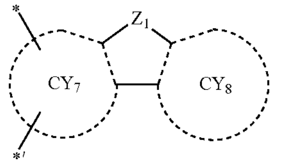

in Formula 1-5-4 may be one of Formulae 1-5-4a to 1-5-4f:

1-5-4a

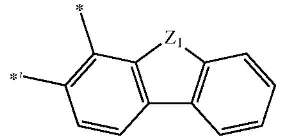

1-5-4b

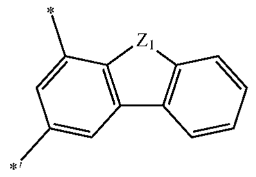

1-5-4c

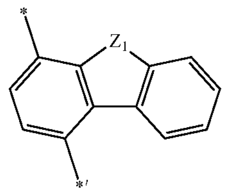

-continued
1-5-4d
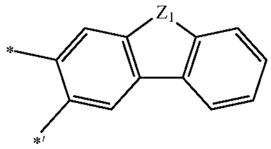
1-5-4e
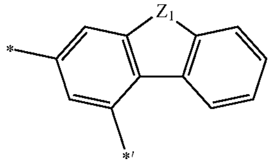
1-5-4f
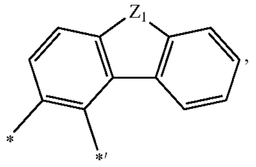
wherein, in Formulae 1-5-4a to 1-5-4f,
$Z_1$ may be the same as described in connection with Formulae 1-5-4 and 1-5-5.
In the heterocyclic compound according to one or more embodiments,
a portion represented by
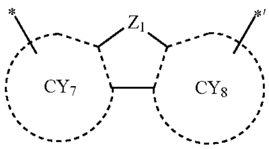
in Formula 1-5-5 may be on of Formulae 1-5-5a to 1-5-5p:
1-5-5a
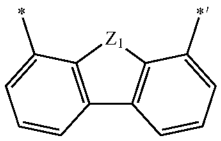
1-5-5b
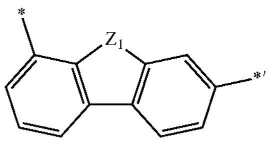
1-5-5c
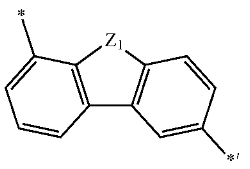
-continued
1-5-5d
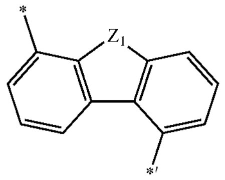
1-5-5e
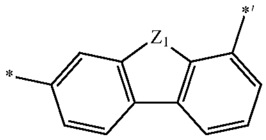
1-5-5f
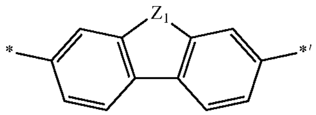
1-5-5g
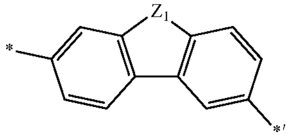
1-5-5h
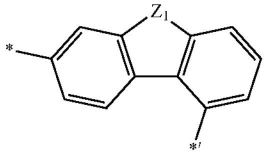
1-5-5i
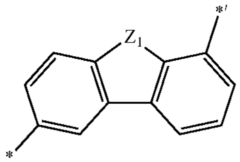
1-5-5j
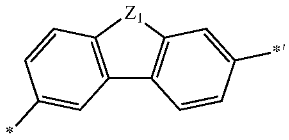
1-5-5k
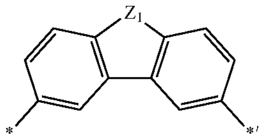
1-5-5l
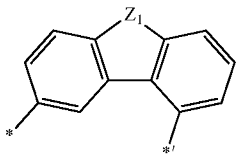
1-5-5m
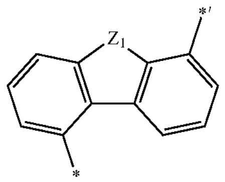

-continued 1-5-5n

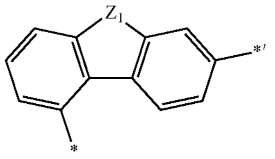

1-5-5o

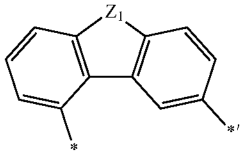

1-5-5p

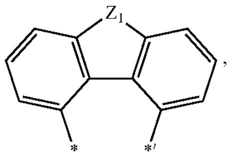

wherein, in Formulae 1-5-5a to 1-5-5p, $Z_1$ may be the same as described in connection with Formulae 1-5-4 and 1-5-5.

In the heterocyclic compound according to one or more embodiments, a portion represented by

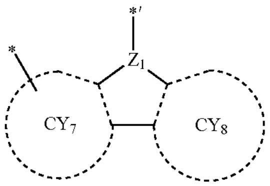

in Formula 1-5-6 may be on of Formulae 1-5-6a to 1-5-6d:

1-5-6a

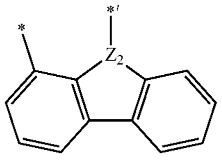

1-5-6b

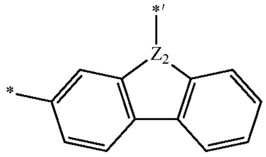

1-5-6c

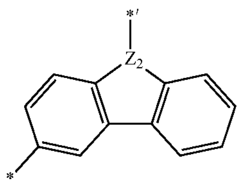

-continued 1-5-6d

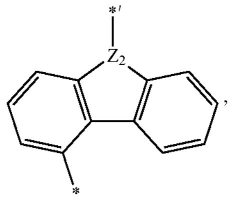

wherein, in Formulae 1-5-6a to 1-5-6d, $Z_2$ may be the same as described in connection with Formula 1-5-6.

In the heterocyclic compound according to one or more embodiments, $Ar_{11}$, $Ar_{12}$, $Ar_{21}$, $Ar_{22}$, and $Ar_{23}$ may each independently be one of Formulae 1-6-1 and 1-6-2:

1-6-1

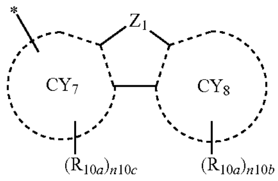

1-6-2

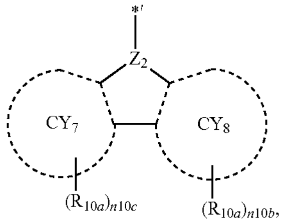

wherein, in Formulae 1-6-1 and 1-6-2, $Z_1$ may be O, S, $N(Q_5)$, $P(Q_5)$, $C(Q_5)(Q_6)$, or $Si(Q_5)(Q_6)$, $Z_2$ may be N, P, $C(Q_5)$, or $Si(Q_6)$, $CY_7$ and $CY_8$ may each independently be a $C_3$-$C_{30}$ carbocyclic group or a $C_1$-$C_{30}$ heterocyclic group, n10b may be an integer from 0 to 6, n10c may be an integer from 0 to 5,

* and *' each indicate a binding site to a neighboring atom, and $Q_5$ and $Q_6$ may respectively be the same as described in connection with $Q_1$ and $Q_2$.

In the heterocyclic compound according to one or more embodiments, a portion represented by

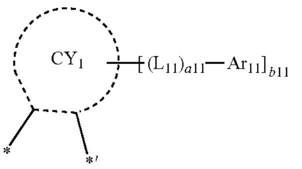

in Formula 1 may be a group represented by one of Formulae 1-1-1 to 1-1-4:

1-1-1

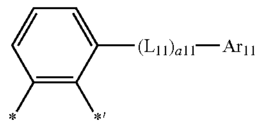

1-1-2

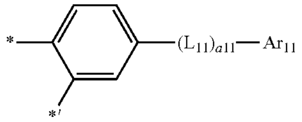

1-1-3

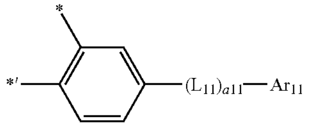

1-1-4

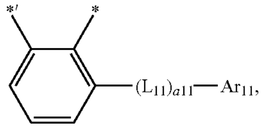

wherein, in Formulae 1-1-1 to 1-1-4, $L_{11}$, a11, and $Ar_{11}$ may respectively be the same as described in connection with Formula 1, and

* and *' each indicate a binding site to a neighboring atom.

In the heterocyclic compound according to one or more embodiments, a portion represented by

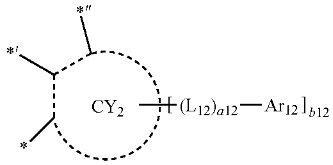

in Formula 1 may be a group represented by one of Formulae 1-1-5 to 1-1-7:

1-1-5

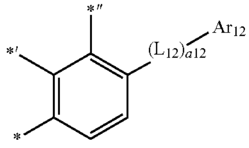

1-1-6

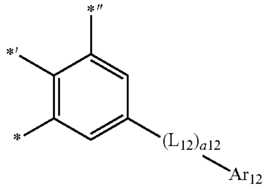

-continued 1-1-7

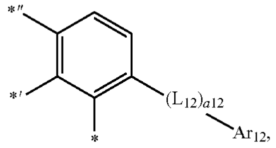

wherein, in Formulae 1-1-5 to 1-1-7, $L_{12}$, $Ar_{12}$, and a12 are respectively the same as defined in connection with Formula 1, and

*, *', and *" each indicate a binding site to a neighboring atom.

In the heterocyclic compound according to one or more embodiments, a portion represented by

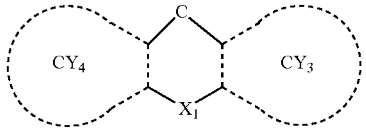

in Formula 1 may be a group represented by one of Formulae 1-2-1 to 1-2-16:

1-2-1

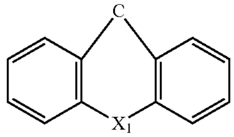

1-2-2

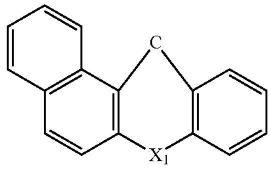

1-2-3

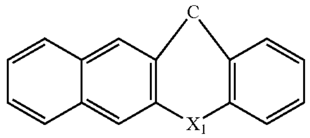

1-2-4

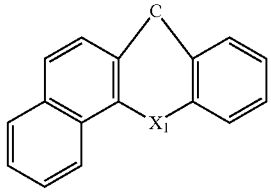

1-2-5

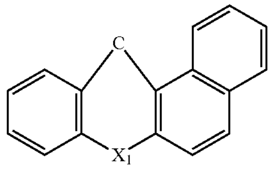

-continued 1-2-6

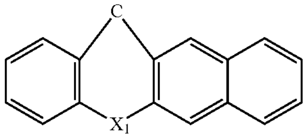

1-2-7

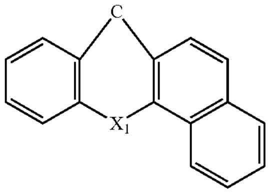

1-2-8

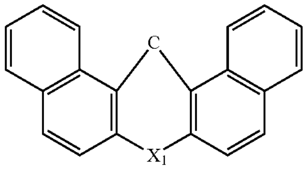

1-2-9

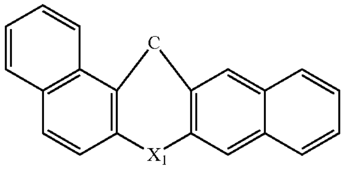

1-2-10

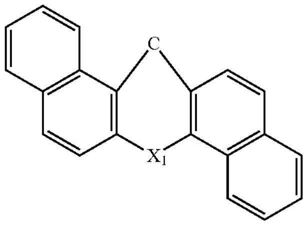

1-2-11

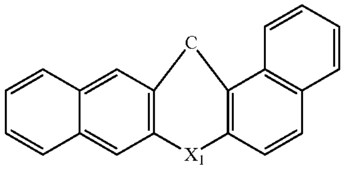

1-2-12

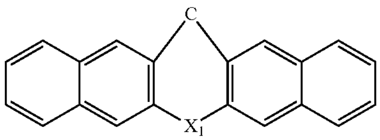

1-2-13

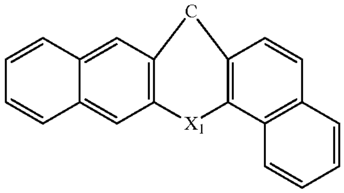

-continued 1-2-14

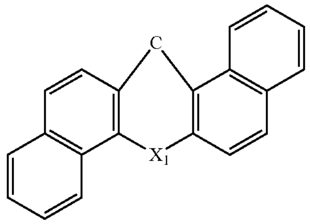

1-2-15

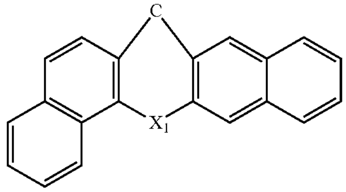

1-2-16

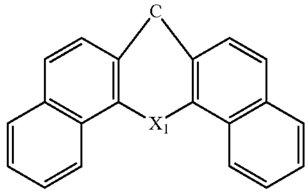

, wherein, in Formulae 1-2-1 to 1-2-16, $X_1$ is as defined in connection with Formula 1.

In the heterocyclic compound according to one or more embodiments, the $C_3$-$C_{30}$ carbocyclic group may be a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, an indenoanthracene group, an adamantanyl group, a norbornanyl group, or a norbornenyl group, and the $C_1$-$C_{30}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group.

In the heterocyclic compound according to one or more embodiments, the compound represented by Formula 1 may be one of Compounds 1 to 101:

1

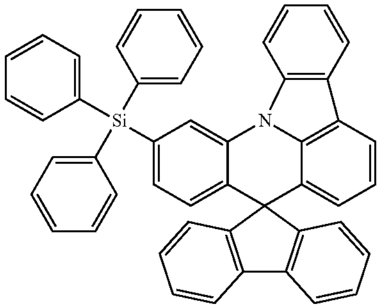

2

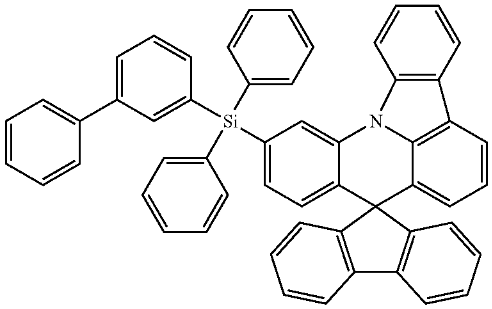

3

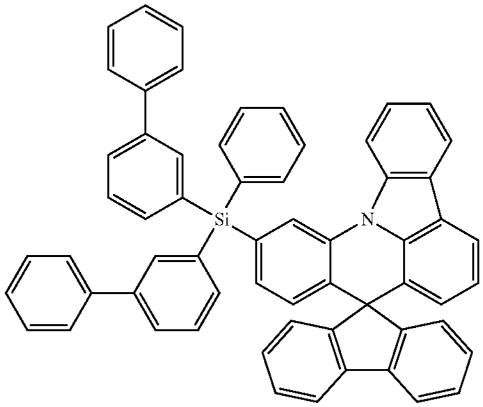

-continued

4

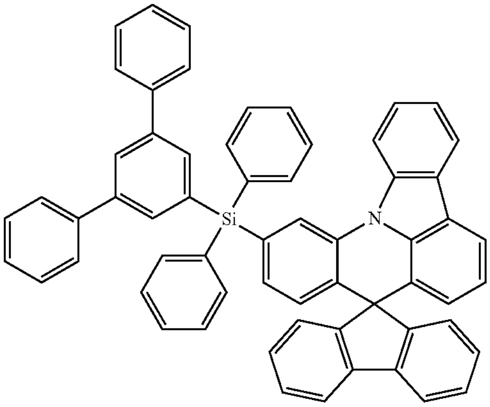

5

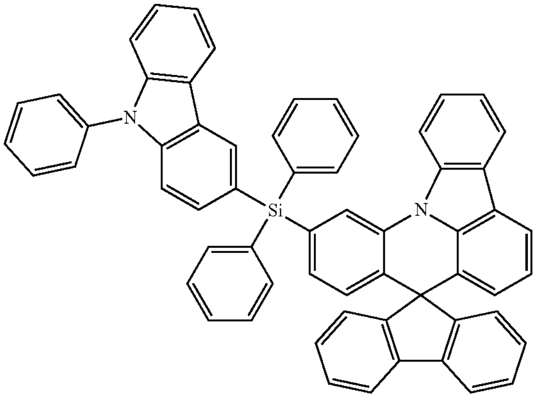

6

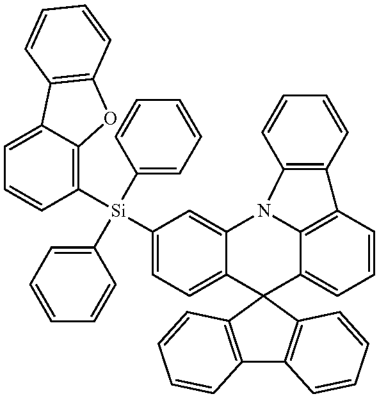

7

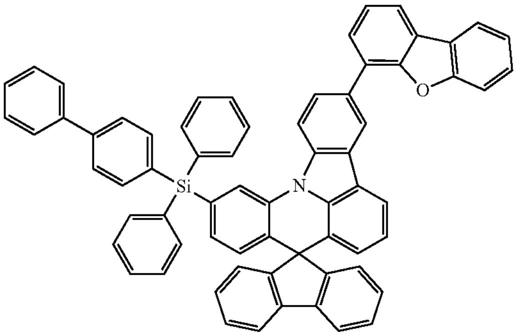

-continued
8
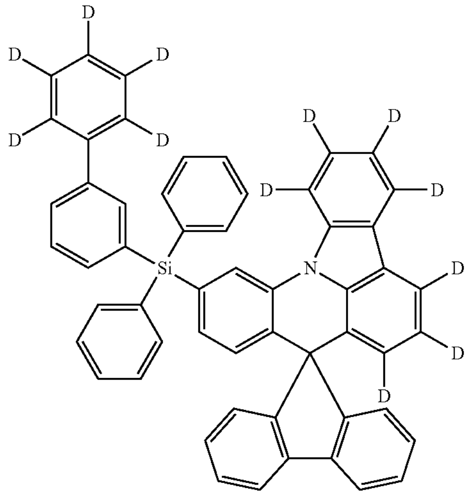
9
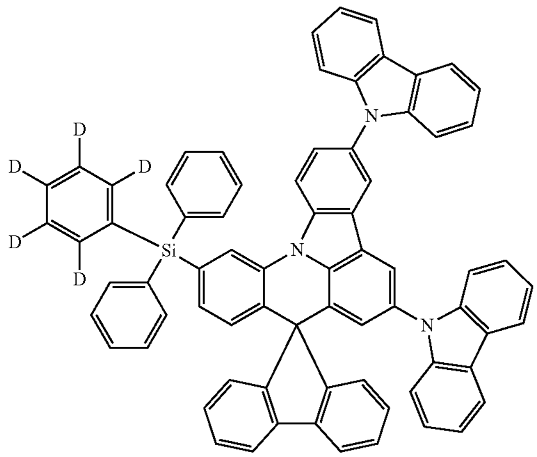
10
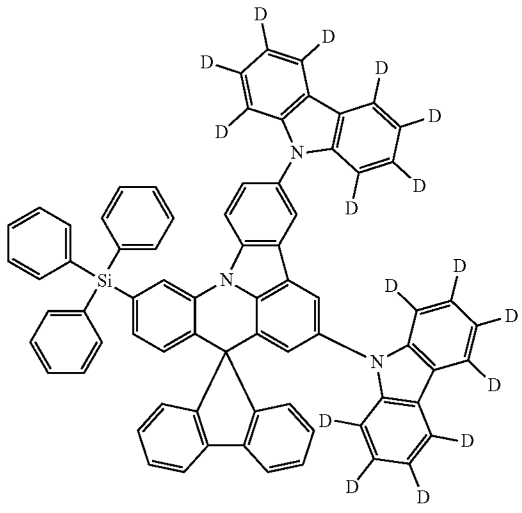
-continued
11
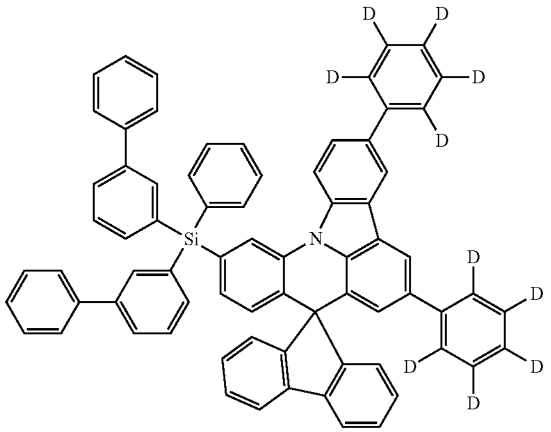
12
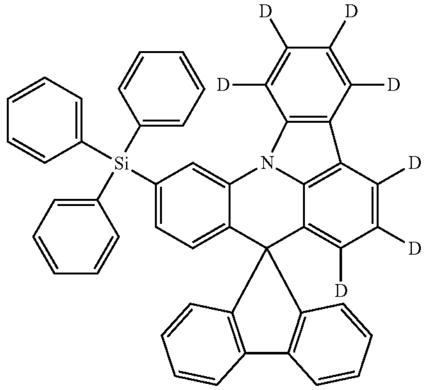
13
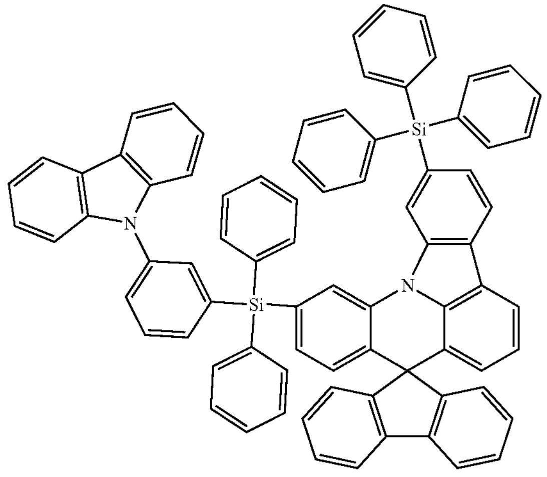

-continued
14
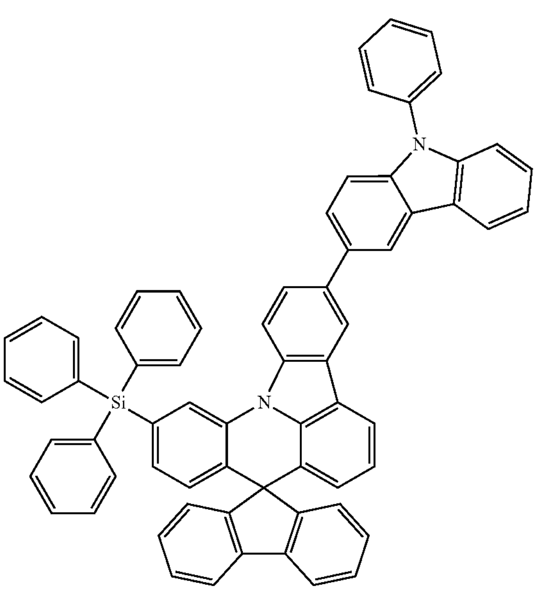
15
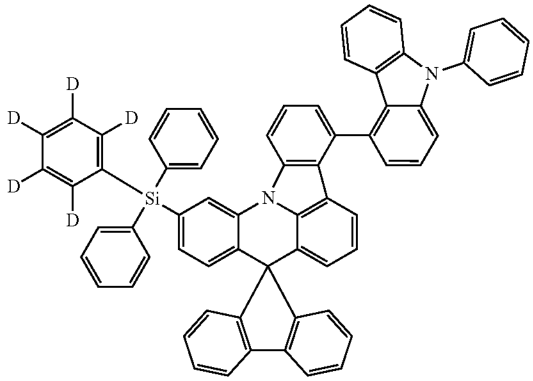
16
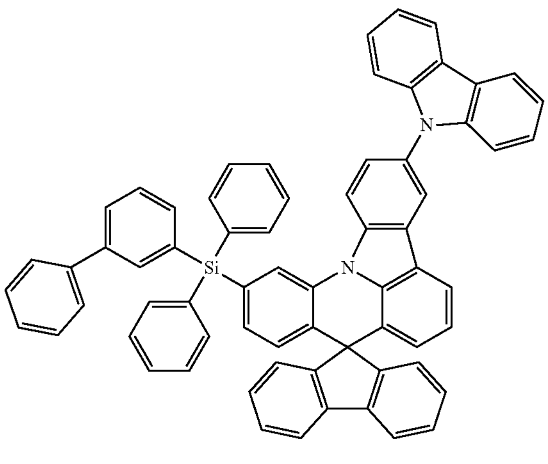
-continued
17
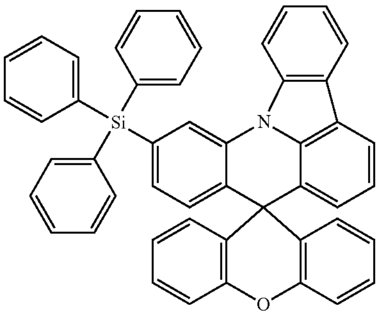
18
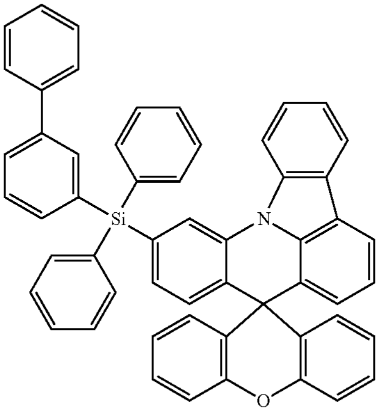
19
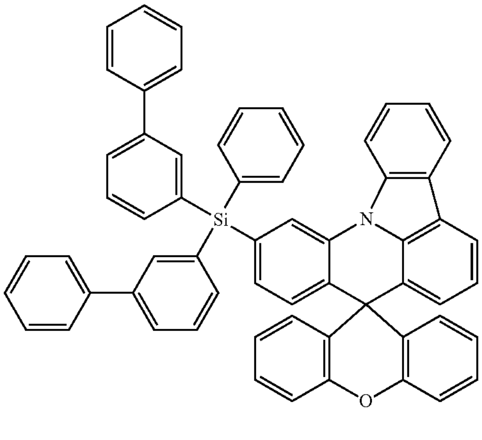
20
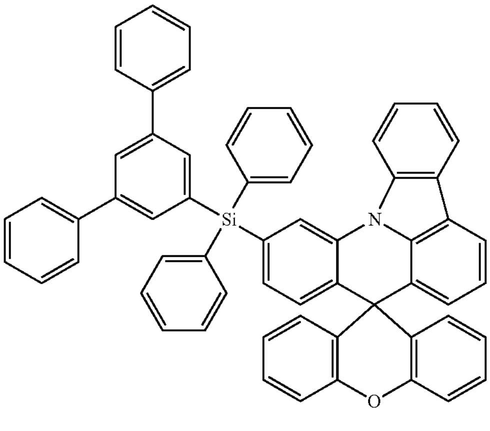

-continued
21
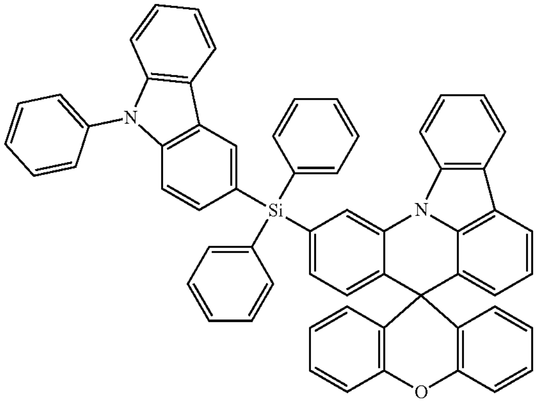
22
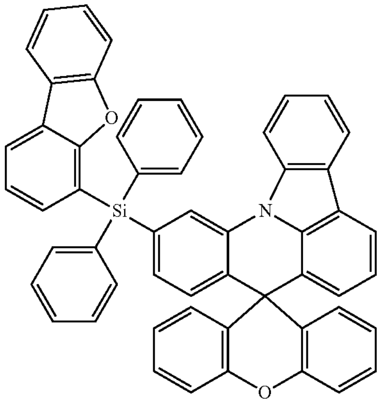
23
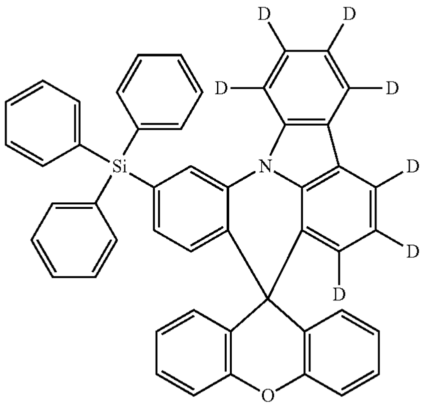
-continued
24
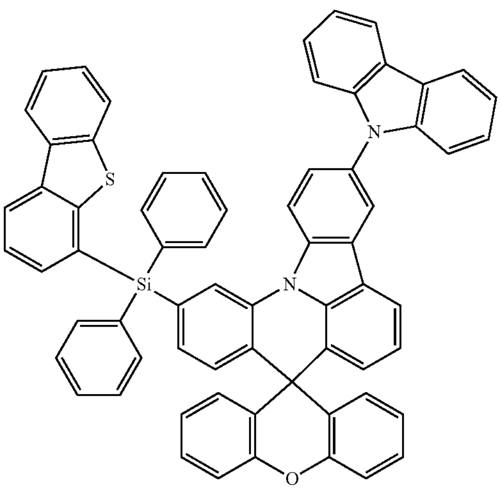
25
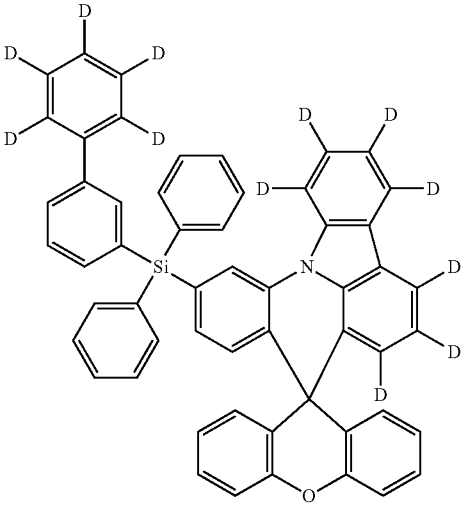
26
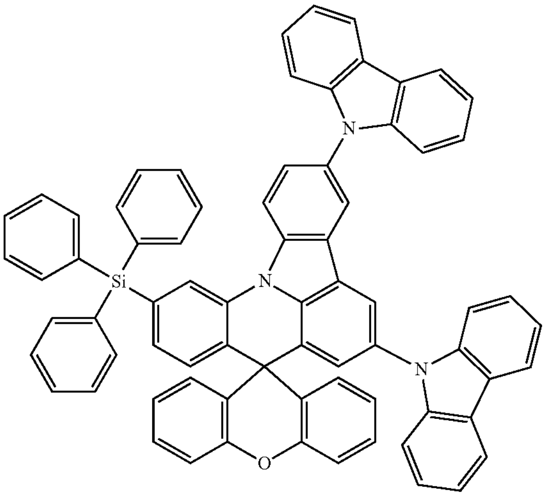

-continued
27
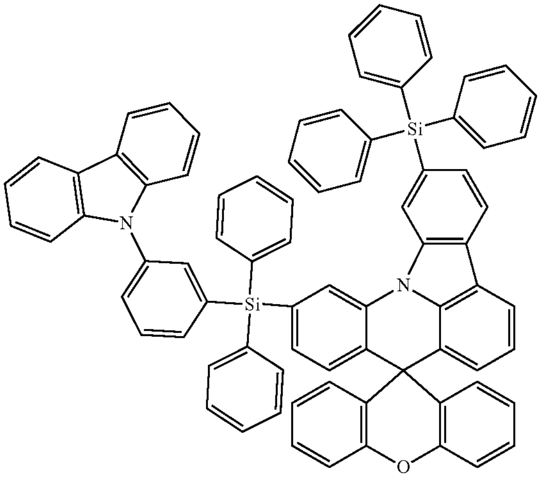
28
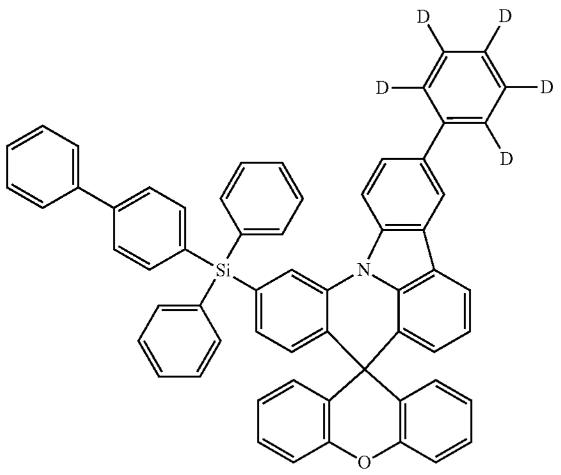
29
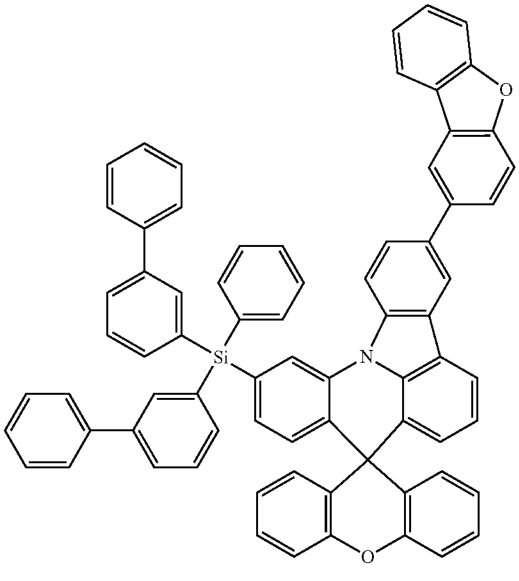
-continued
30
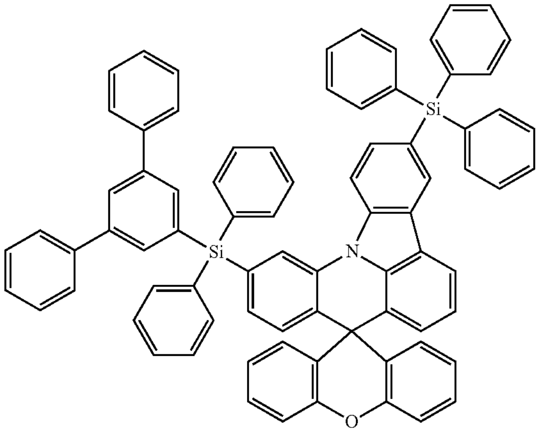
31
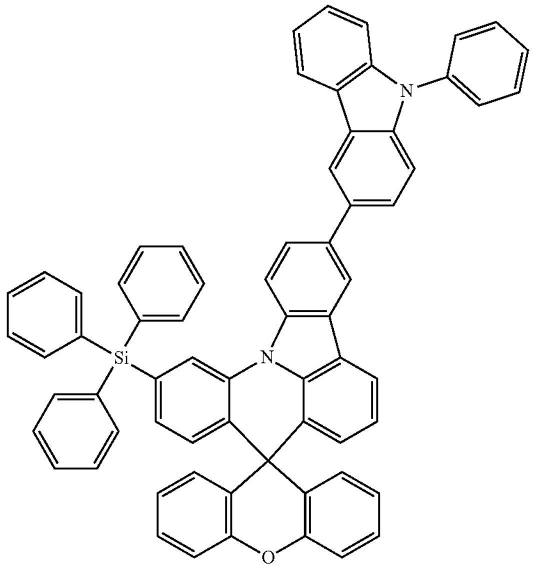
32
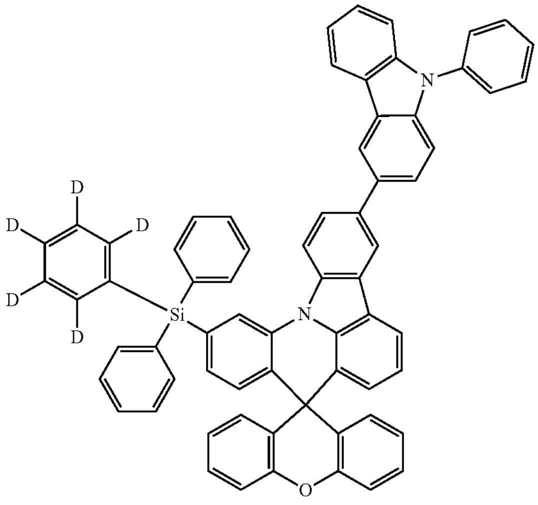

33
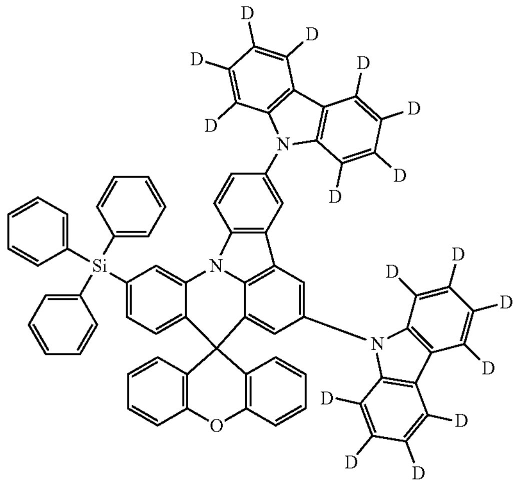
34
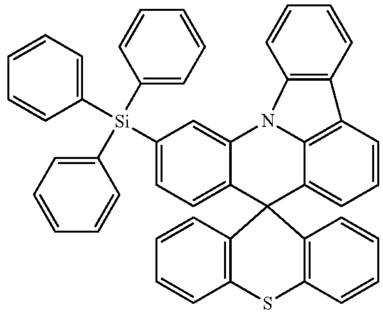
35
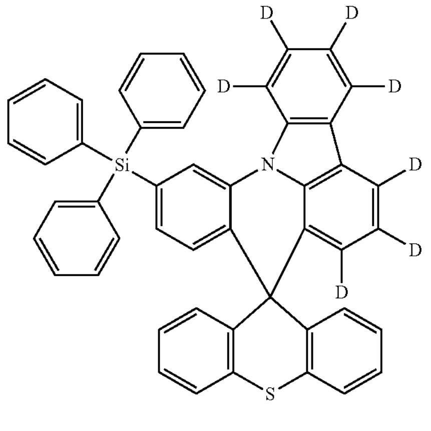
36
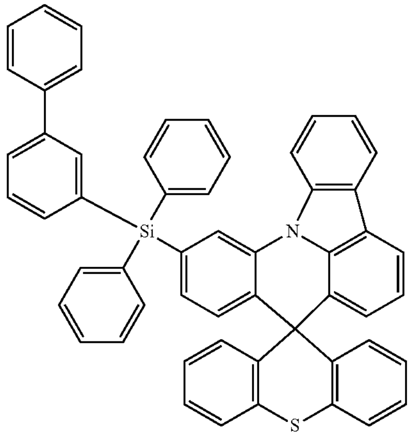
37
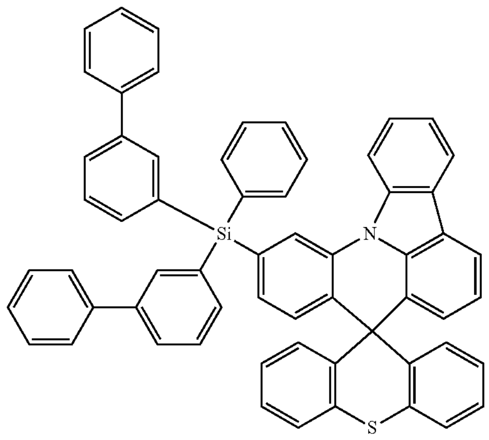
38
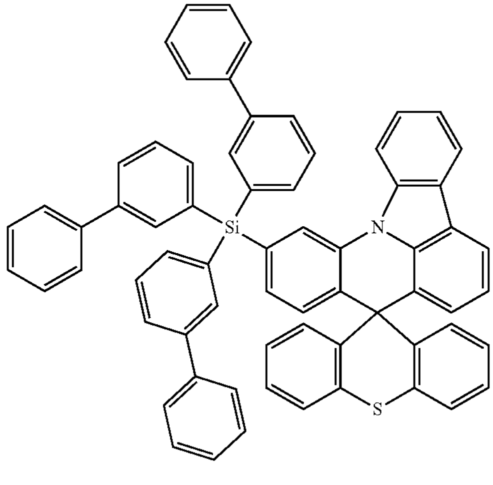

-continued
39
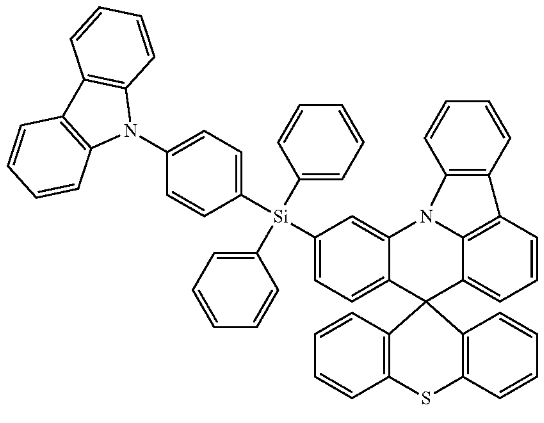
40
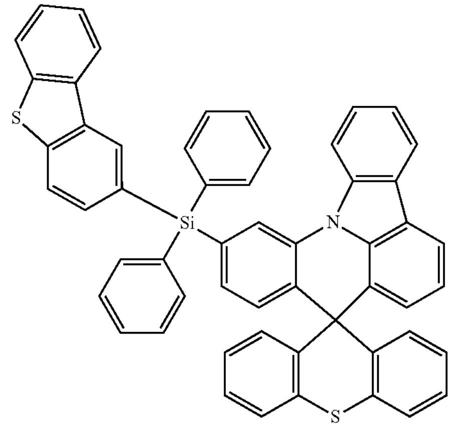
41
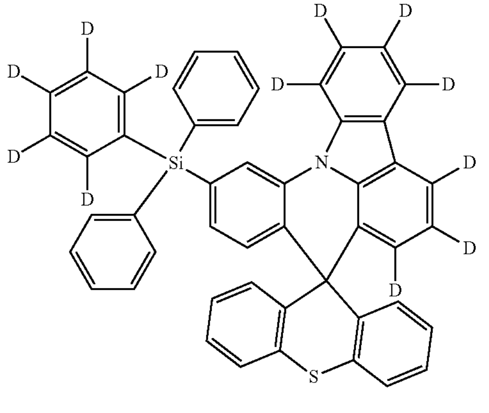
-continued
42
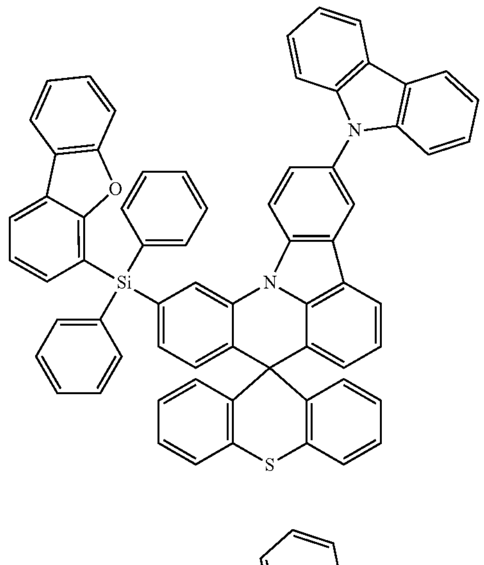
43
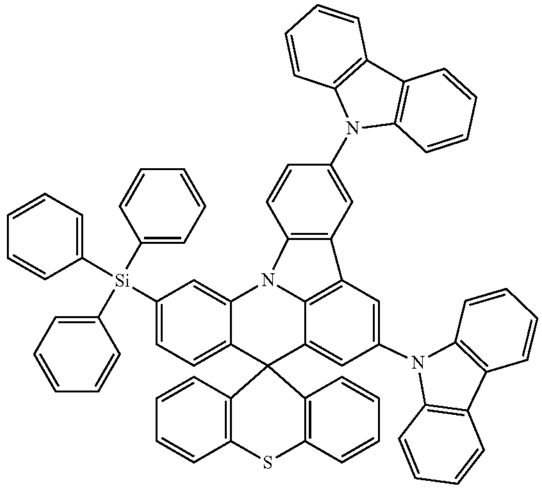
44
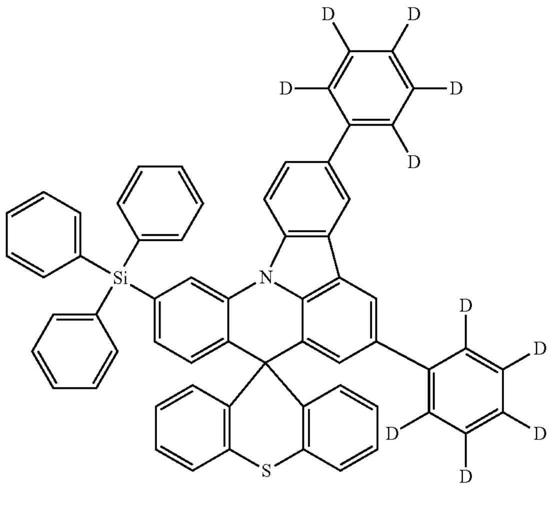

-continued
45
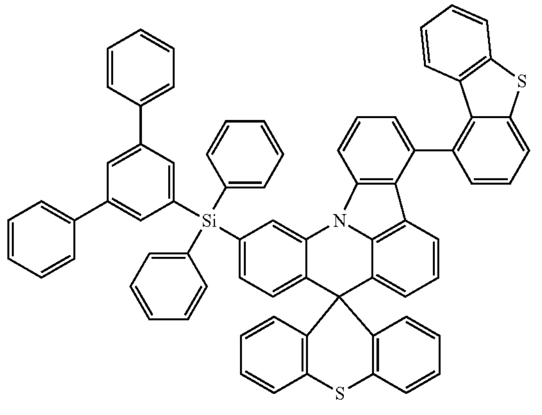
46
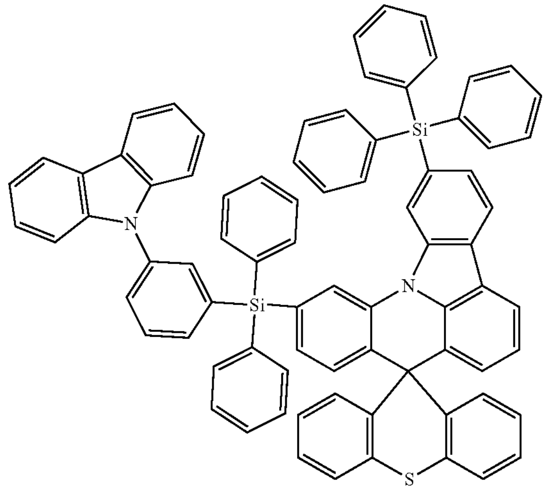
47
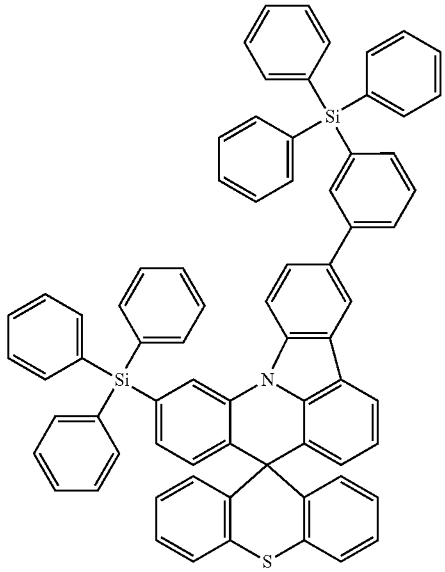
-continued
48
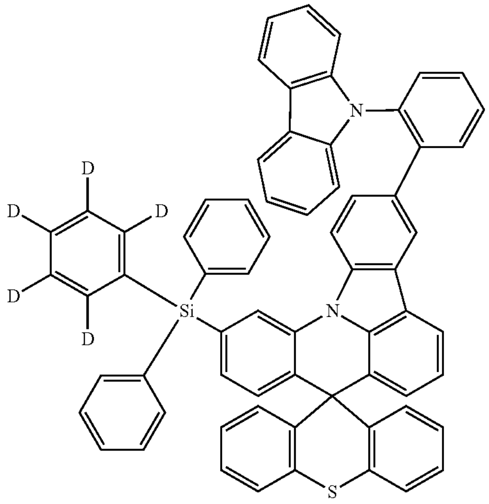
49
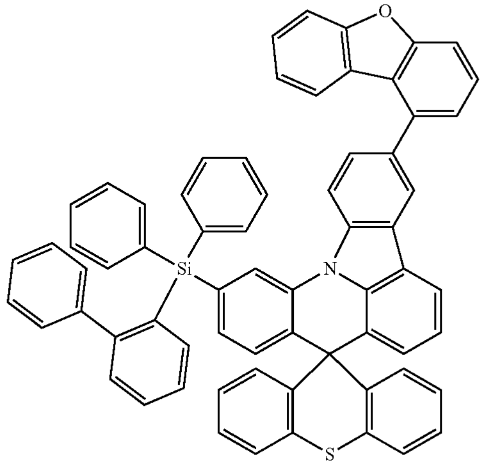
50
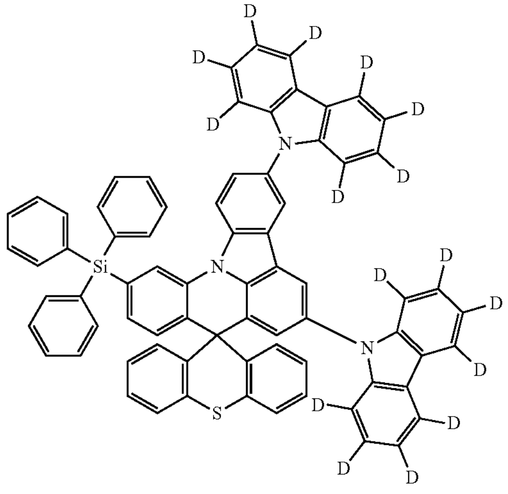

-continued
51
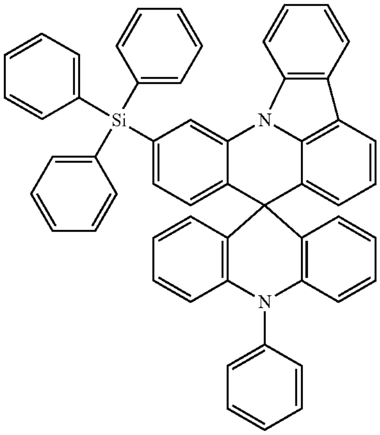
52
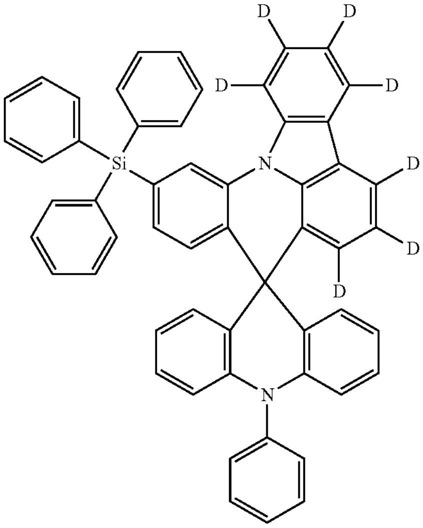
53
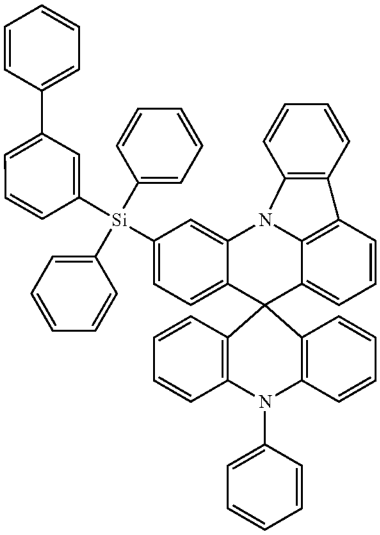
-continued
54
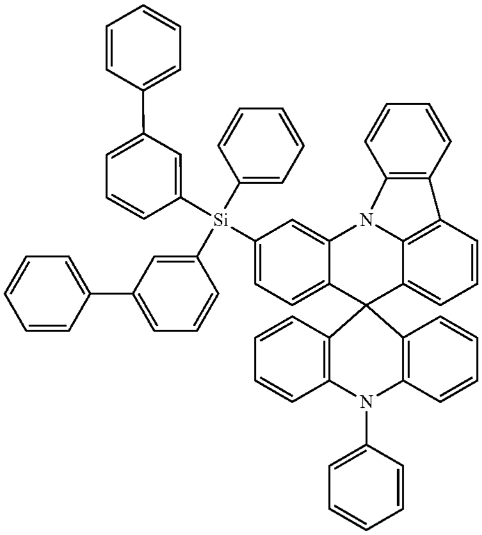
55
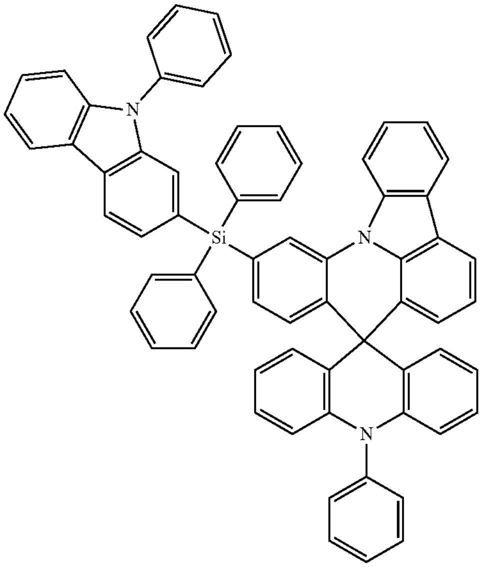
56
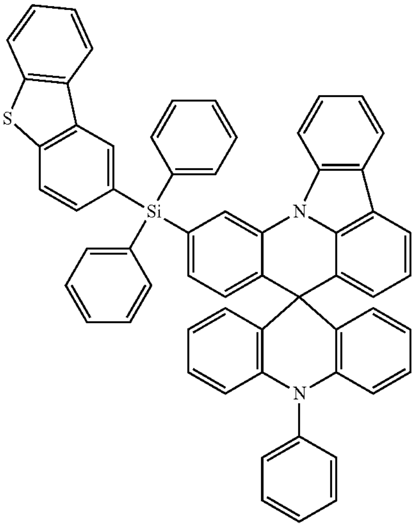

-continued
57
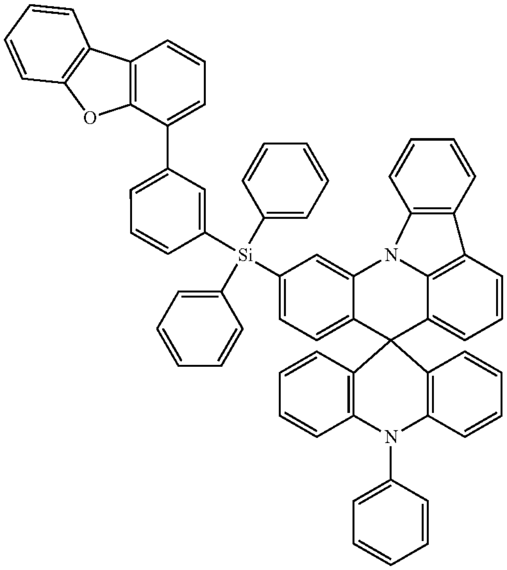
58
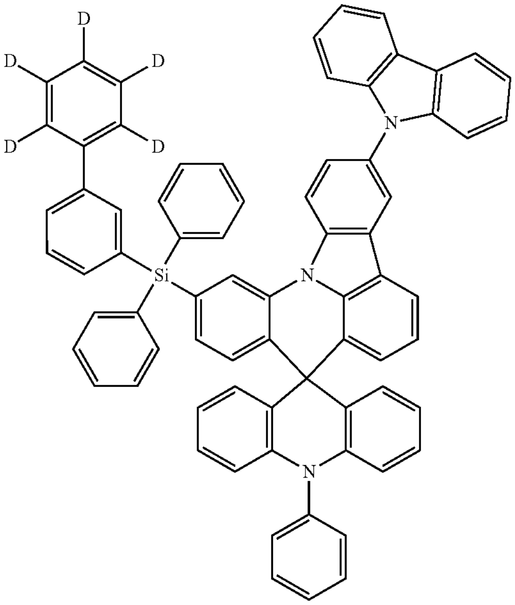
-continued
59
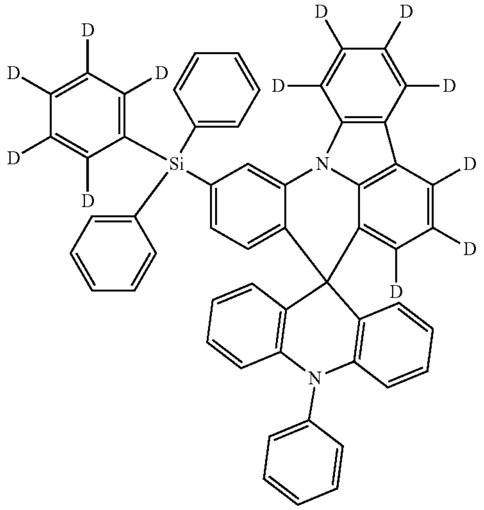
60
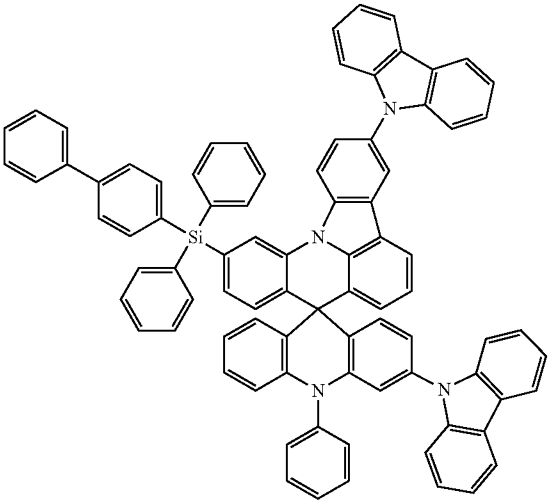
61
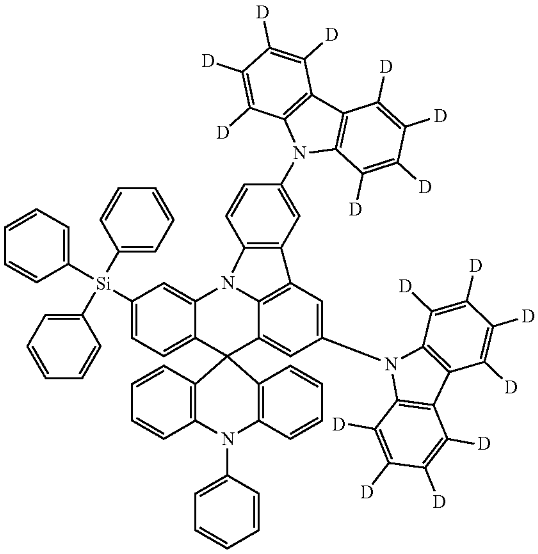

-continued
62
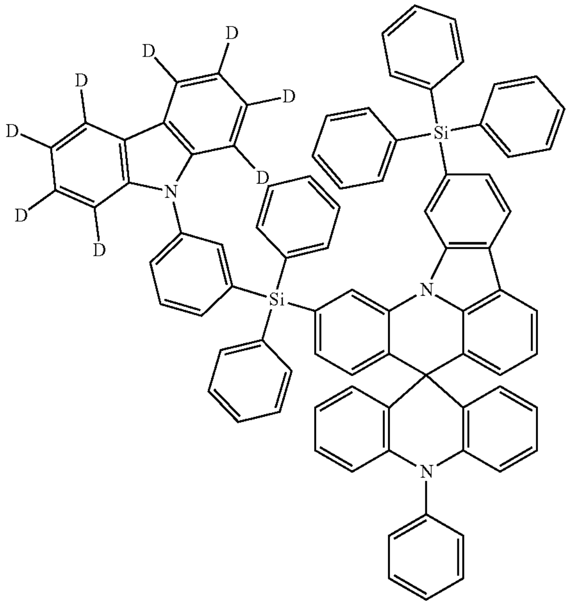
63
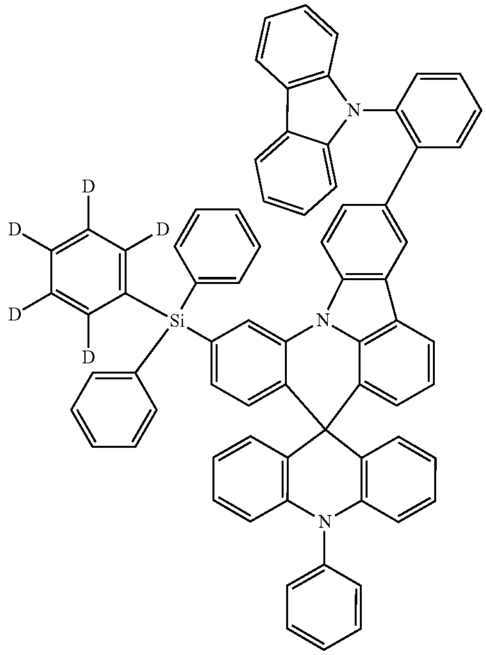
-continued
64
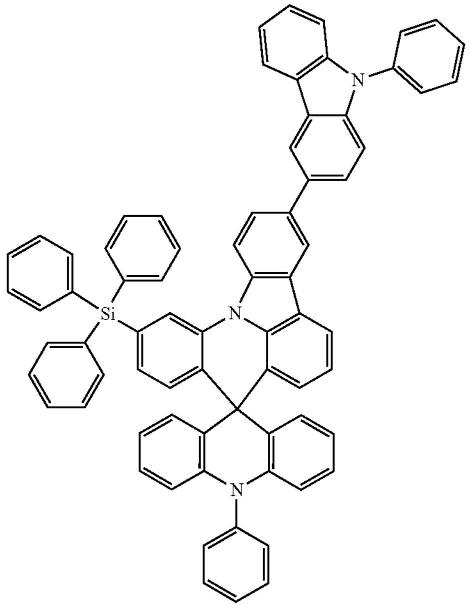
65
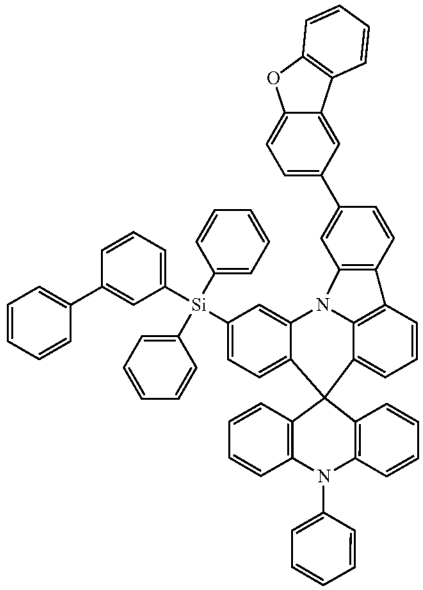
66
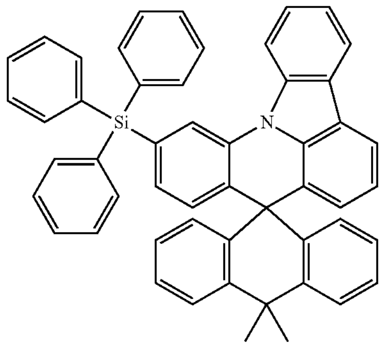

-continued
67
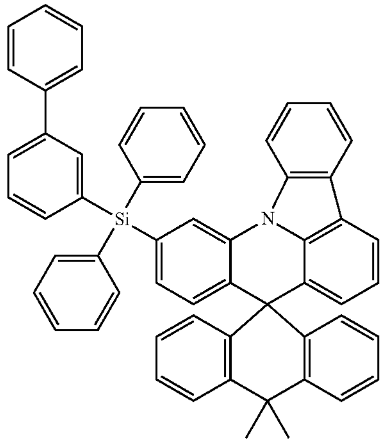
68
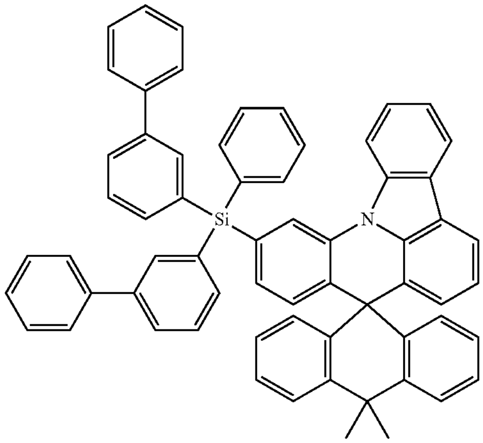
69
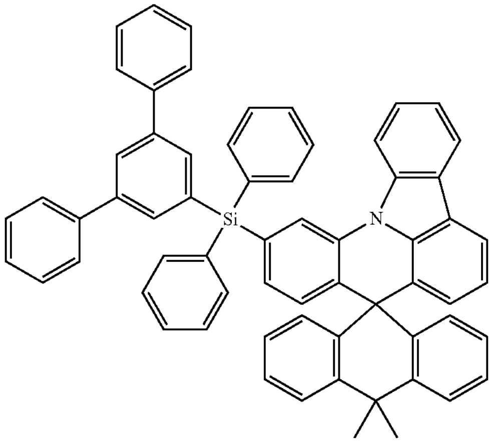
-continued
70
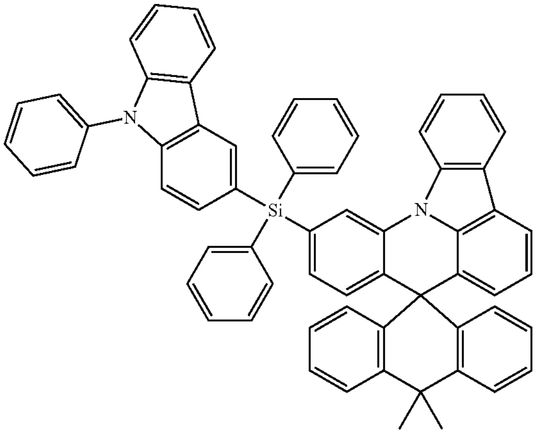
71
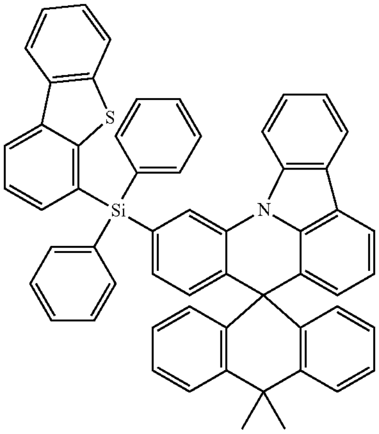
72
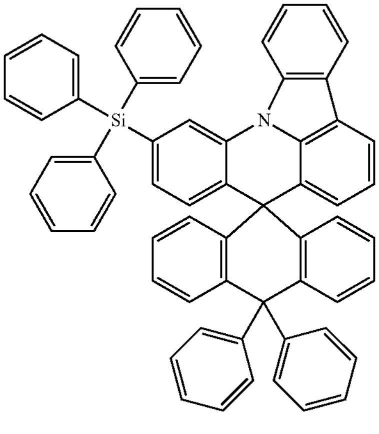

-continued
73
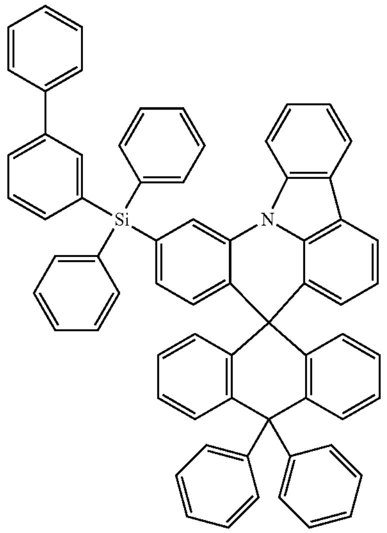
74
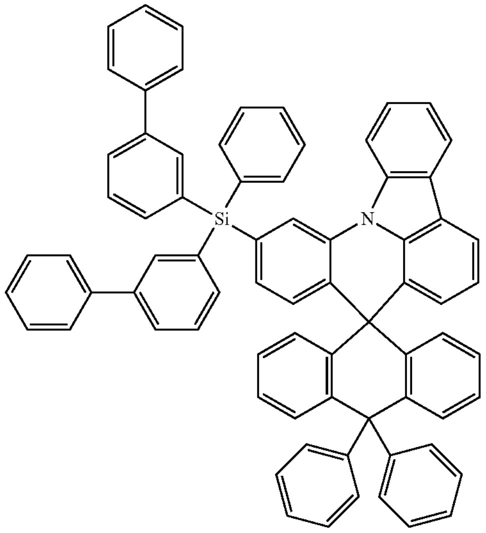
75
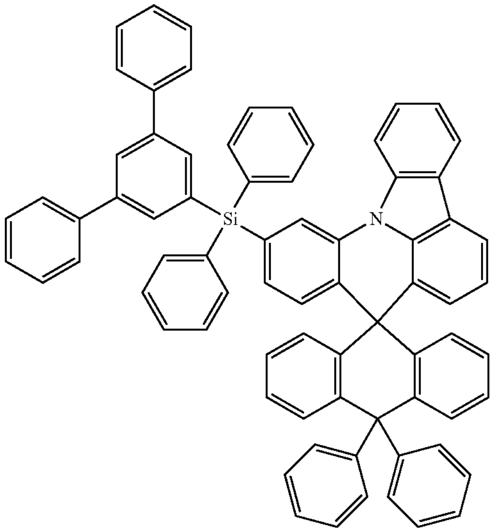
-continued
76
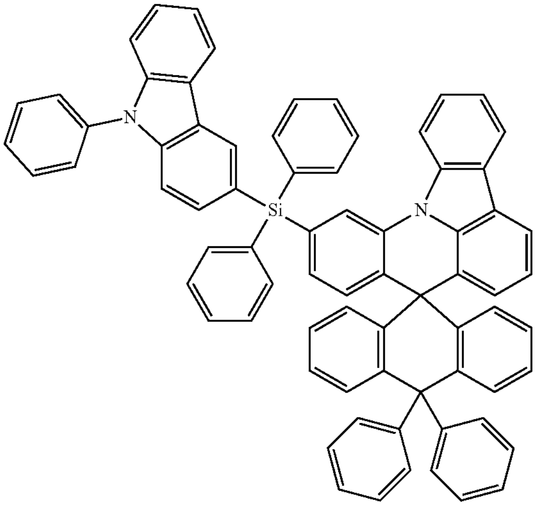
77
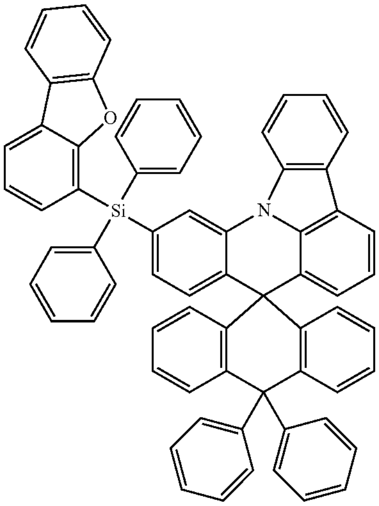
78
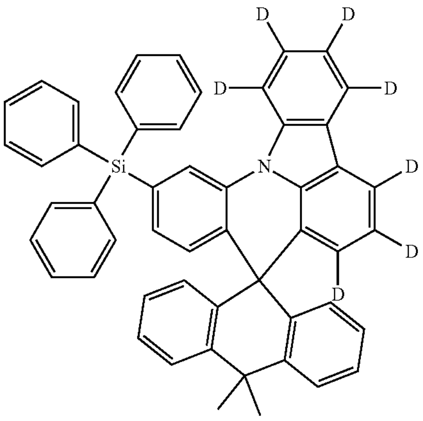

-continued
79
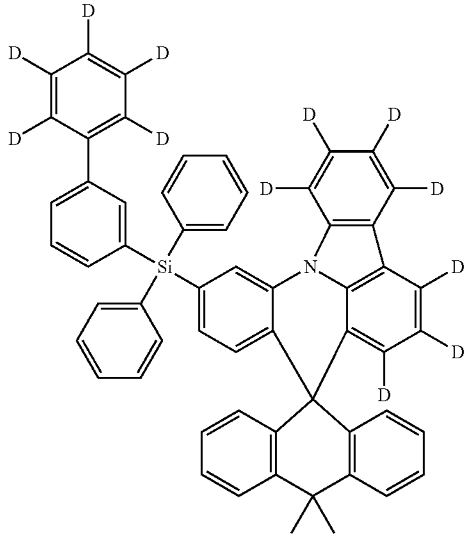
80
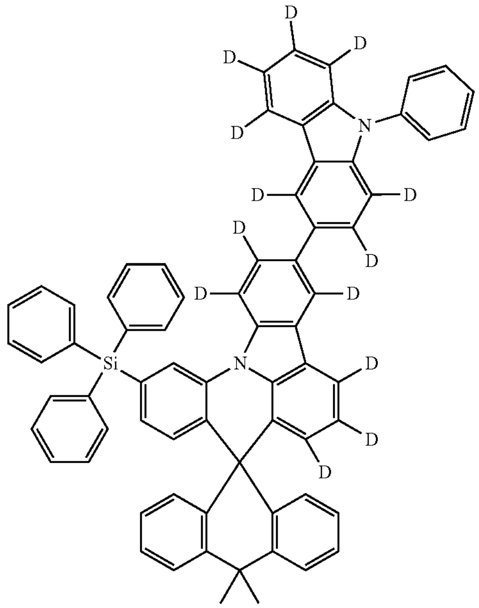
81
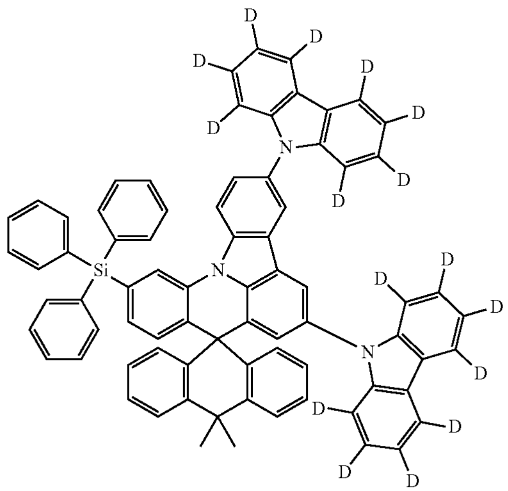
-continued
82
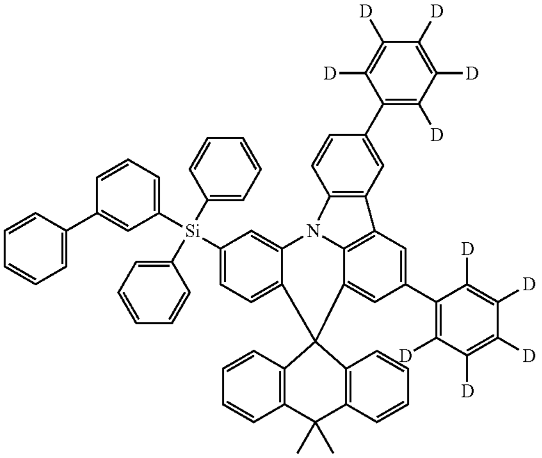
83
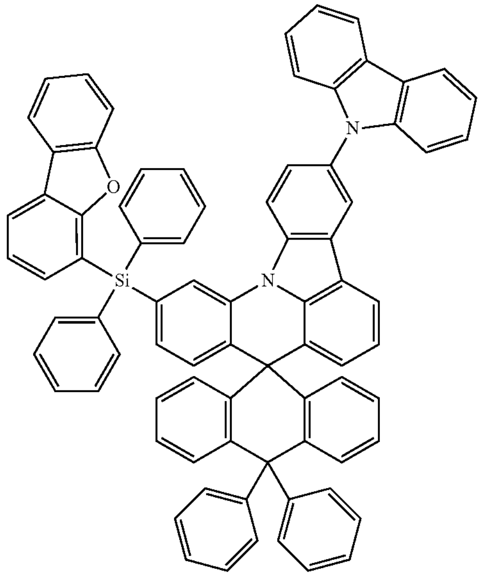
84
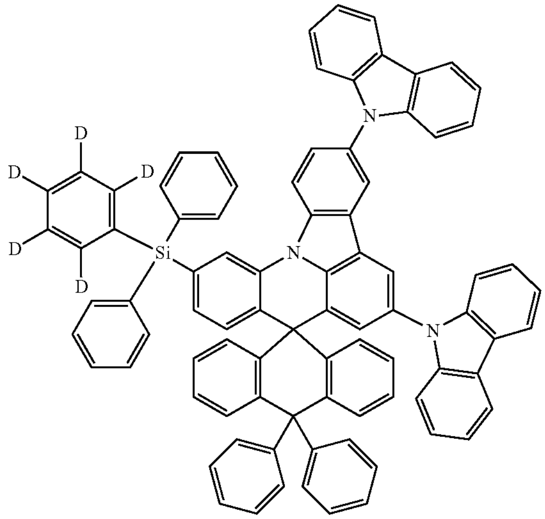

-continued
85
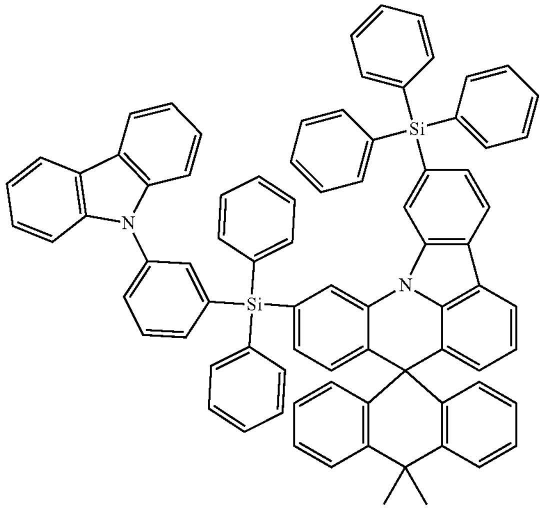
86
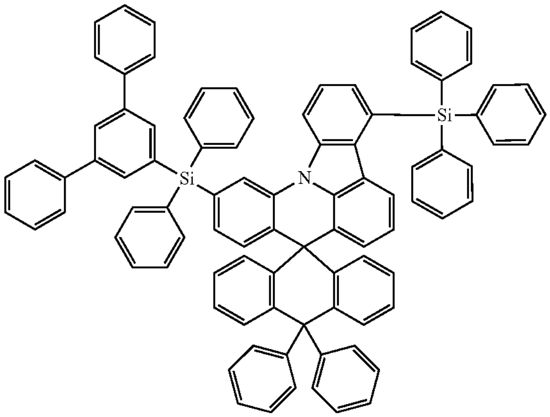
87
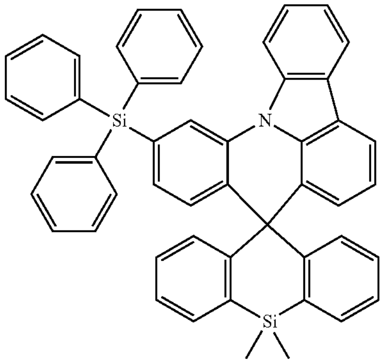
-continued
88
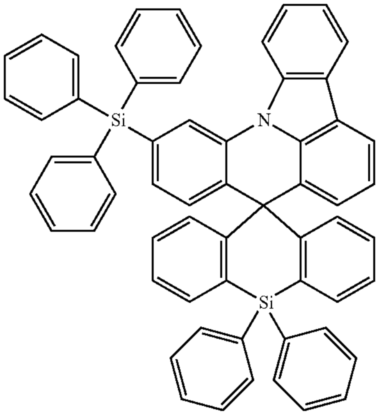
89
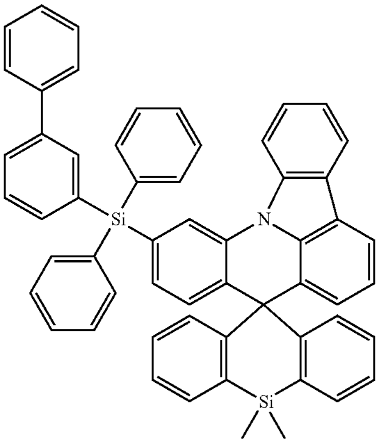
90
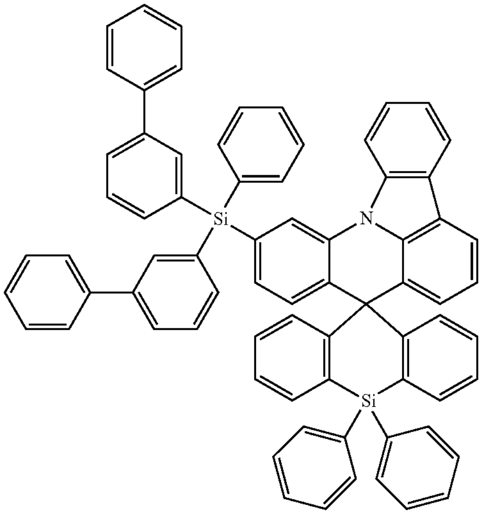

-continued
91
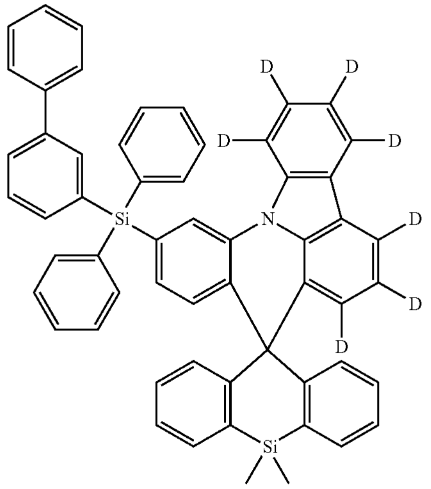
92
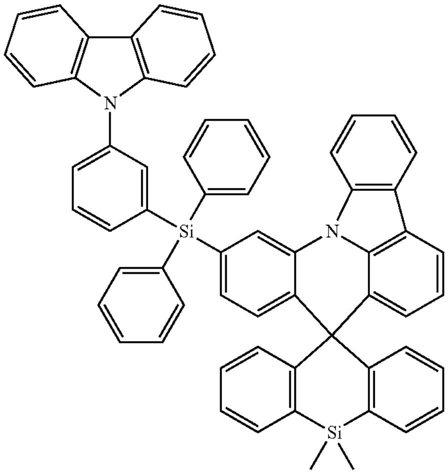
93
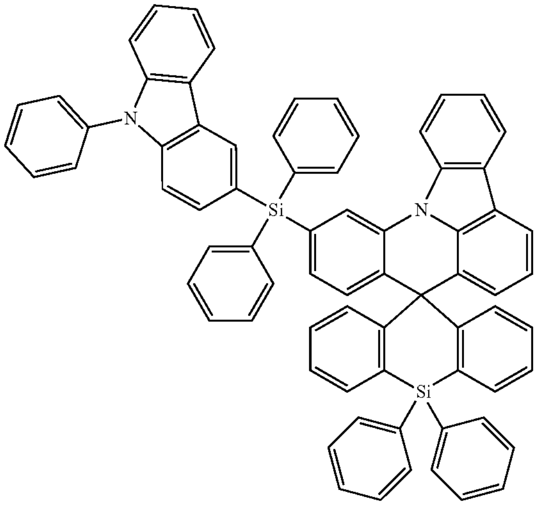
-continued
94
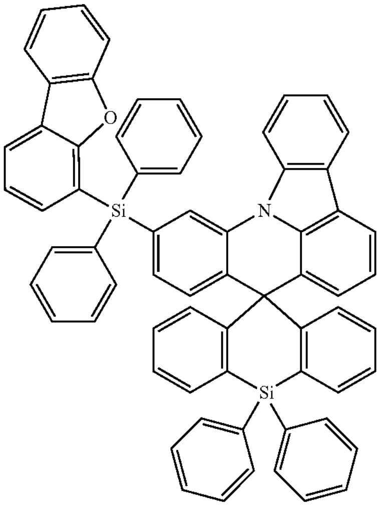
95
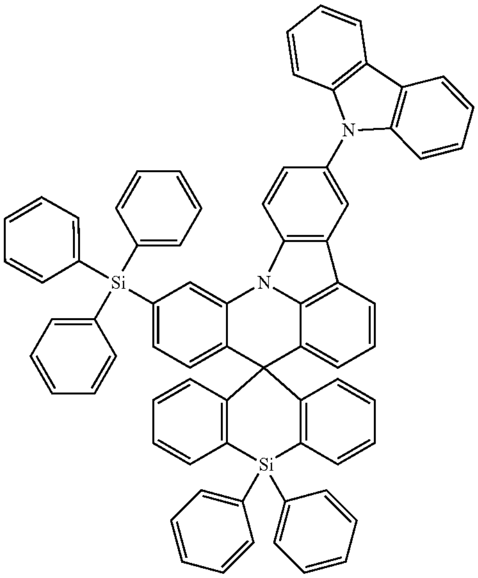
96
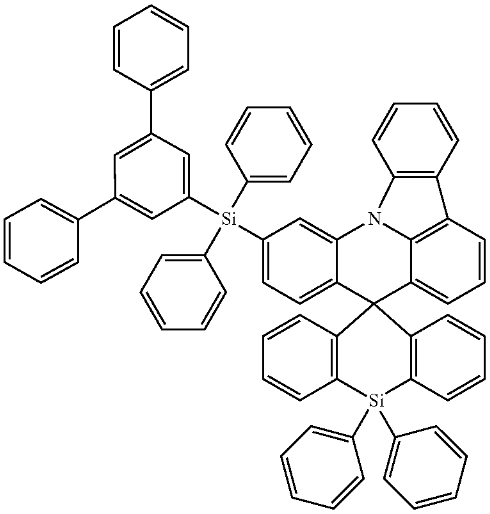

-continued
97
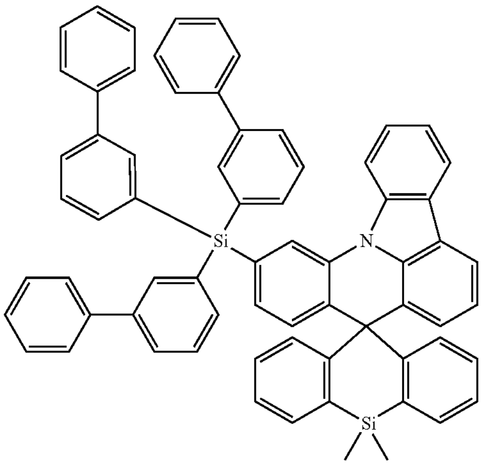
98
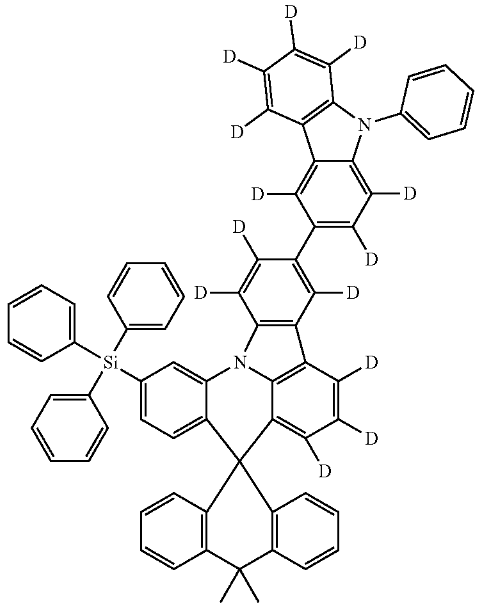
99
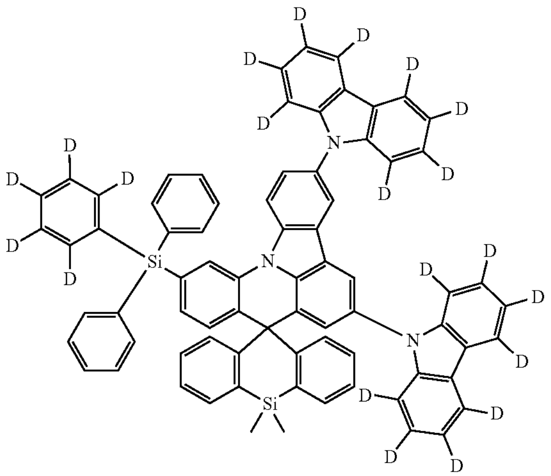
-continued
100
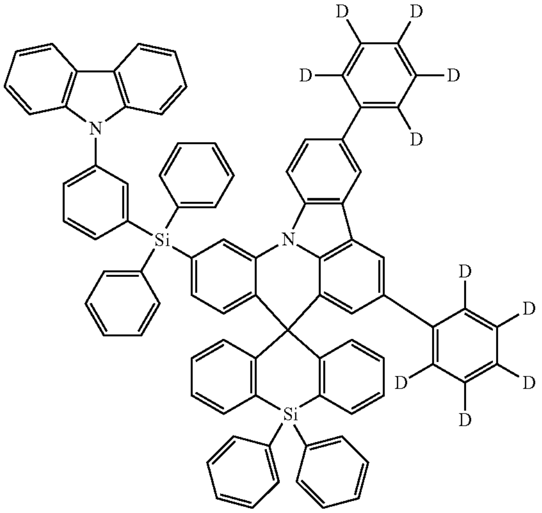
101
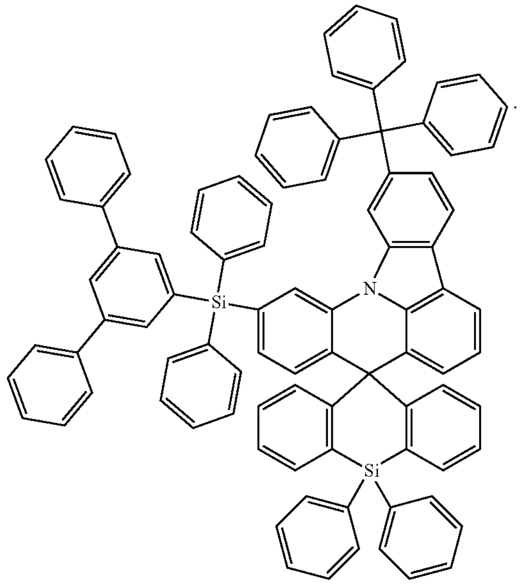
.

In one or more embodiments, the heterocyclic compound may satisfy both Conditions v) and vi):

v) a core represented by Formula 1-1 is included:

Formula 1-1

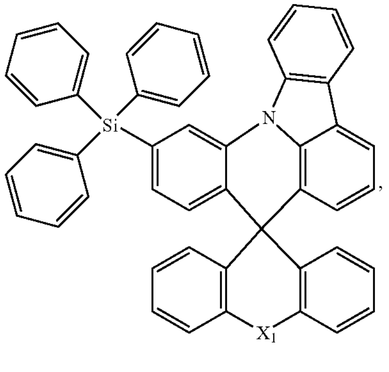

wherein, in Formula 1-1, $X_1$ may be a single bond, O, S, $N(Q_1)$, $P(Q_1)$, $C(Q_1)(Q_2)$, or $Si(Q_1)(Q_2)$, $Q_1$ and $Q_2$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$; and vi) a $T_1$ energy level (e.g., of the heterocyclic compound) is in a range of about 2.95 eV to about 3.05 eV, or a HOMO energy level (e.g., of the heterocyclic compound) is in a range of about −5.60 eV to about −5.35 eV, or a LUMO energy level (e.g., of the heterocyclic compound) is in a range of about −2.30 eV to about −1.75 eV.

In one or more embodiments, the heterocyclic compound may further satisfy Condition vii):

vii) a π electron-rich $C_3$-$C_{60}$ cyclic group chemically bonded to the core represented by Formula 1-1 is further included, wherein the π electron-rich $C_3$-$C_{60}$ cyclic group is unsubstituted or substituted with at least one $R_{10a}$, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, $Q_1$, $Q_2$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In one or more embodiments, the heterocyclic compound may further satisfy at least one of Conditions viii) to ix) (i.e., satisfy Condition(s) viii and/or ix):

viii) the core represented by Formula 1-1 is chemically bonded to three or more deuterium atoms; and xi) the heterocyclic compound is chemically bonded to three or more deuterium atoms.

The heterocyclic compound represented by Formula 1 may include an intermolecular silicon bridge to reduce the intramolecular conjugation length. In addition, due to introduction of trisubstituted substituent (for example, a triarylsilyl group), the intramolecular steric effect may be increased, thereby increasing a dihedral angle between atoms:

Core A

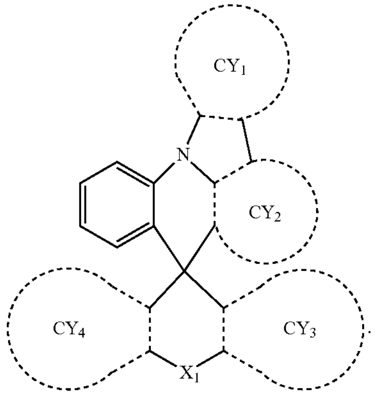

As a result, the heterocyclic compound represented by Formula 1 may have a relatively high triplet energy level, and may be utilized in combination with a blue phosphorescence emitter or a blue delayed fluorescence emitter as a host of blue phosphorescence or blue delayed fluorescence.

By having a large molecular structure, the formation of an exciplex between the heterocyclic compound represented by Formula 1 and the emitter may be restricted, and a high glass transition temperature and thermal stability may be secured.

Furthermore, the substituents bonded to rings $CY_1$ to $CY_4$ in Formula 1 may be identical to or different from each other, and thus, the HOMO energy level, the LUMO energy level, the molecular polarity control, and/or the like of the heterocyclic compound represented by Formula 1 may be relatively easy to control.

As a result, the hole mobility and electron mobility may be improved evenly or suitably, and the energy transfer efficiency with respect to the emitter may be improved. Accordingly, an electronic device, for example, an organic light-emitting device, including the heterocyclic compound, may have good or suitable color coordinates, low driving voltage, high efficiency and a long lifespan.

Synthesis methods of the heterocyclic compound represented by Formula 1 may be recognizable by one of ordinary skill in the art by referring to Synthesis Examples and/or Examples provided below.

At least one heterocyclic compound represented by Formula 1 may be utilized in a light-emitting device (for example, an organic light-emitting device). Accordingly, provided is a light-emitting device including: a first electrode; a second electrode facing the first electrode; an interlayer located between the first electrode and the second electrode and including an emission layer; and a heterocyclic compound represented by Formula 1 as described herein.

In one or more embodiments, the first electrode of the light-emitting device may be an anode, the second electrode of the light-emitting device may be a cathode, and the interlayer may further include a hole transport region arranged between the first electrode and the emission layer, and an electron transport region arranged between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, the heterocyclic compound may be included between the first electrode and the second electrode of the light-emitting device. Accordingly, the heterocyclic compound may be included in the interlayer of the light-emitting device, for example, in the emission layer of the interlayer.

In one or more embodiments, the emission layer of the interlayer of the light-emitting device may include a dopant and a host, and the heterocyclic compound may be included in the host. For example, the heterocyclic compound may act as a host. The emission layer may be to emit red light, green light, blue light, and/or white light. For example, the emission layer may be to emit blue light. The blue light may have, for example, a maximum emission wavelength in a range of about 400 nm to about 490 nm.

In one or more embodiments, the emission layer of the interlayer of the light-emitting device may include a dopant and a host, and the heterocyclic compound may be included in the host, and the dopant may be to emit blue light. For example, the dopant may include a transition metal and ligand(s) in the number of m, wherein m may be an integer from 1 to 6. The ligand(s) in the number of m may be identical to or different from each other, at least one of the ligand(s) in the number of m may be linked to the transition metal via a carbon-transition metal bond, and the carbon-transition metal bond may be a coordinate bond. For example, at least one of the ligand(s) in the number of m may be a carbene ligand (for example, $Ir(pmp)_3$ and/or the like). The transition metal may be, for example, iridium, platinum, osmium, palladium, rhodium, gold, and/or the like. The emission layer and the dopant may be the same as described in the present specification:

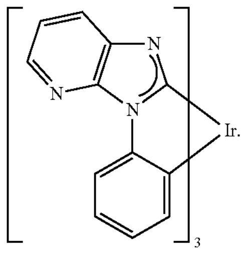

$Ir(pmp)_3$

In one or more embodiments, the light-emitting device may include a capping layer located outside the first electrode or outside the second electrode.

In one or more embodiments, the light-emitting device may further include at least one of a first capping layer located outside the first electrode and/or a second capping layer located outside the second electrode, and at least one of the first capping layer and/or the second capping layer may include the heterocyclic compound represented by Formula 1. The first capping layer and/or the second capping layer may each be the same as described herein.

In one or more embodiments, the light-emitting device may further include:

a first capping layer located outside the first electrode and including the heterocyclic compound represented by Formula 1;

a second capping layer located outside the second electrode and including the heterocyclic compound represented by Formula 1; or the first capping layer and the second capping layer.

The expression "(an interlayer and/or a capping layer) includes at least one heterocyclic compound" as utilized herein may include a case in which "(an interlayer and/or a capping layer) includes one or more identical heterocyclic compounds represented by Formula 1" and a case in which "(an organic layer) includes two or more different heterocyclic compounds represented by Formula 1."

For example, the interlayer and/or capping layer may include Compound 1 only as the heterocyclic compound. In this regard, Compound 1 may be present in the emission layer of the light-emitting device. In one or more embodiments, the interlayer may include, as the heterocyclic compound, Compound 1 and Compound 2. In this regard, Compound 1 and Compound 2 may be present in the same layer (for example, both (e.g., simultaneously) Compound 1 and Compound 2 may be present in the emission layer), or may be present in different layers (for example, Compound 1 may be present in the emission layer, and Compound 2 may be present in the electron transport region).

The term "interlayer" as utilized herein refers to a single layer and/or all of a plurality of layers between the first electrode and the second electrode of the light-emitting device.

Another aspect of embodiments of the present disclosure provides an electronic apparatus including the light-emitting device. The electronic apparatus may further include a thin-film transistor. For example, the electronic apparatus may further include a thin-film transistor including a source electrode and a drain electrode, wherein the first electrode of the light-emitting device may be electrically connected to the source electrode or the drain electrode. In one or more embodiments, the electronic apparatus may further include a color filter, a color conversion layer, a touch screen layer, a polarizing layer, or any combination thereof. The electronic apparatus may be the same as described herein.

[Description of FIG. 1]

FIG. 1 is a schematic cross-sectional view of a light-emitting device 10 according to one or more embodiments. The light-emitting device 10 includes a first electrode 110, an interlayer 130, and a second electrode 150.

Hereinafter, the structure of the light-emitting device 10 according to one or more embodiments and a method of manufacturing the light-emitting device 10 will be described with reference to FIG. 1.

[First Electrode 110]

In FIG. 1, a substrate may be additionally arranged under the first electrode 110 or on the second electrode 150. In one or more embodiments, as the substrate, a glass substrate and/or a plastic substrate may be utilized. In one or more embodiments, the substrate may be a flexible substrate, and for example, may include plastics with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In one or more embodiments, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. For example, the first electrode 110 may have a three-layered structure of ITO/Ag/ITO.

[Interlayer 130]

The interlayer 130 is arranged on the first electrode 110. The interlayer 130 may include an emission layer.

The interlayer 130 may further include a hole transport region arranged between the first electrode 110 and the emission layer, and an electron transport region arranged between the emission layer and the second electrode 150.

In one or more embodiments, the interlayer 130 may further include, in addition to one or more suitable organic materials, a metal-containing compound such as an organometallic compound, an inorganic material such as quantum dots, and/or the like.

In one or more embodiments, the interlayer 130 may include, i) two or more emitting units sequentially stacked between the first electrode 110 and the second electrode 150, and ii) a charge generation layer between the two or more emitting units. When the interlayer 130 includes the two or more emitting units and the charge generation layer, the light-emitting device 10 may be a tandem light-emitting device.

[Hole Transport Region in Interlayer 130]

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituent layers of each structure are stacked sequentially from the first electrode 110.

The hole transport region may include a compound represented by Formula 201, a compound represented by Formula 202, or any combination thereof:

Formula 201

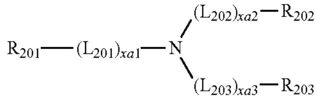

Formula 202

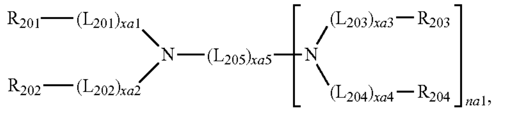

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

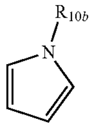

CY202

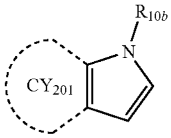

CY203

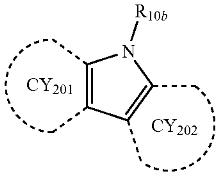

CY204

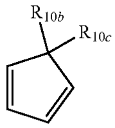

CY205

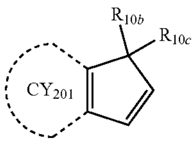

-continued

CY206

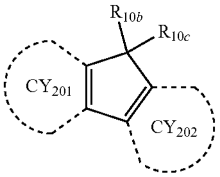

CY207

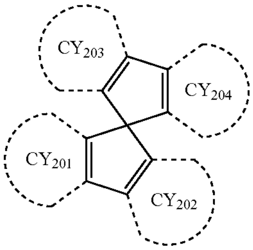

CY208

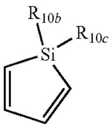

CY209

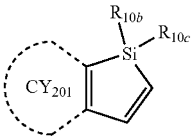

CY210

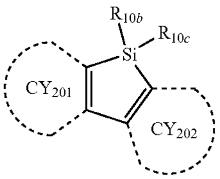

CY211

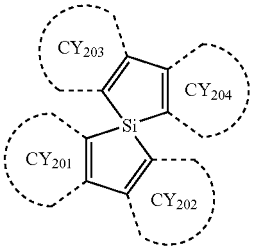

-continued

CY212

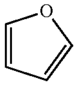

CY213

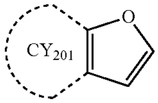

CY214

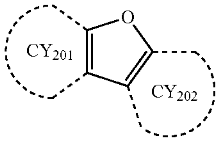

CY215

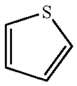

CY216

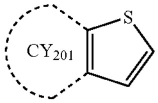

CY217

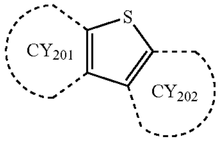

, wherein, in Formulae CY201 to CY217, $R_{10b}$ and $R_{10c}$ may each be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, in Formulae CY201 to CY217, ring $CY_{201}$ to ring $CY_{204}$ may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be one of the groups represented by Formulae CY201 to CY203, xa2 may be 0, and $R_{202}$ may be one of the groups represented by Formulae CY204 to CY207.

In one or more embodiments, each of Formulae 201 and 202 may not include (e.g., may exclude) the groups represented by Formulae CY201 to CY203.

In one or more embodiments, each of Formulae 201 and 202 may not include (e.g., may exclude) the groups represented by Formulae CY201 to CY203, and may include at least one of the groups represented by Formulae CY204 to CY217.

In one or more embodiments, each of Formulae 201 and 202 may not include (e.g., may exclude) the groups represented by Formulae CY201 to CY217.

For example, the hole transport region may include one or more of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

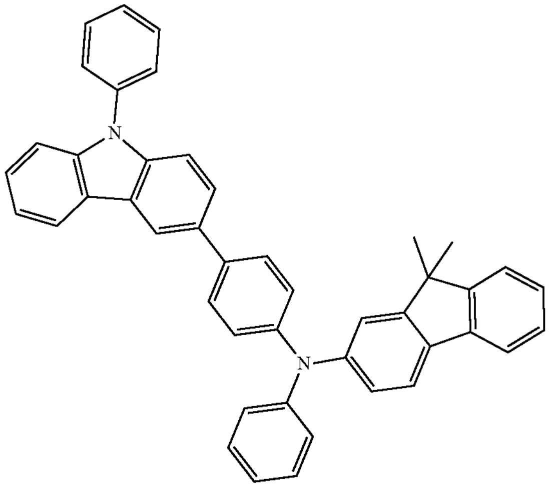

HT2

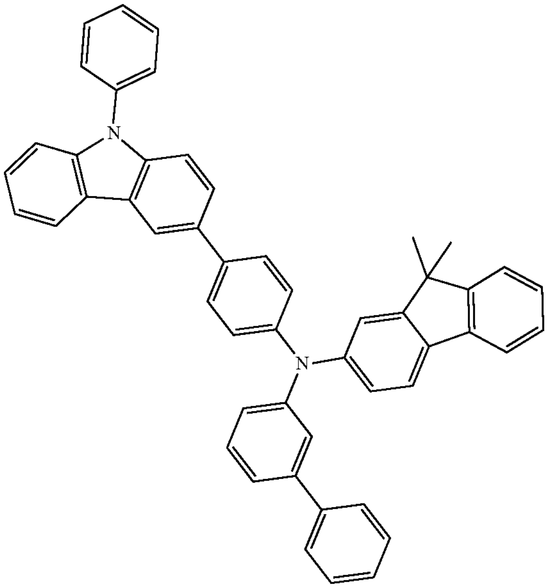

-continued
HT3
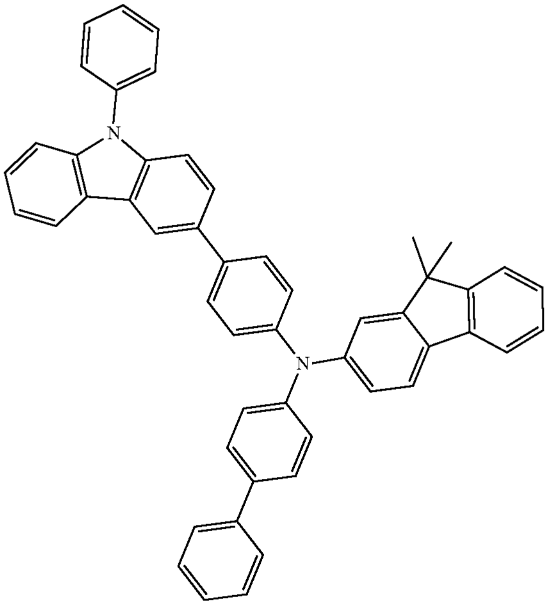
HT4
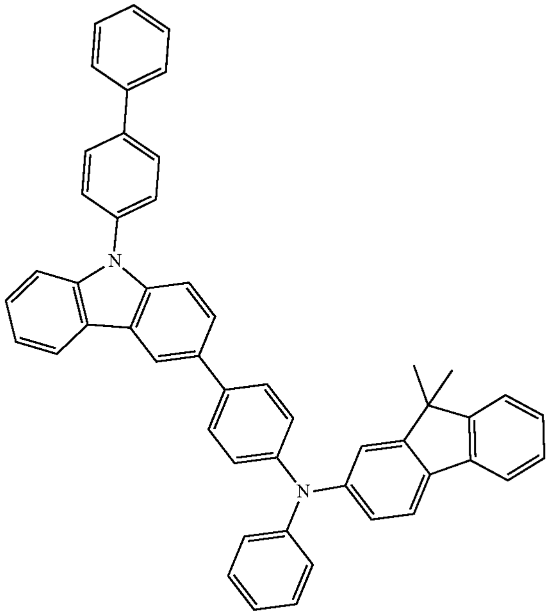
HT5
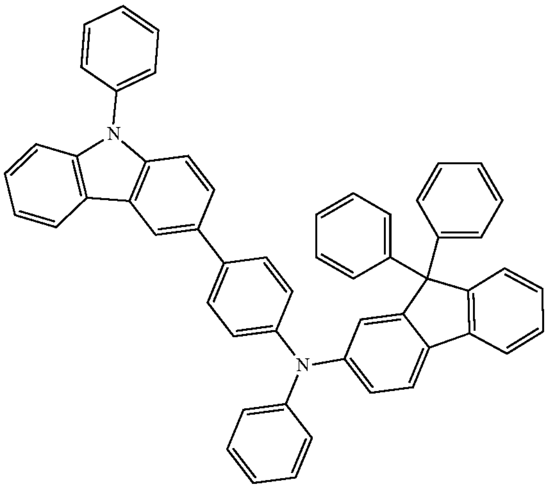
HT6
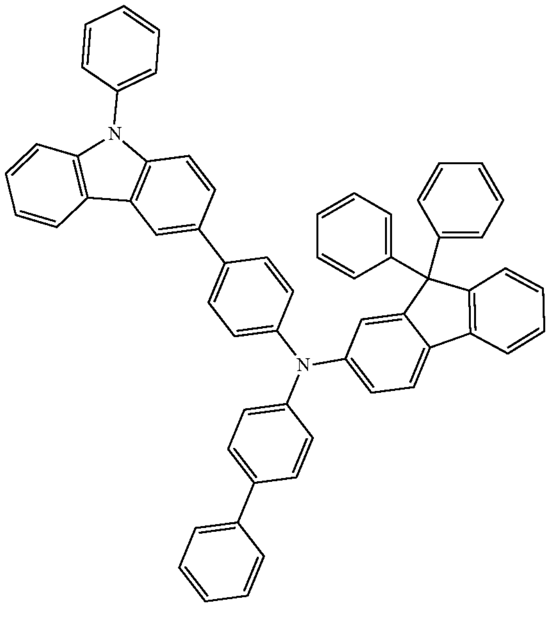

-continued
HT7
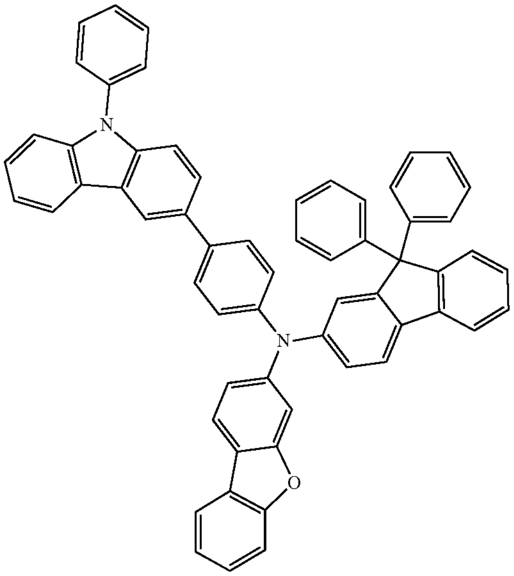
HT8
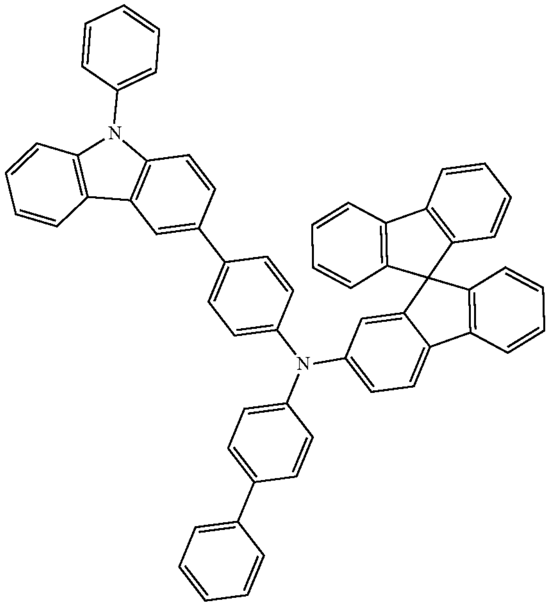
HT9
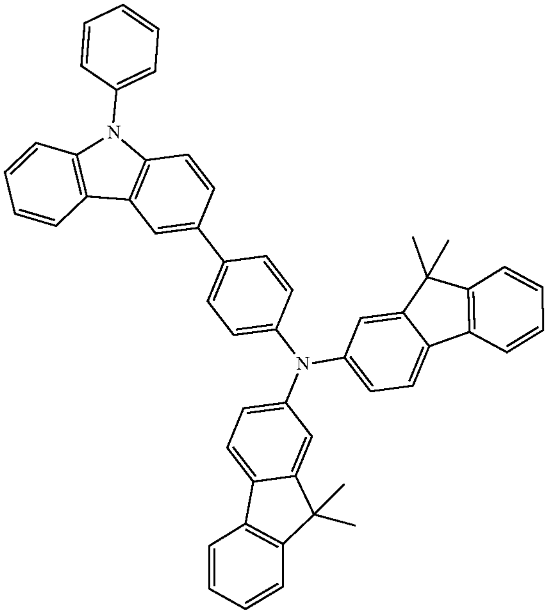
HT10
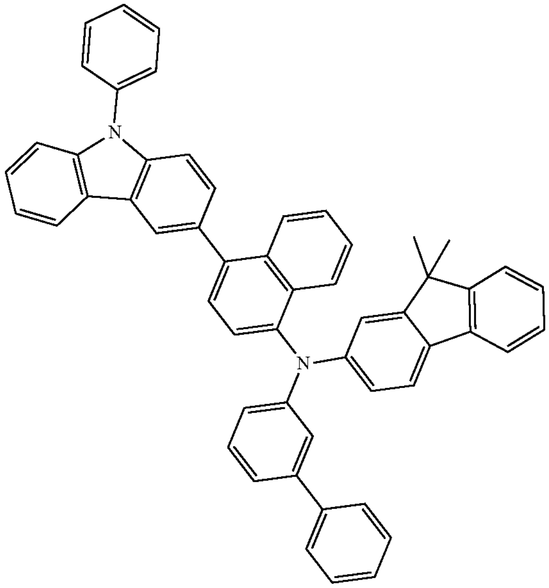

-continued
HT11
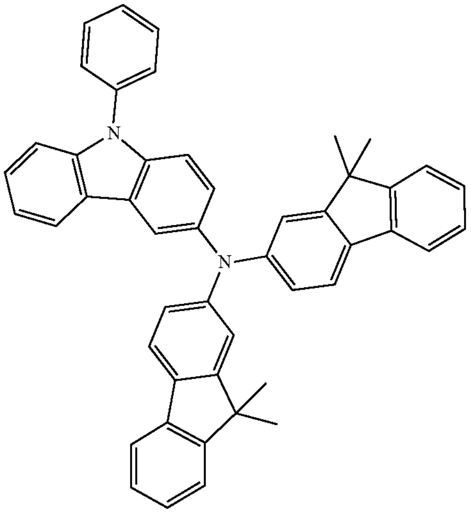
HT12
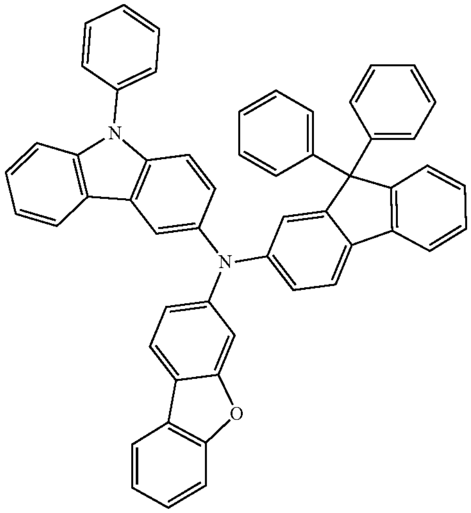
HT13
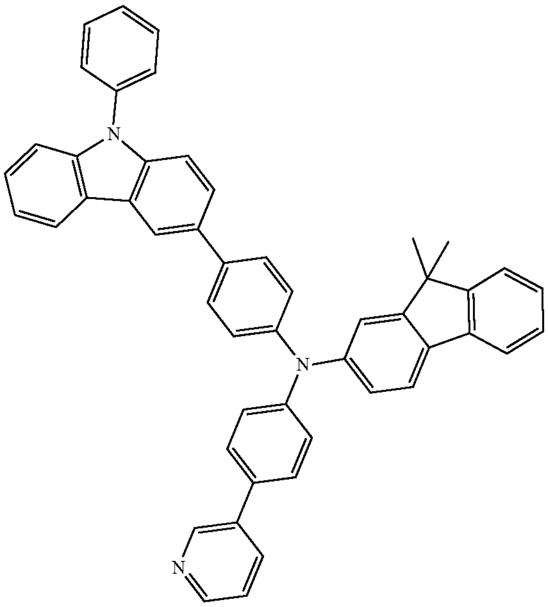
HT14
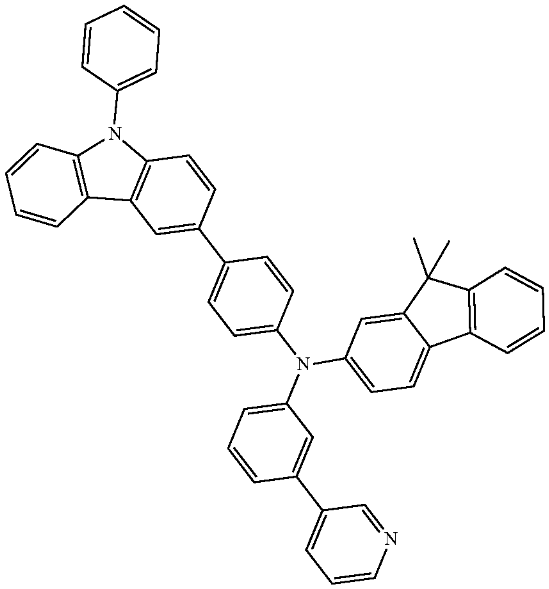
HT15
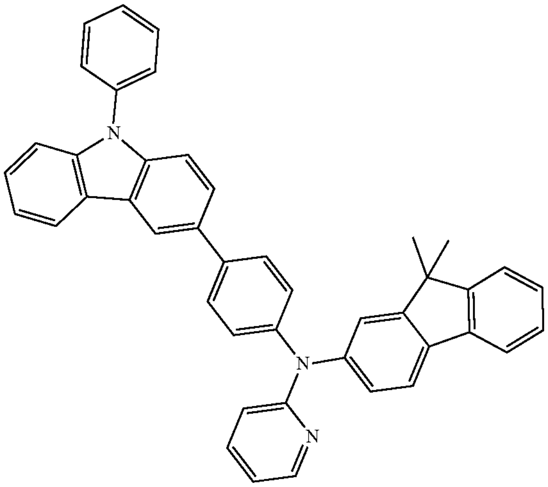
HT16
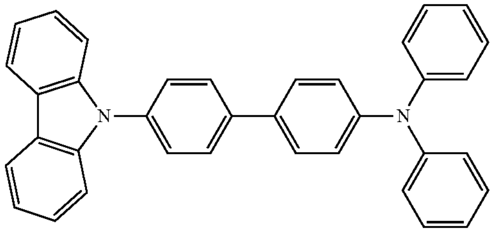

-continued
HT17
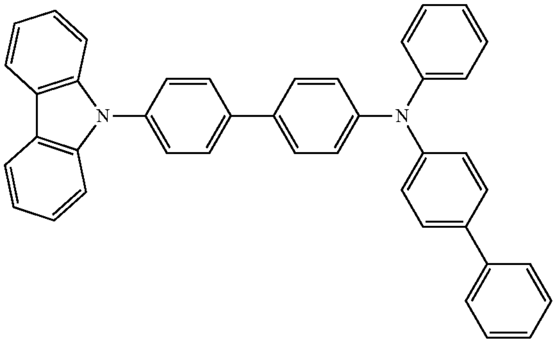
HT18
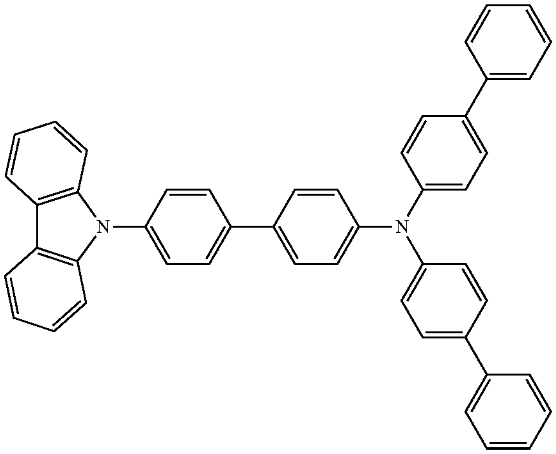
HT19
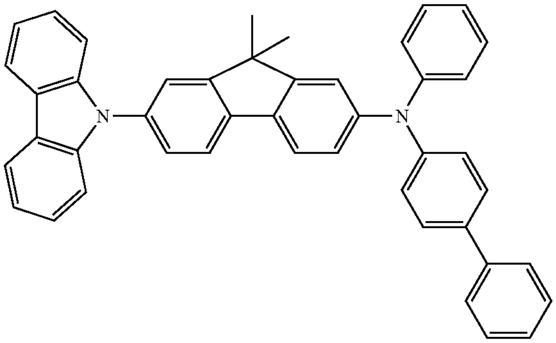
HT20
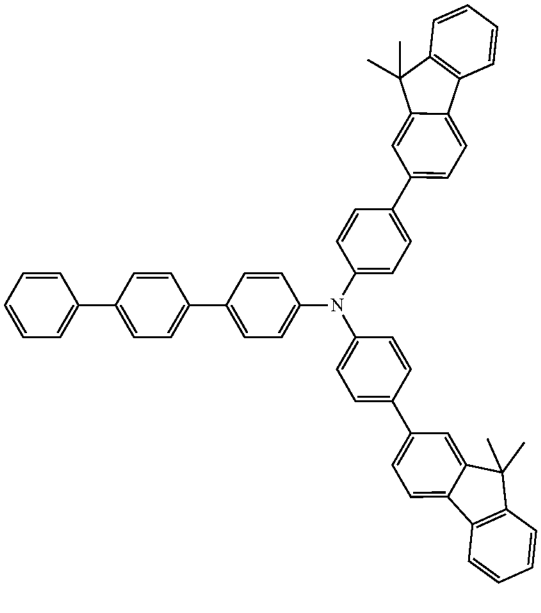

-continued
HT21
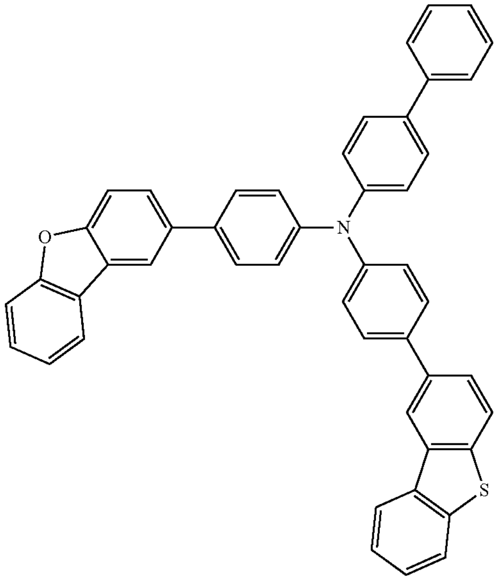
HT22
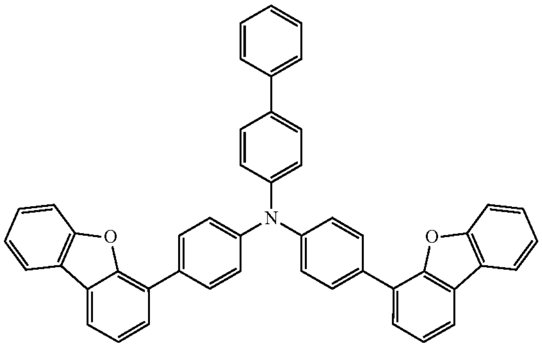
HT23
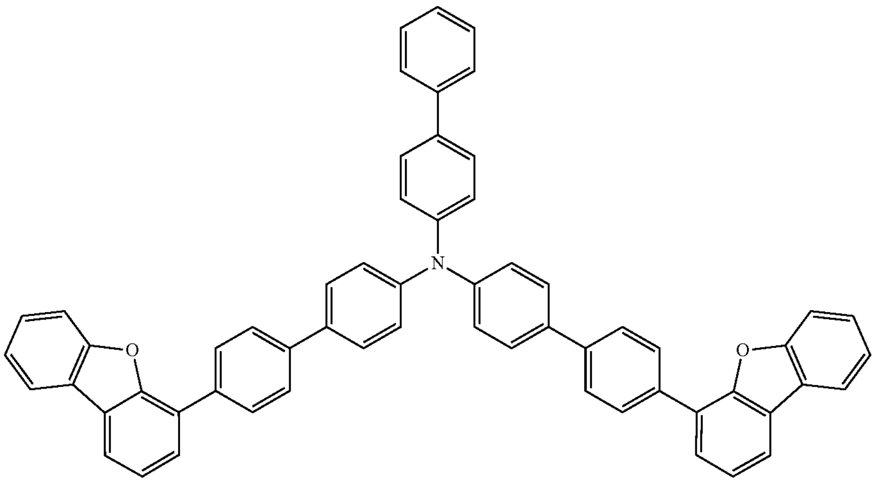

-continued
HT24
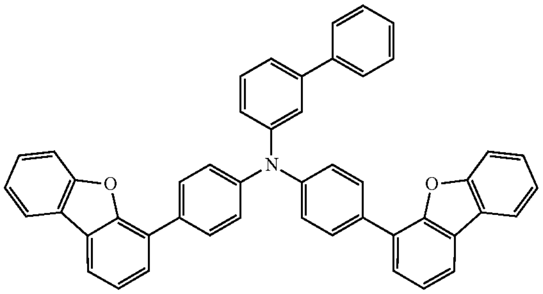
HT25
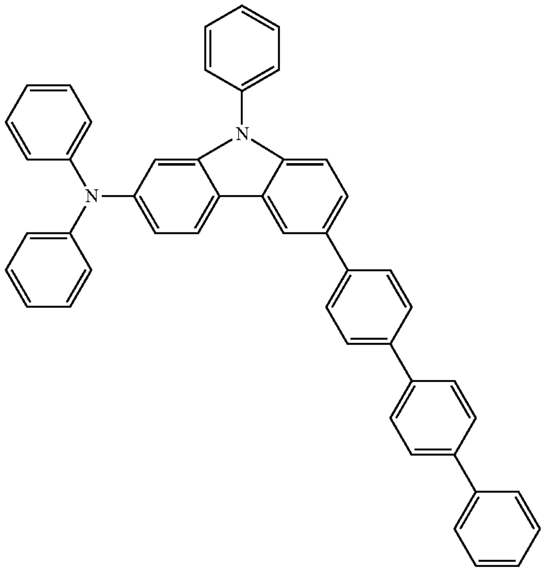
HT26
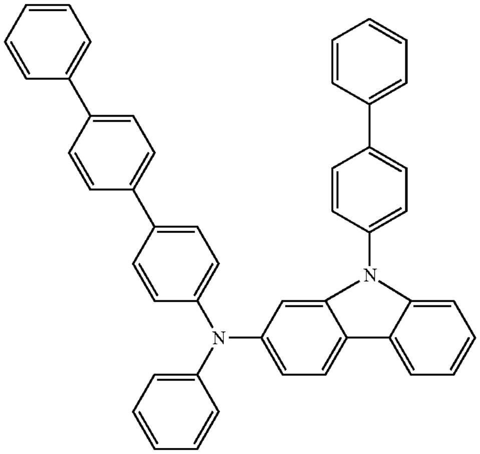
HT27
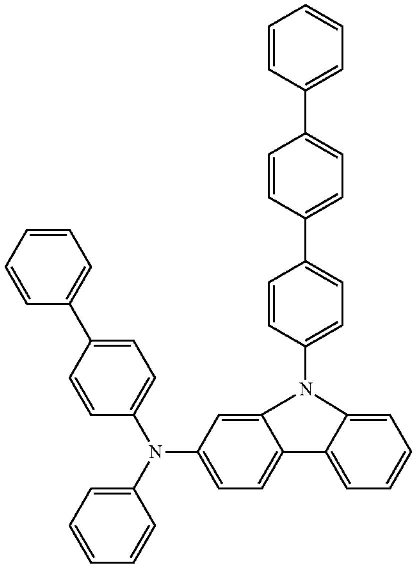
HT28
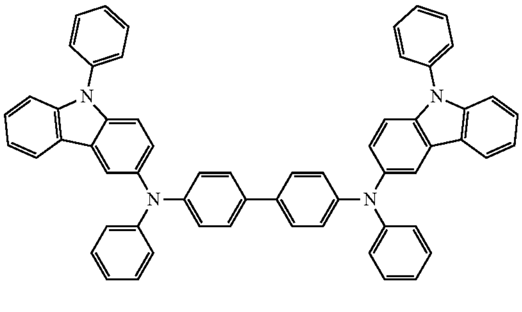
HT29
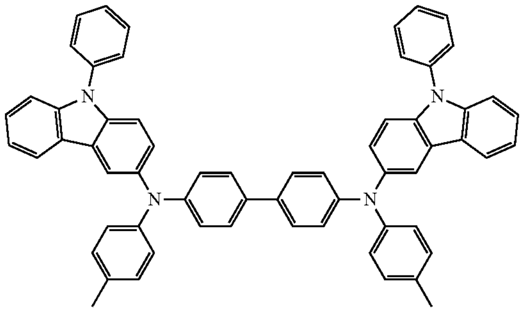

-continued
HT30
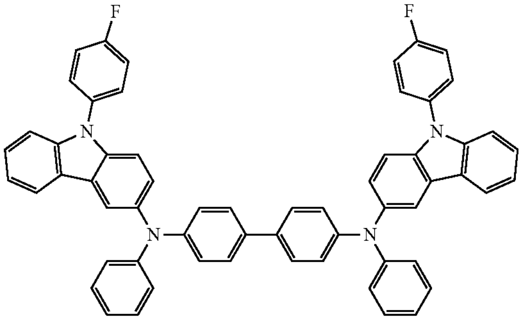
HT31
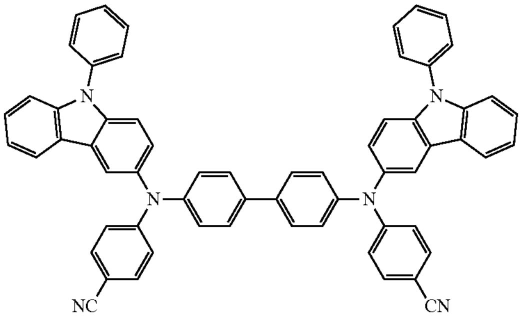
HT32
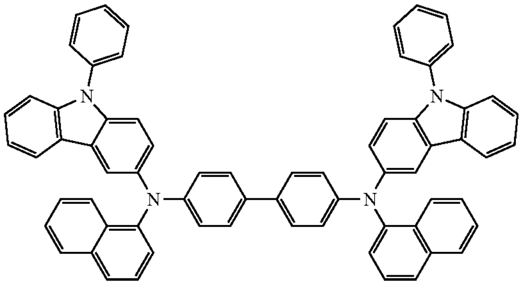
HT33
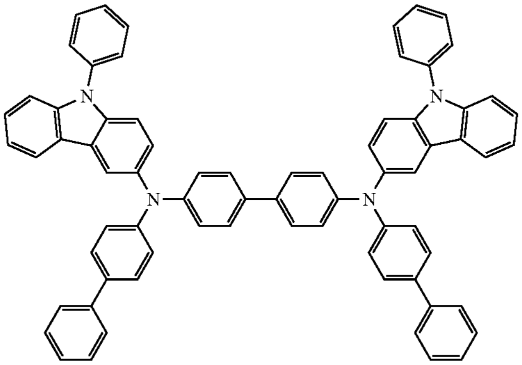
HT34
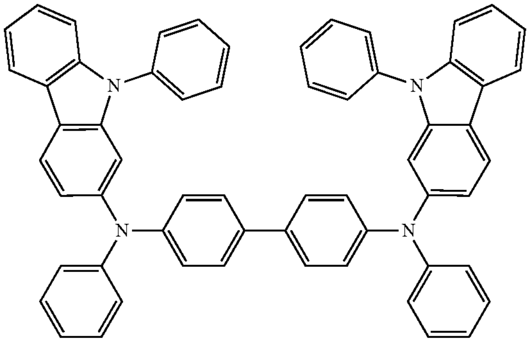
HT35
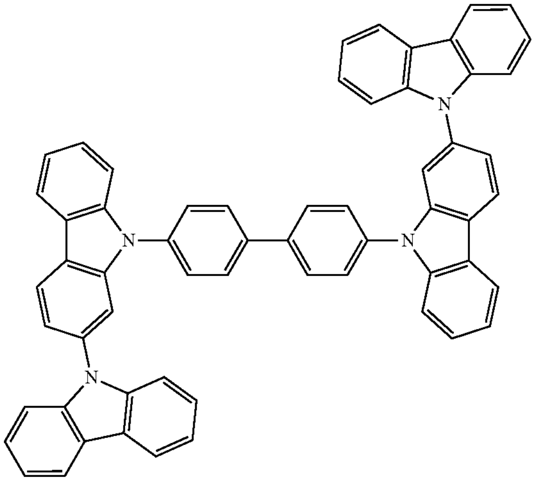

-continued
HT36
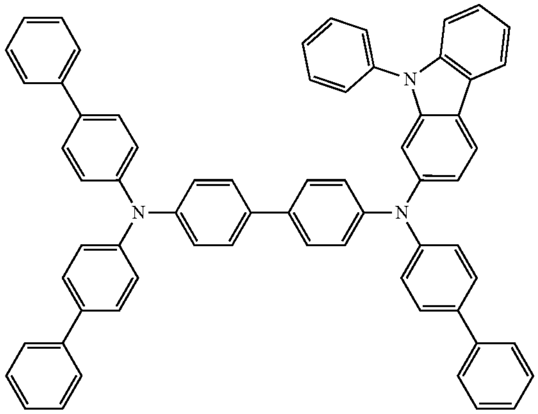
HT37
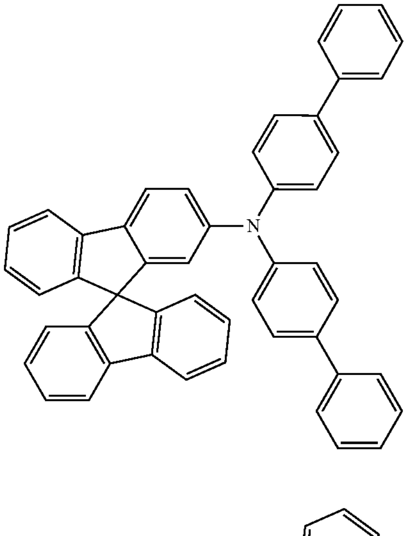
HT38
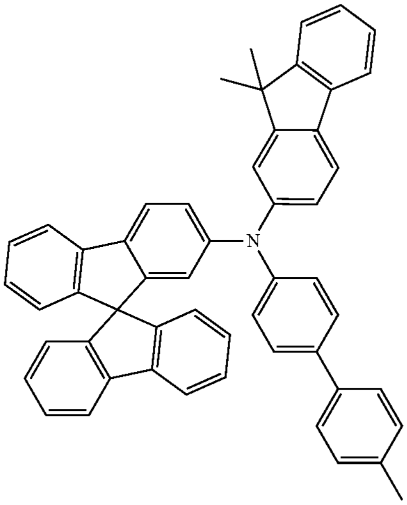
HT39
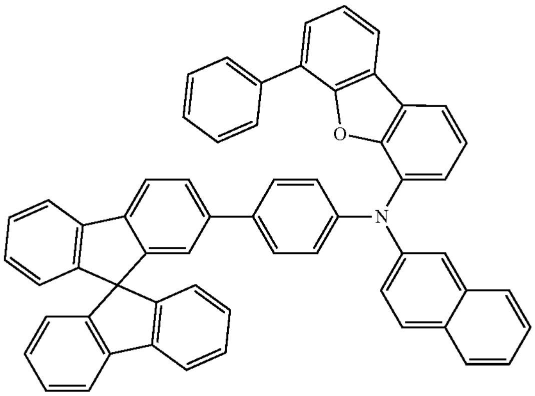
HT40
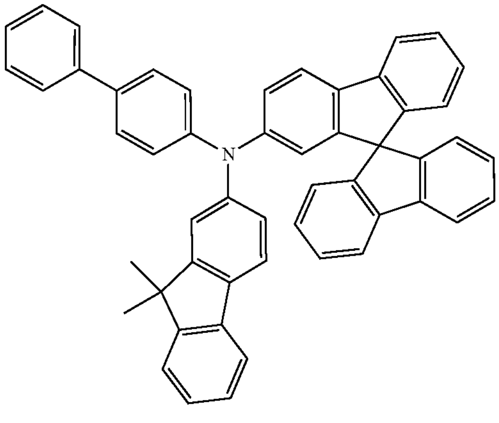
HT41
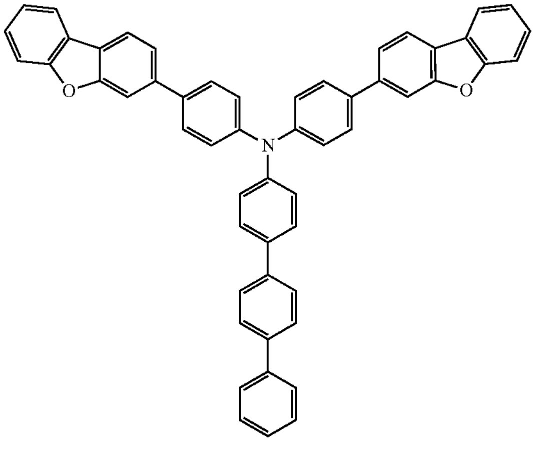

-continued
HT42
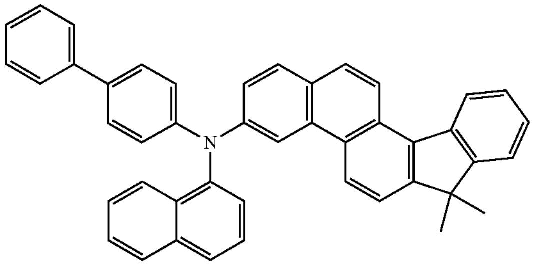
HT43
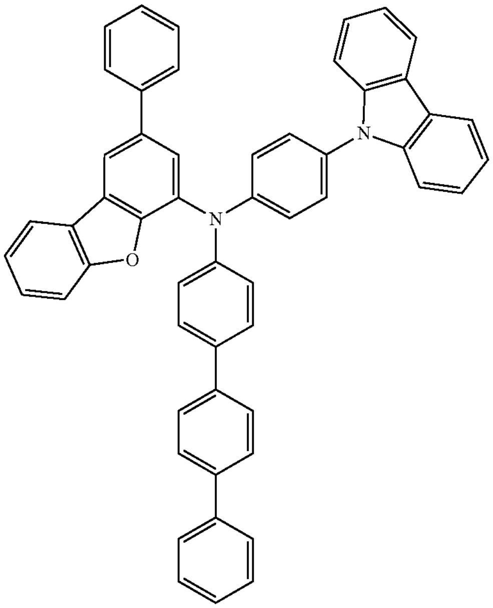
HT44
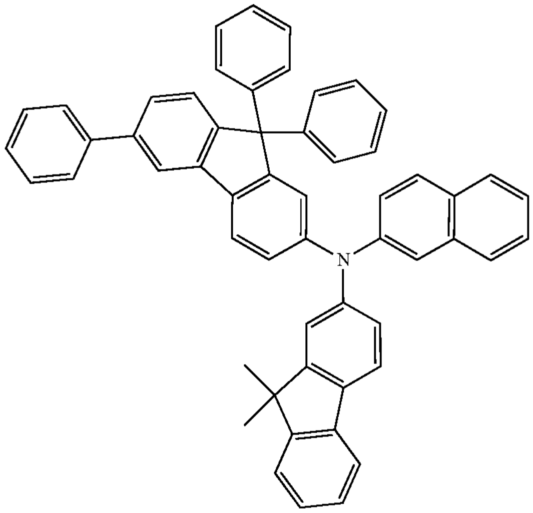
HT45
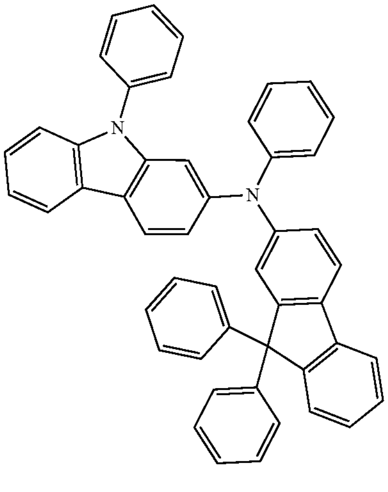

-continued
HT46
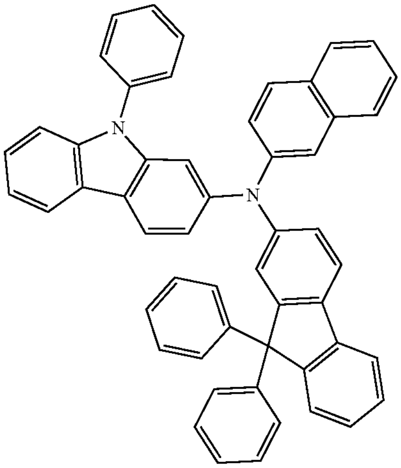
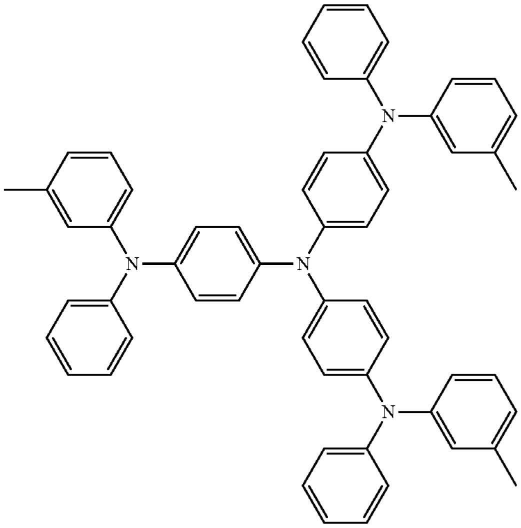
m-MTDATA
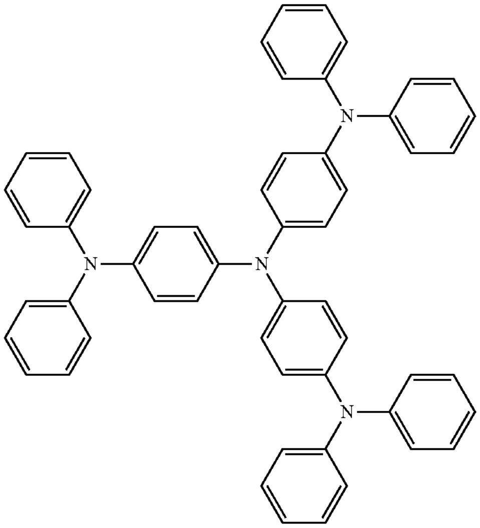
TDATA
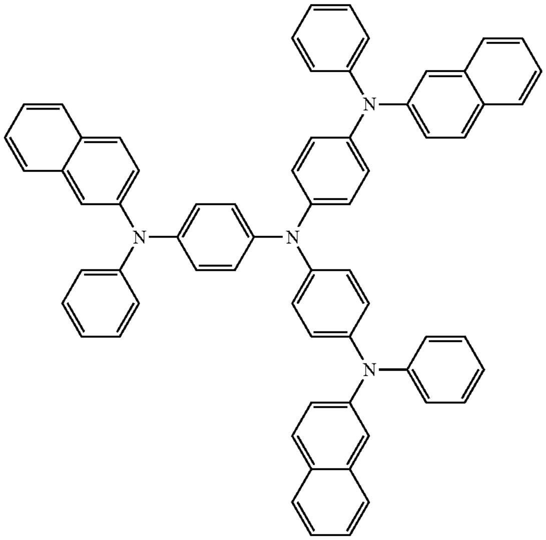
2-TNATA
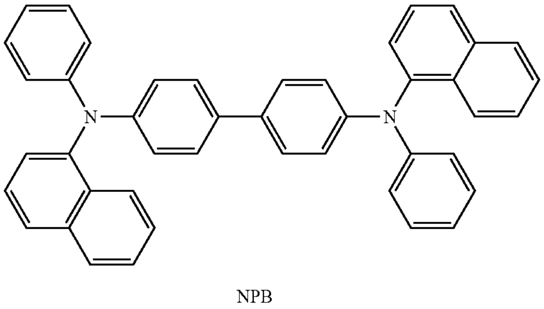
NPB
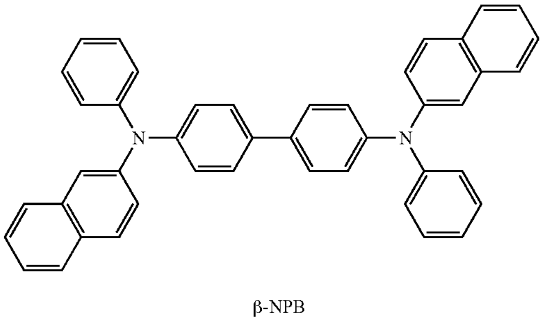
β-NPB -continued

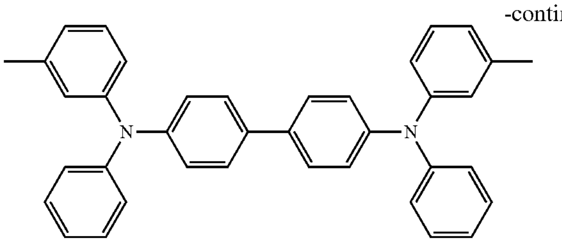

TPD

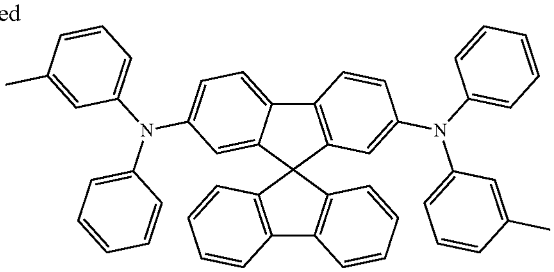

Spiro-TPD

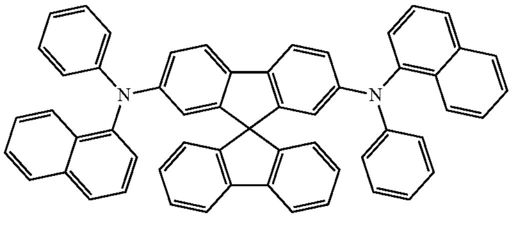

Spiro-NPB

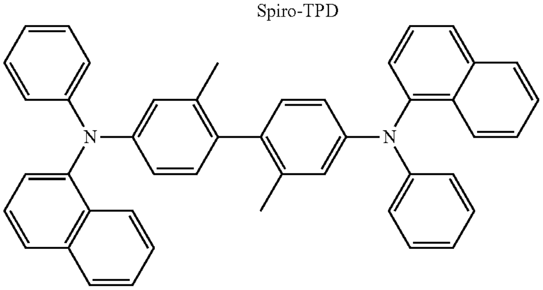

methylated-NPB

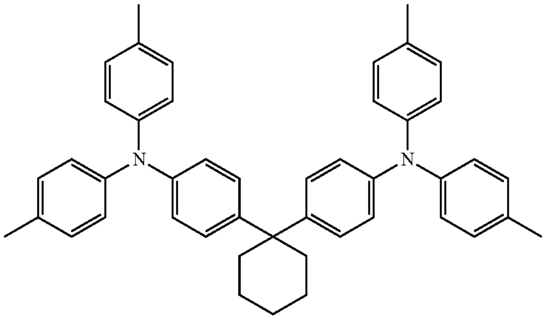

TAPC

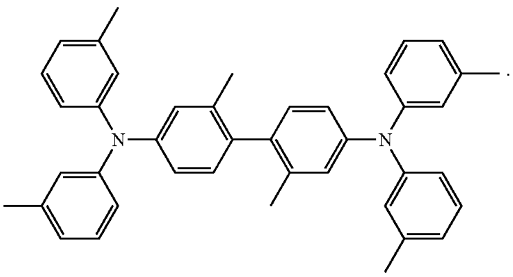

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within any of their respective ranges, satisfactory or suitable hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block or reduce the leakage of electrons from the emission layer to the hole transport region. Material(s) that may be included in the hole transport region may be included in the emission auxiliary layer and the electron blocking layer.

[p-Dopant]

The hole transport region may further include, in addition to the materials described above, a charge-generation material for the improvement of conductive properties. The charge-generation material may be substantially uniformly or substantially non-uniformly dispersed in the hole transport region (for example, in the form of a single layer including (e.g., consisting of) a charge-generation material).

The charge-generation material may be, for example, a p-dopant.

For example, the p-dopant may have a LUMO energy level of about −3.5 eV or less.

In one or more embodiments, the p-dopant may include a quinone derivative, a cyano group-containing compound, a compound including element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

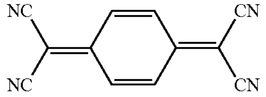

TCNQ

-continued

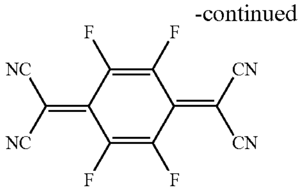

F4-TCNQ

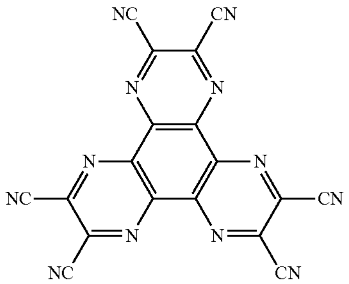

HAT-CN

Formula 221

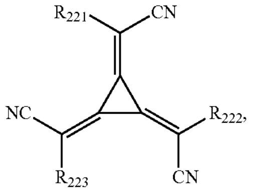

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Examples of the metal may include an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and the like.

Examples of the metalloid may include silicon (Si), antimony (Sb), tellurium (Te), and the like.

Examples of the non-metal may include oxygen (O), halogen (for example, F, Cl, Br, I, etc.), and the like.

Examples of the compound including element EL1 and element EL2 may include metal oxide, metal halide (for example, metal fluoride, metal chloride, metal bromide, metal iodide, etc.), metalloid halide (for example, metalloid fluoride, metalloid chloride, metalloid bromide, metalloid iodide, etc.), metal telluride, and any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), rhenium oxide (for example, $ReO_3$, etc.), and the like.

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), gold halide (for example, AuF, AuCl, AuBr, AuI, etc.), and the like.

Examples of the post-transition metal halide may include zinc halide (for example, $ZnF_2$, $ZnCl_2$, $ZnBr_2$, $ZnI_2$, etc.), indium halide (for example, $InI_3$, etc.), tin halide (for example, $SnI_2$, etc.), and the like.

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, and the like.

Examples of the metalloid halide may include antimony halide (for example, $SbCl_5$, etc.) and the like.

Examples of the metal telluride may include alkali metal telluride (for example, $Li_2Te$, a $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), lanthanide metal telluride (for example, LaTe, CeTe, PrTe, NdTe, PmTe, EuTe, GdTe, TbTe, DyTe, HoTe, ErTe, TmTe, YbTe, LuTe, etc.), and the like.

[Emission Layer in Interlayer 130]

When the light-emitting device 10 is a full-color light-emitting device, the emission layer may be patterned into a red emission layer, a green emission layer, and/or a blue emission layer, according to a sub-pixel. In one or more embodiments, the emission layer 131 may have a stacked structure of two or more layers of a red emission layer, a green emission layer, and a blue emission layer, in which the two or more layers contact each other or are separated from each other to emit white light. In one or more embodiments, the emission layer may include two or more materials of a red light-emitting material, a green light-emitting material, and a blue light-emitting material, in which the two or more materials are mixed with each other in a single layer to emit white light.

The emission layer 131 may include a host and a dopant. The dopant may include a phosphorescent dopant, a fluorescent dopant, or any combination thereof.

In the emission layer 131, an amount of the dopant may be in a range of about 0.01 part by weight to about 15 parts by weight based on 100 parts by weight of the host.

In one or more embodiments, the emission layer 131 may include a quantum dot.

In one or more embodiments, the emission layer 131 may include a delayed fluorescence material. The delayed fluorescence material may act as a host or a dopant in the emission layer 131.

A thickness of the emission layer 131 may be in a range of about 100 Å to about 1,000 Å, for example, about 200 Å to about 600 Å. When the thickness of the emission layer 131 is within any of these ranges, excellent or suitable luminescence characteristics may be obtained without a substantial increase in driving voltage.

[Host]

In one or more embodiments, the host may include a compound represented by Formula 301:

Formula 301

$$[Ar_{301}]_{xb11}-[(L_{301})_{xb1}-R_{301}]_{xb21},$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each be the same as described in connection with $Q_1$.

For example, when xb11 in Formula 301 is 2 or more, two or more of $Ar_{301}$ may be bonded to each other via a single bond.

In one or more embodiments, the host may include a compound represented by Formula 301-1, a compound represented by Formula 301-2, or any combination thereof:

Formula 301-1

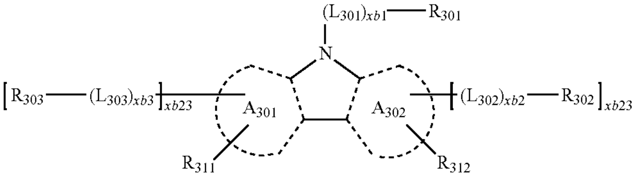

Formula 301-2

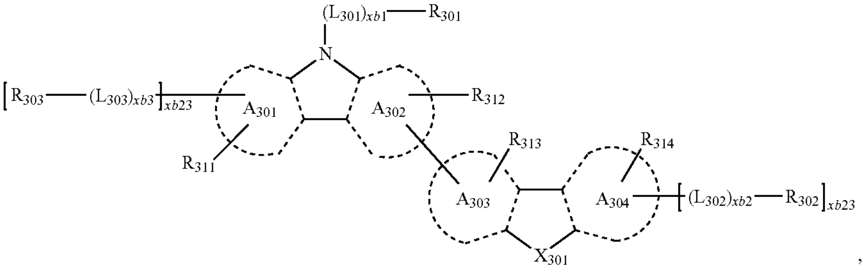

, wherein, in Formulae 301-1 and 301-2, rings $A_{301}$ to $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In one or more embodiments, the host may include an alkali earth metal complex, a post-transition metal complex, or any combination thereof. In one or more embodiments, the host may include a Be complex (for example, Compound H55), an Mg complex, a Zn complex, or any combination thereof.

In one or more embodiments, the host may include: one or more of Compounds H1 to H124; 9,10-di(2-naphthyl) anthracene (ADN); 2-methyl-9,10-bis(naphthalen-2-yl)anthracene (MADN); 9,10-di-(2-naphthyl)-2-t-butyl-anthracene (TBADN); 4,4'-bis(N-carbazolyl)-1,1'-biphenyl (CBP); 1,3-di-9-carbazolylbenzene (mCP); 1,3,5-tri(carbazol-9-yl)benzene (TCP); or any combination thereof:

H1

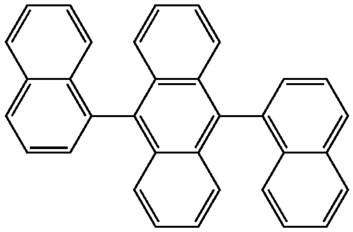

H2

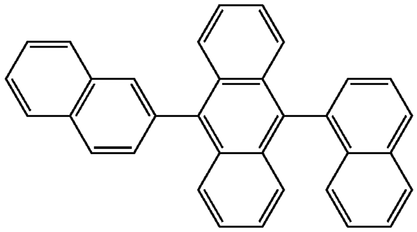

H3

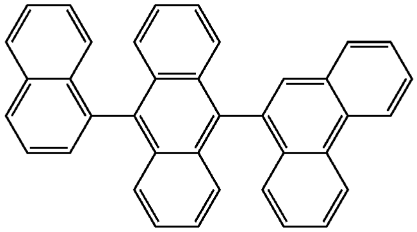

H4

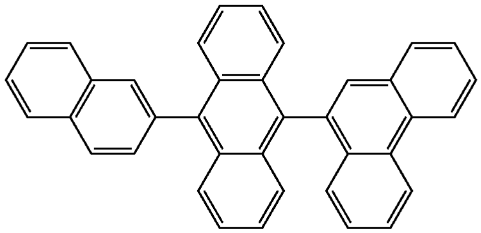

-continued

H5

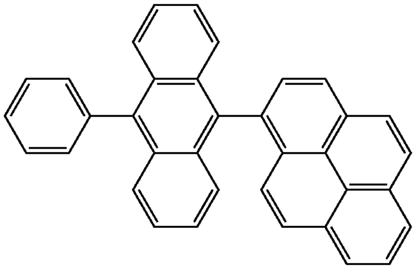

H6

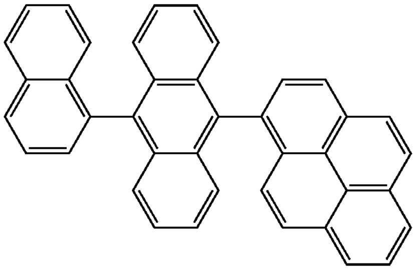

H7

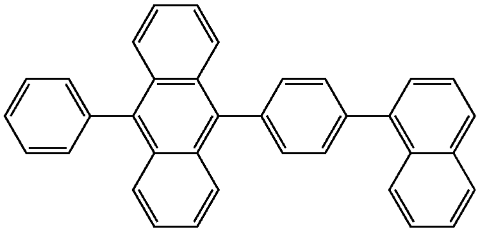

H8

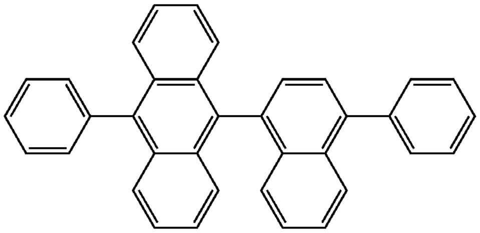

H9

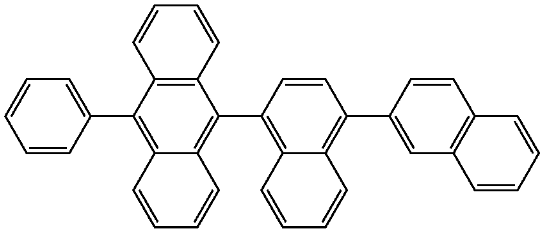

H10

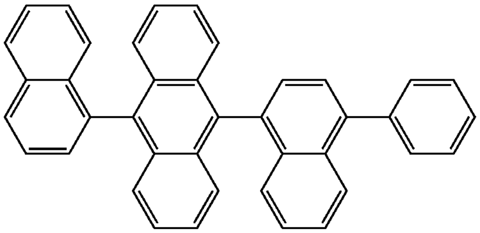

-continued
H11
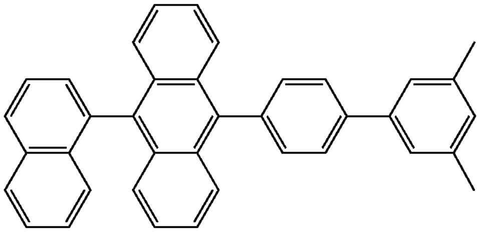
H12
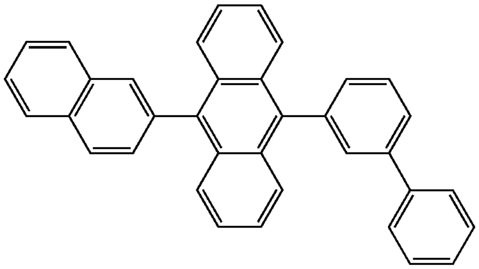
H13
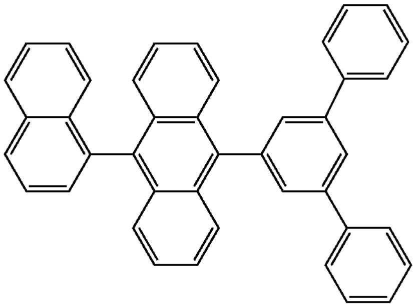
H14
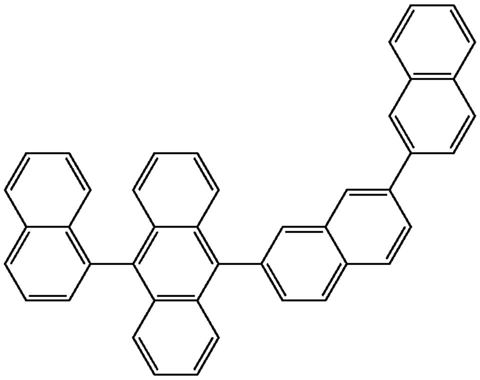
H15
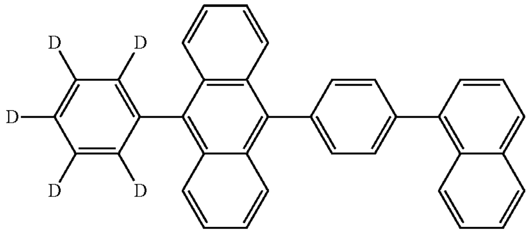
-continued
H16
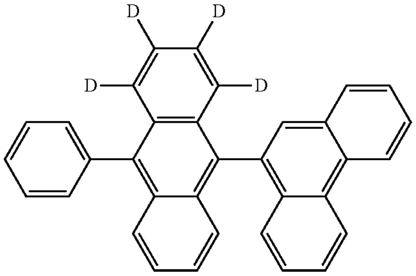
H17
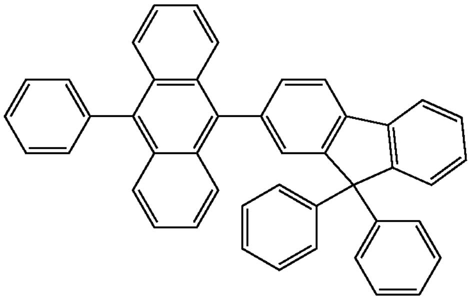
H18
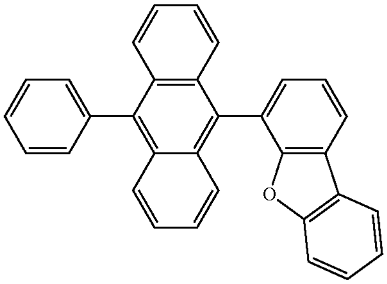
H19
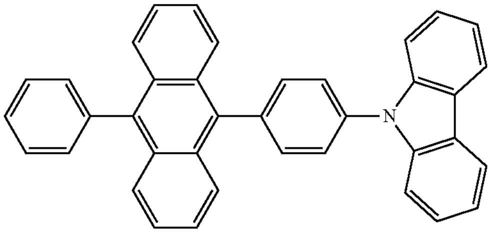
H20
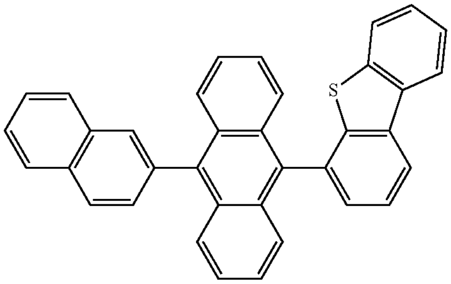

-continued
H21
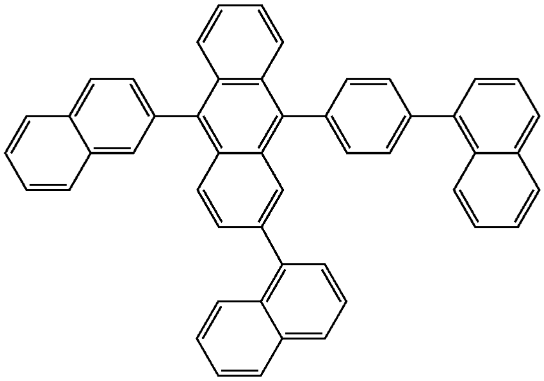
H22
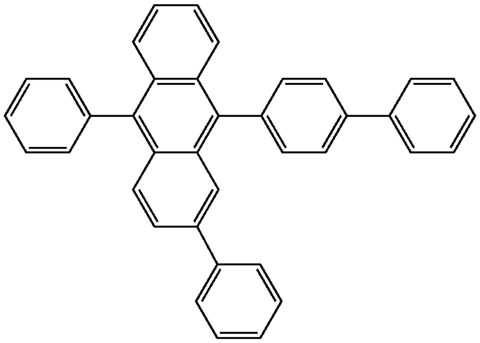
H23
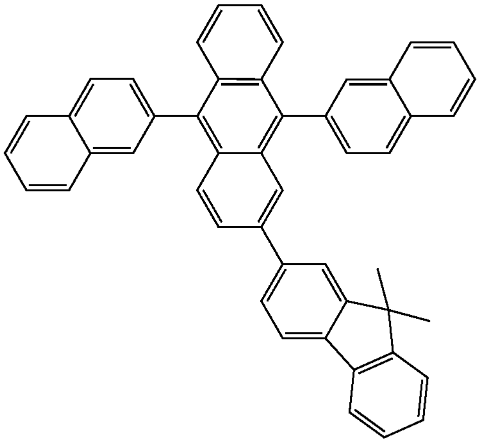
H24
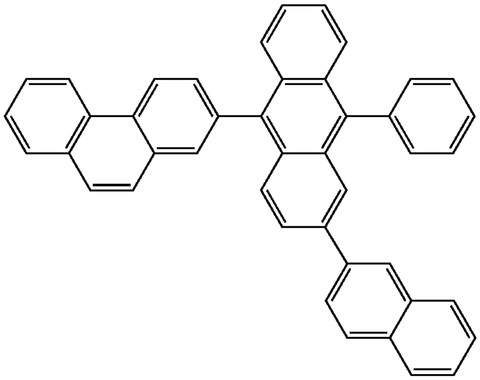
-continued
H25
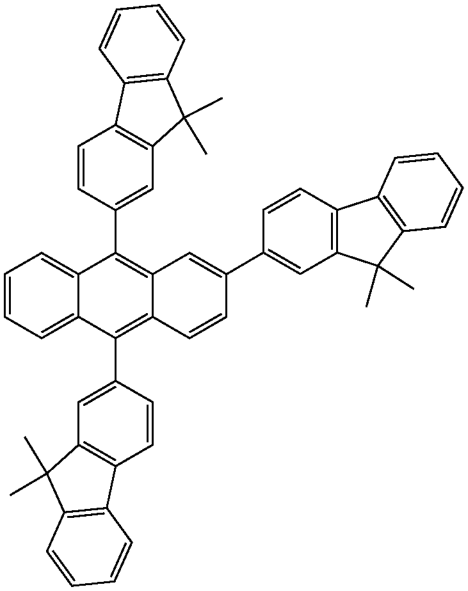
H26
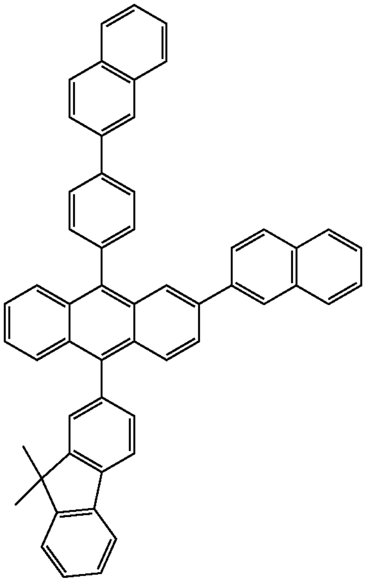
H27
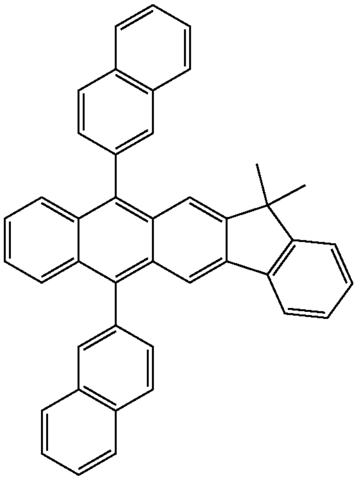

-continued
H28
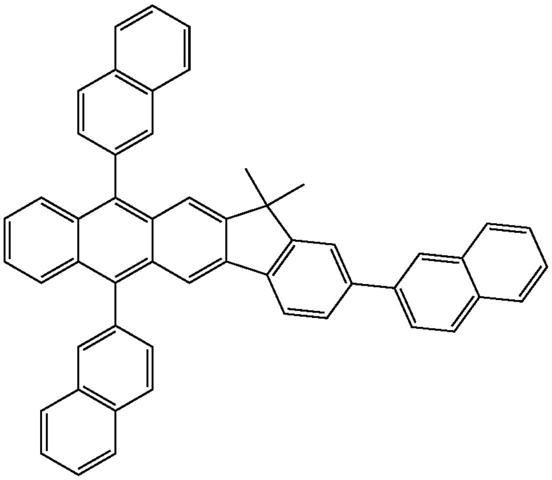
H29
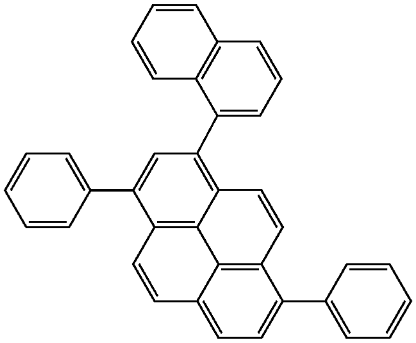
H30
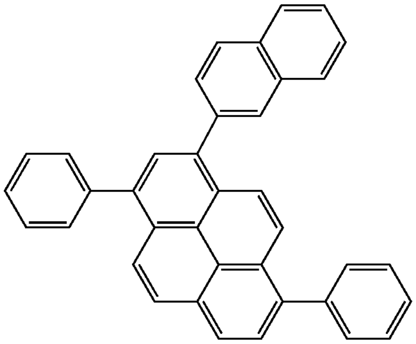
H31
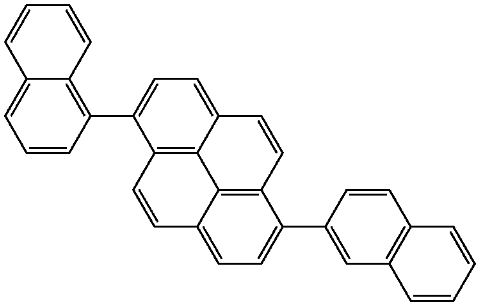
-continued
H32
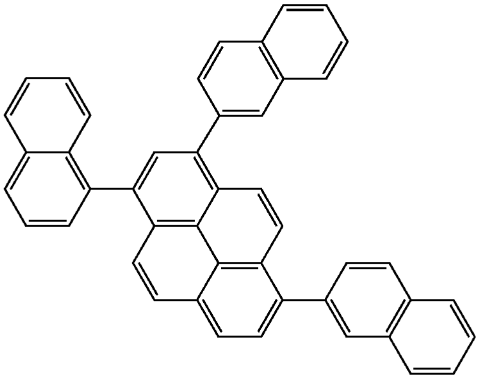
H33
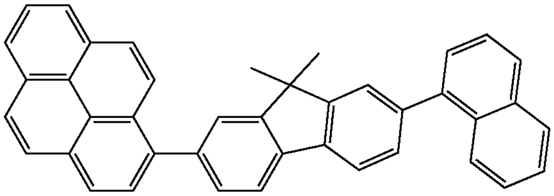
H34
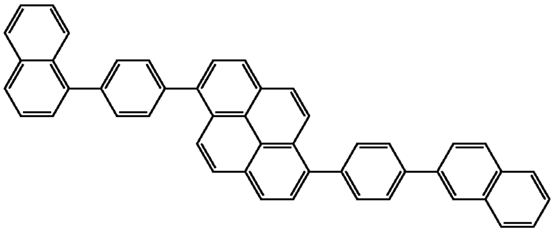
H35
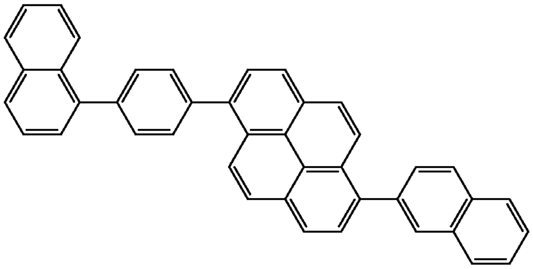
H36
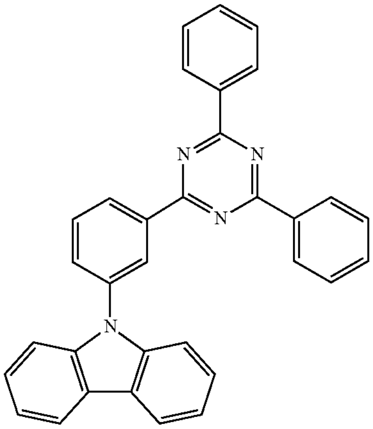

-continued
H37
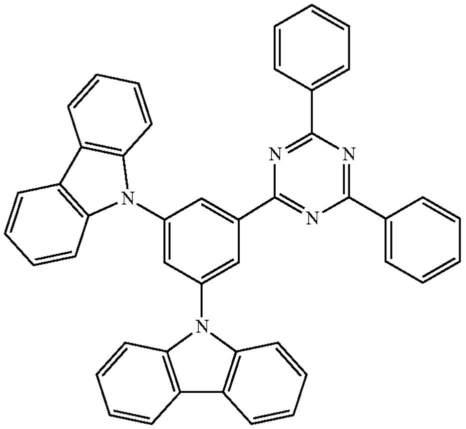
H38
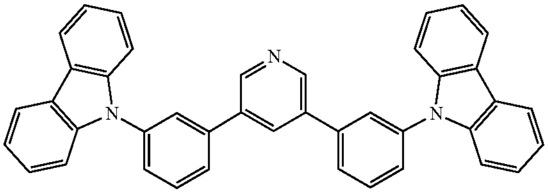
H39
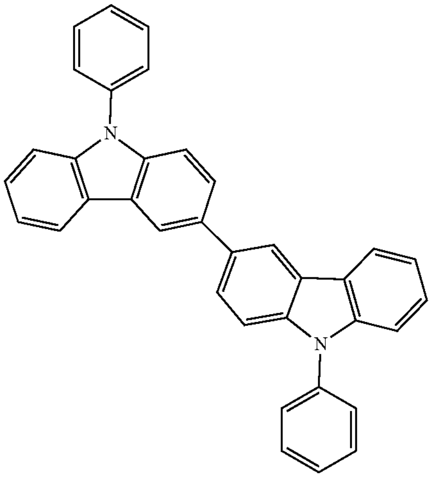
-continued
H40
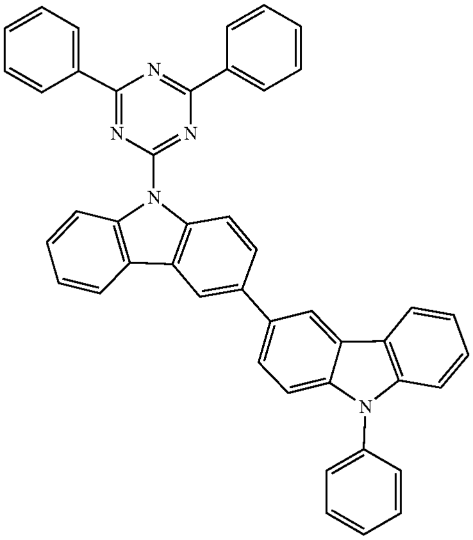
H41
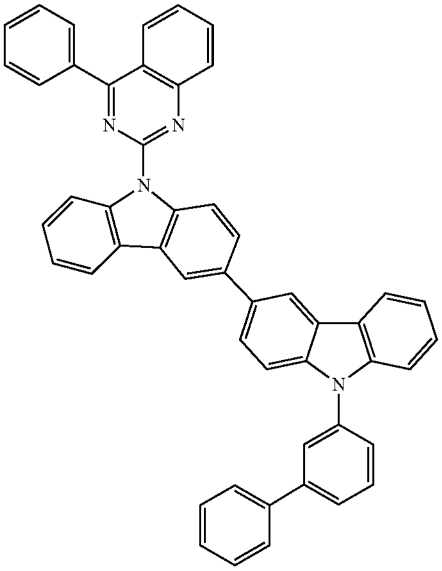
H42
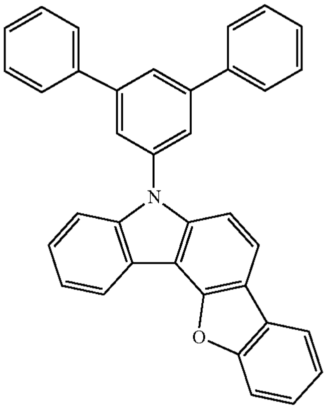

-continued
H43
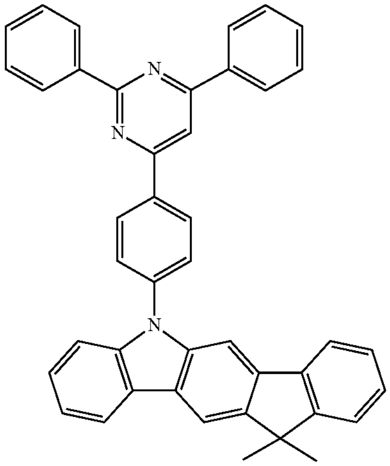
H44
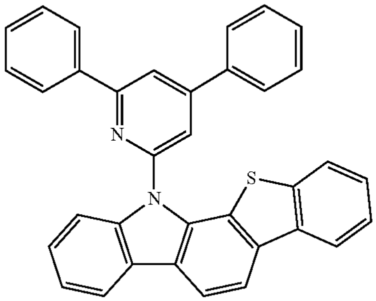
H45
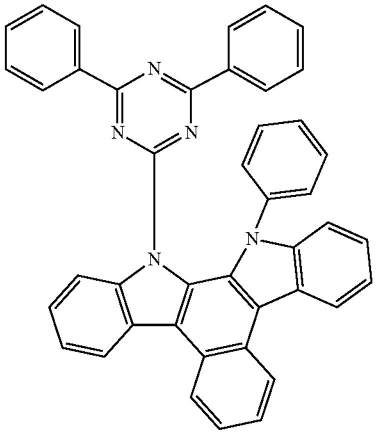
H46
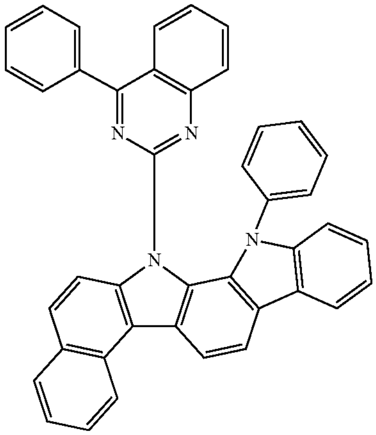
-continued
H47
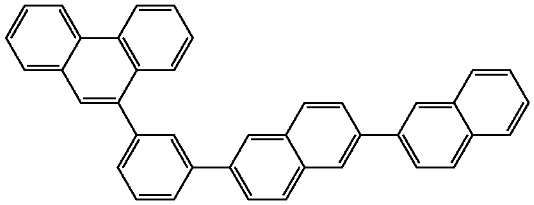
H48
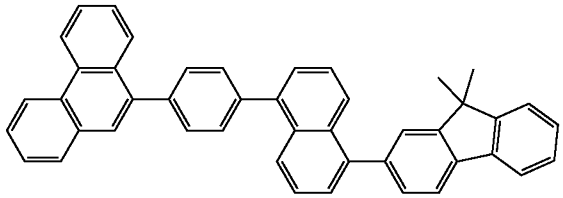
H49
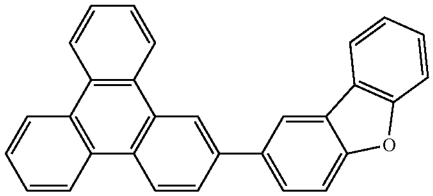
H50
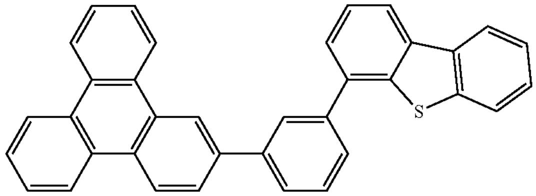
H51
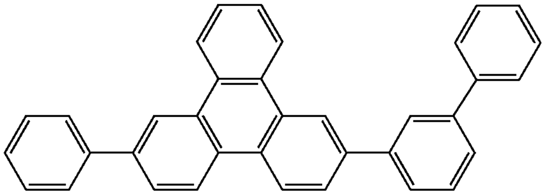
H52
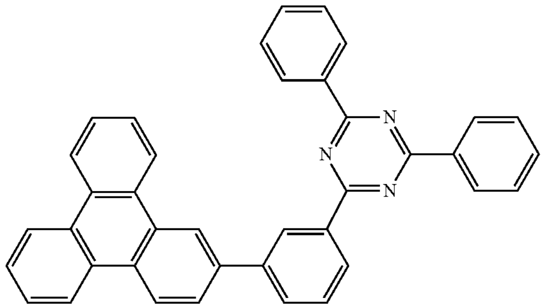

-continued
H53
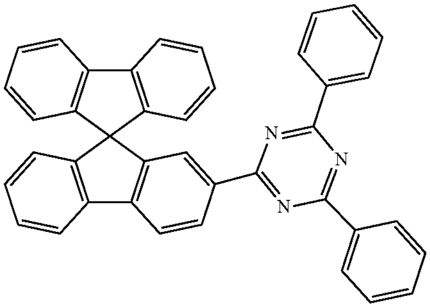
H54
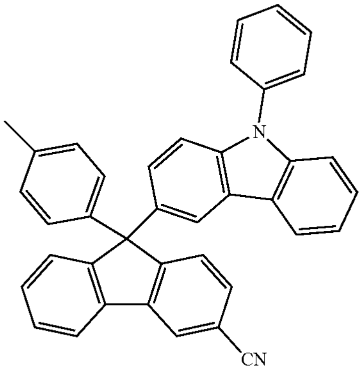
H55
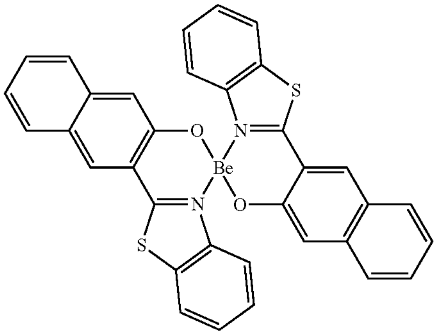
H56
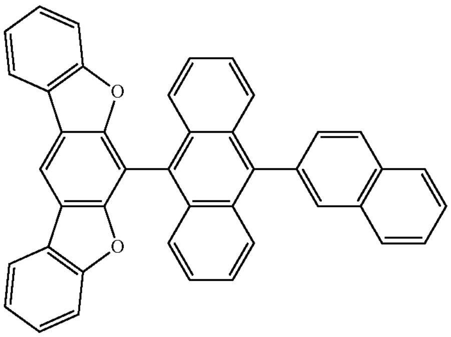
-continued
H57
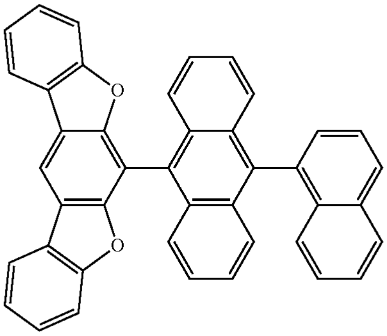
H58
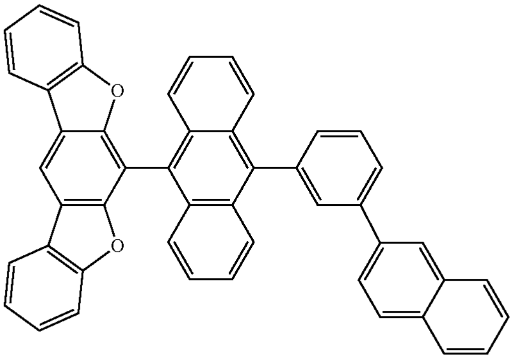
H59
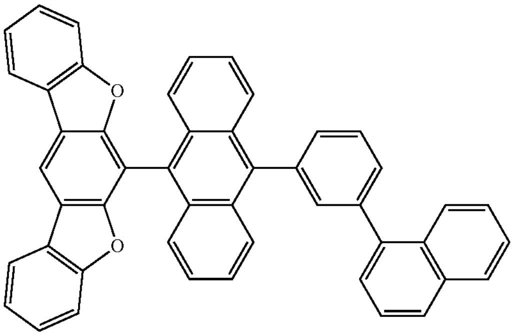
H60
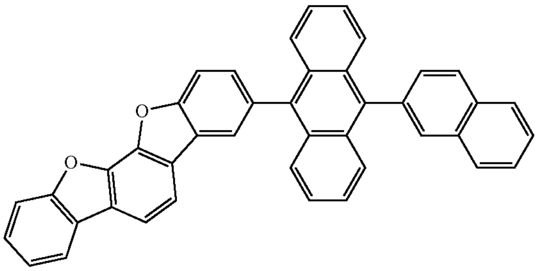

-continued
H61
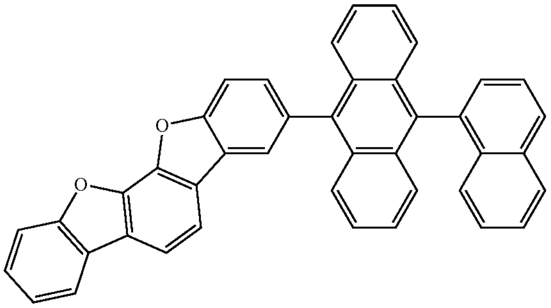
H62
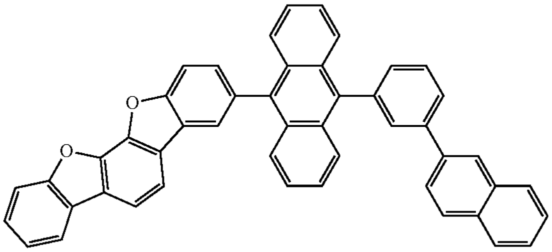
H63
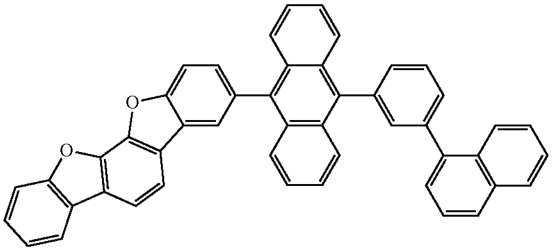
H64
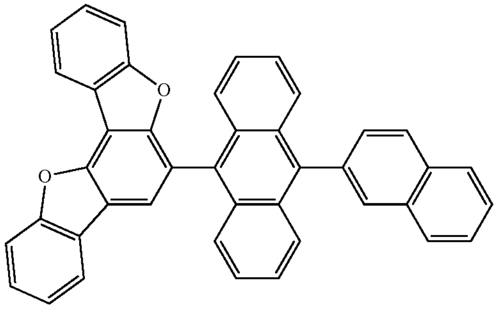
H65
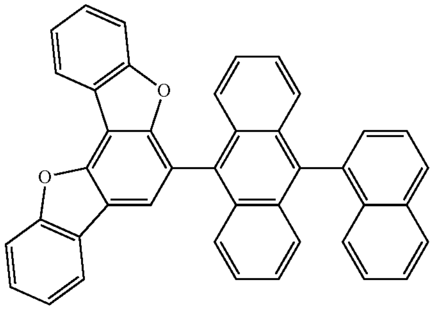
-continued
H66
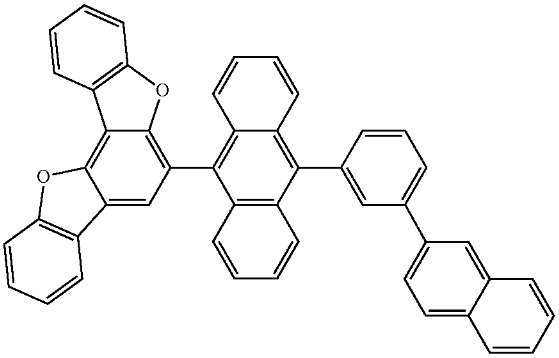
H67
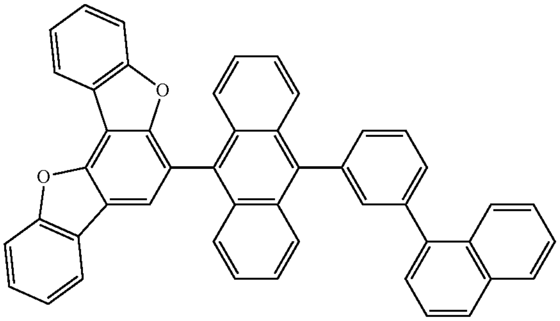
H68
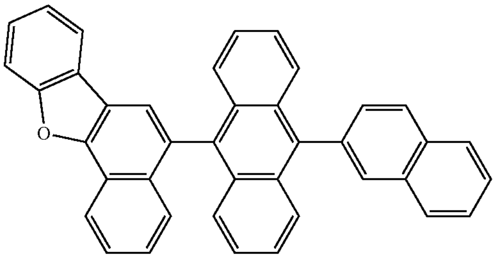
H69
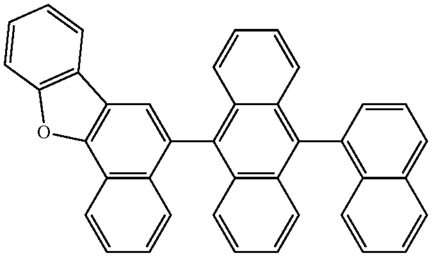
H70
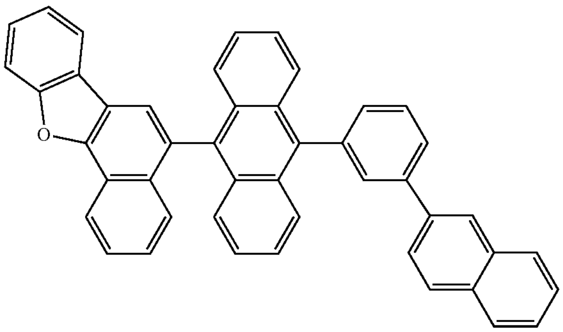

-continued
H71
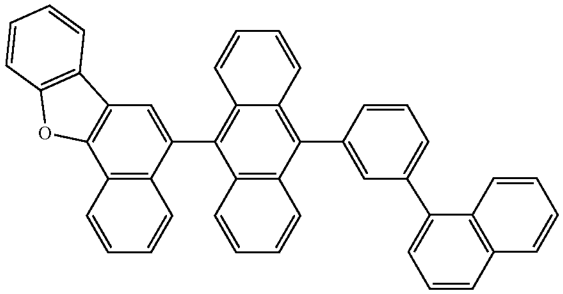
H72
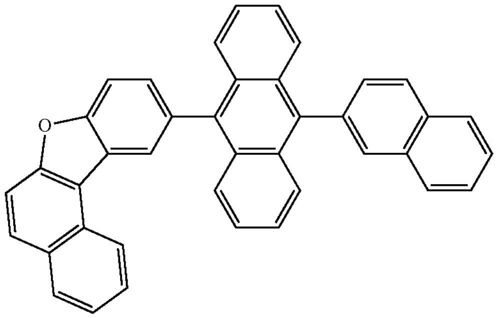
H73
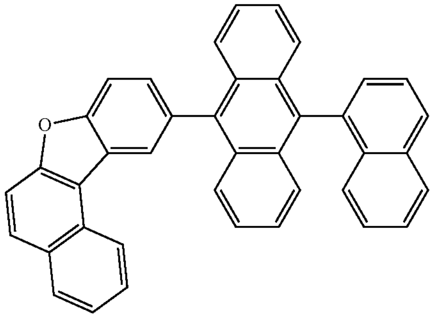
H74
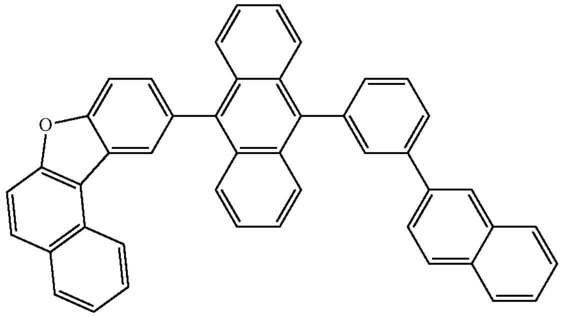
-continued
H75
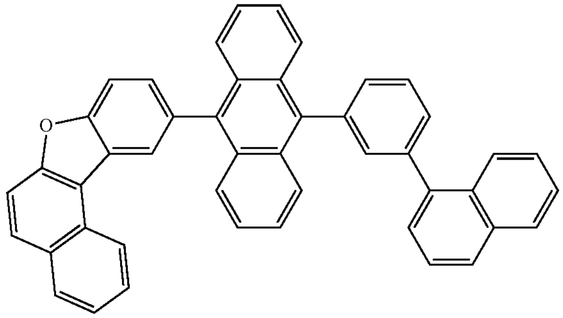
H76
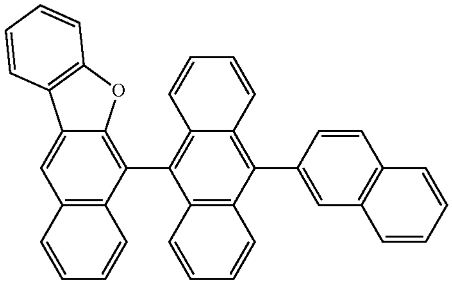
H77
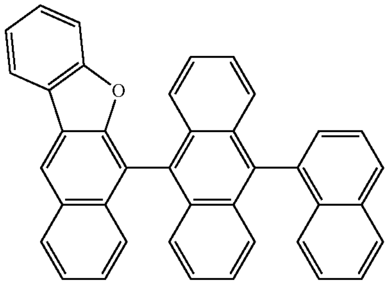
H78
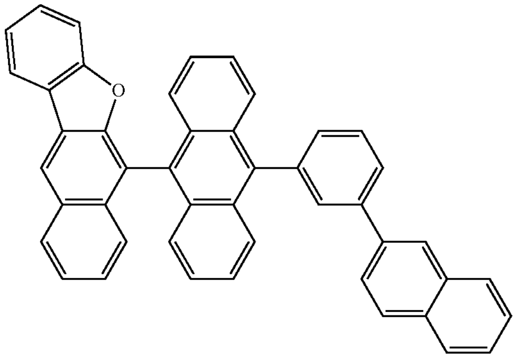
H79
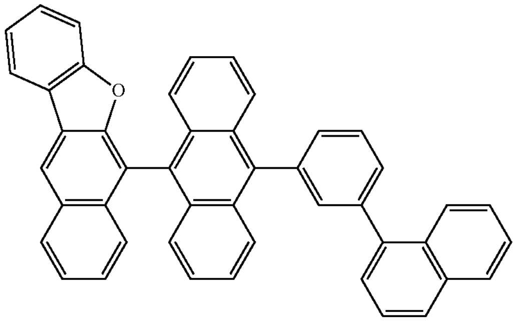

-continued
H80
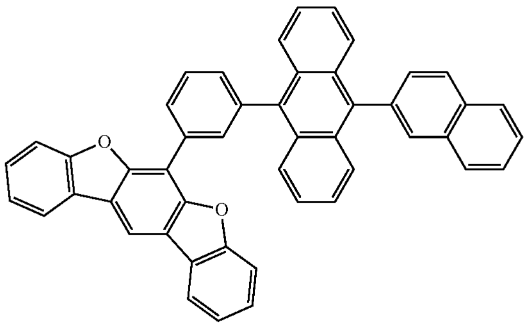
H81
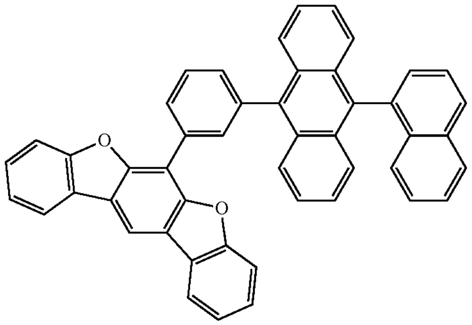
H82
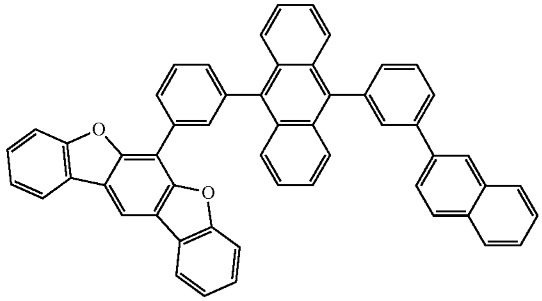
H83
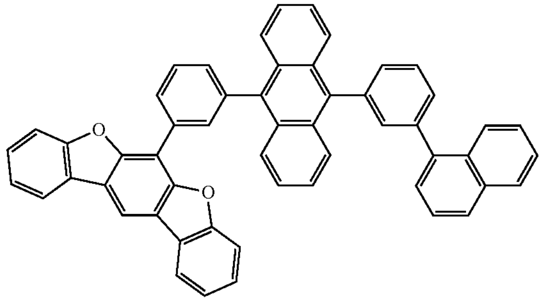
-continued
H84
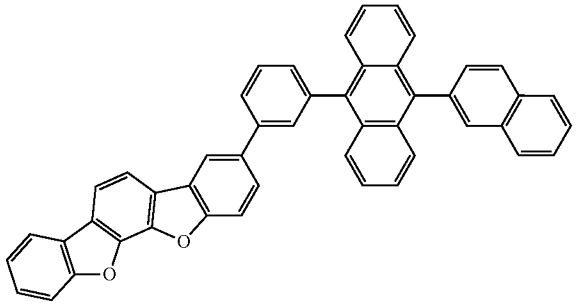
H85
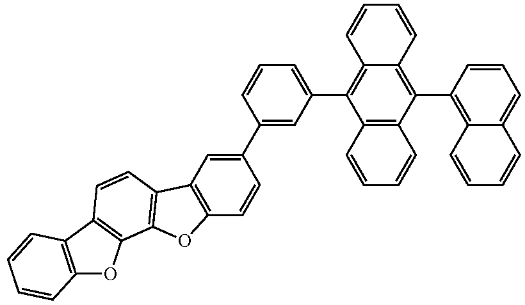
H86
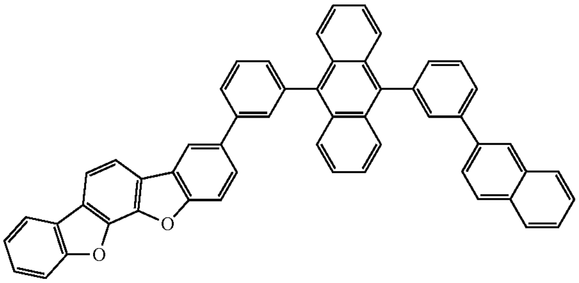
H87
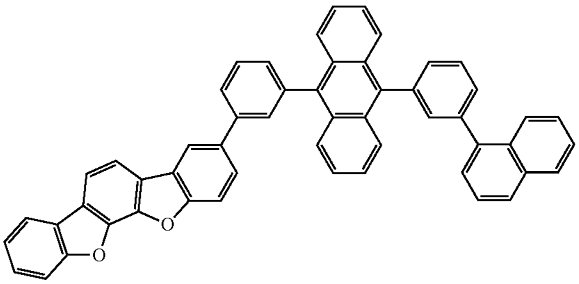
H88
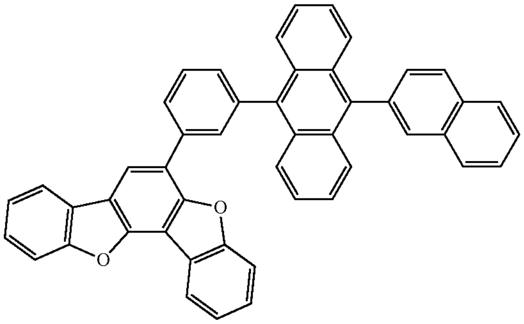

-continued
H89
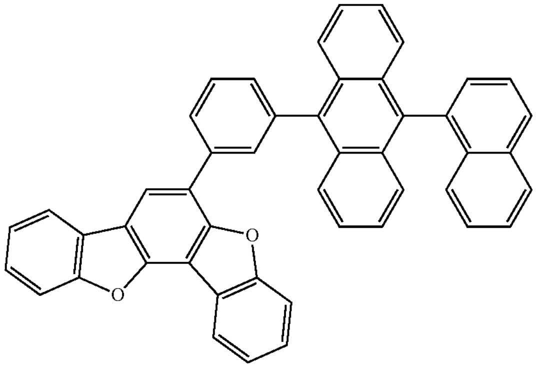
H90
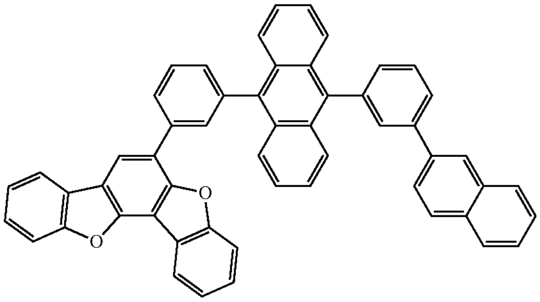
H91
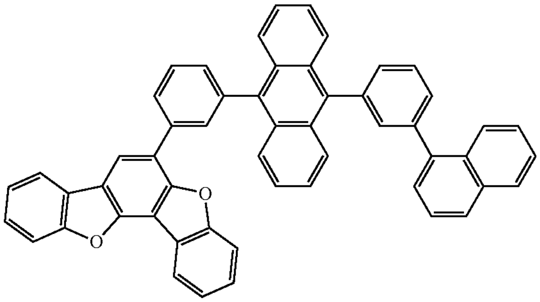
H92
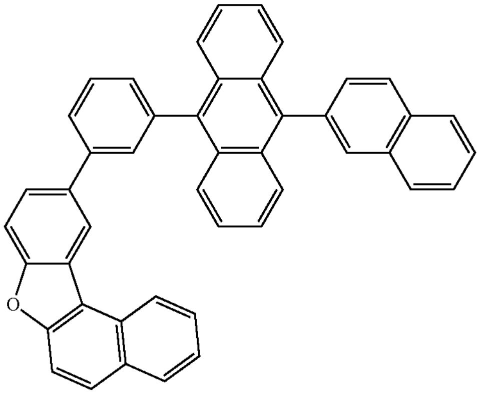
-continued
H93
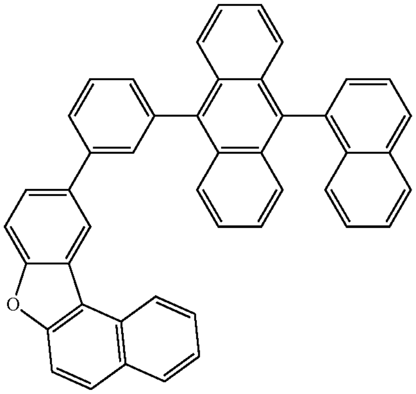
H94
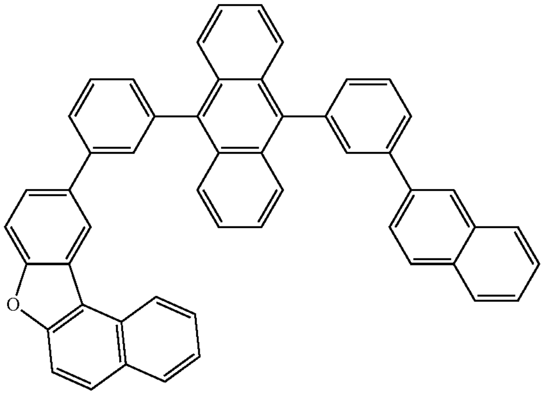
H95
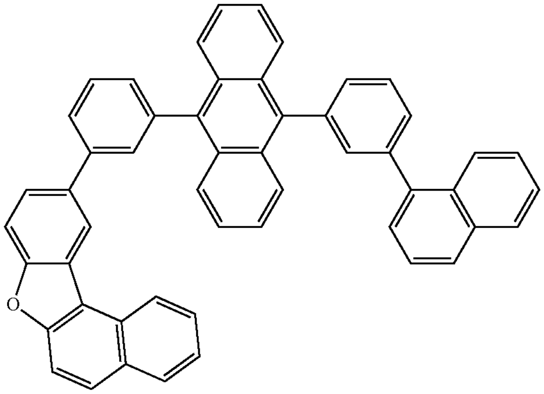
H96
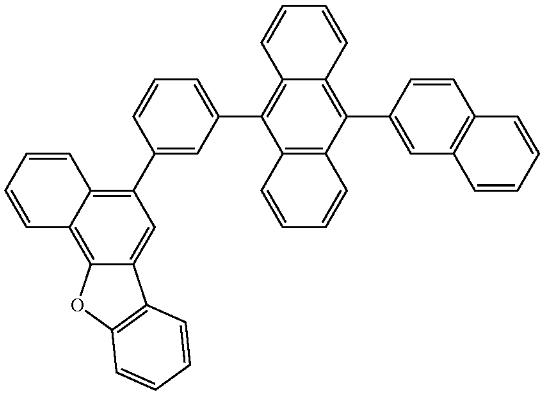

-continued
H97
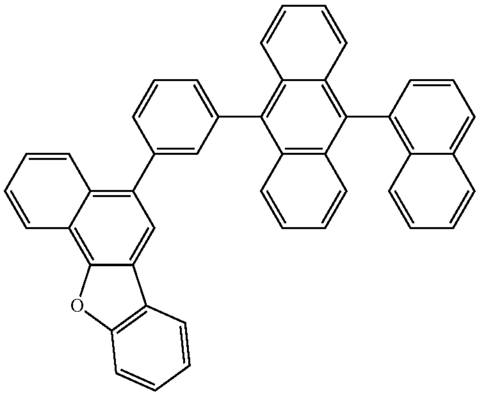
H98
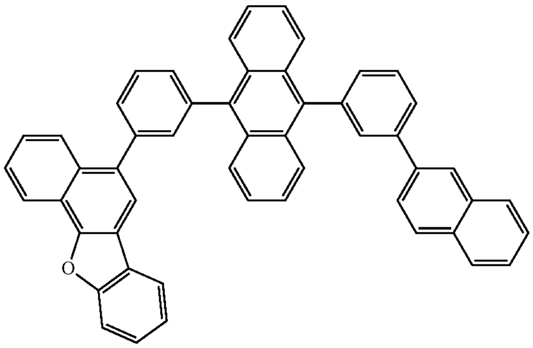
H99
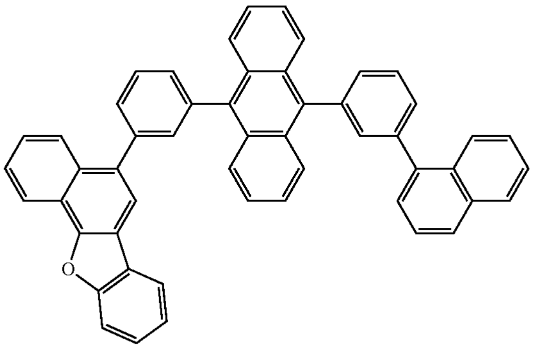
H100
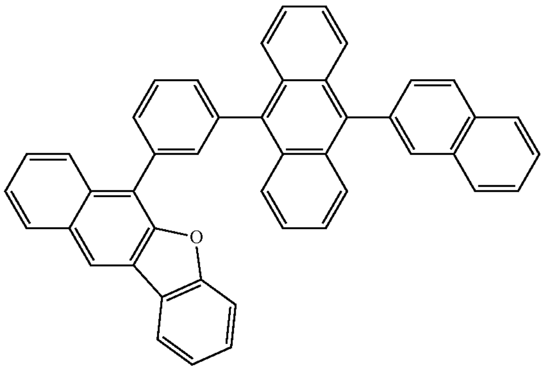
-continued
H101
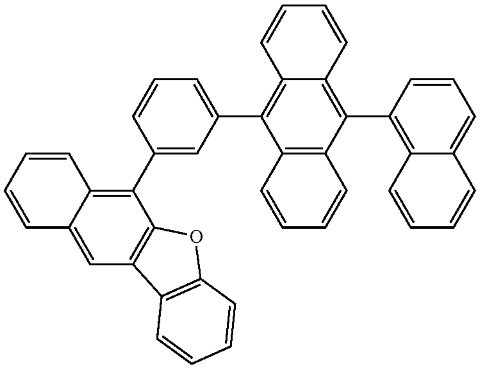
H102
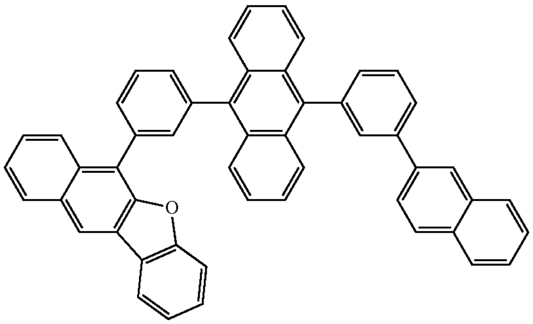
H103
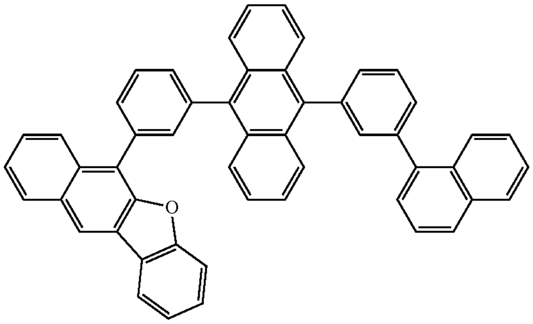
H104
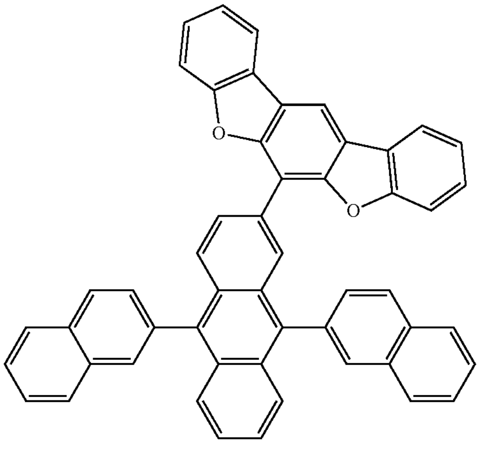

-continued
H105
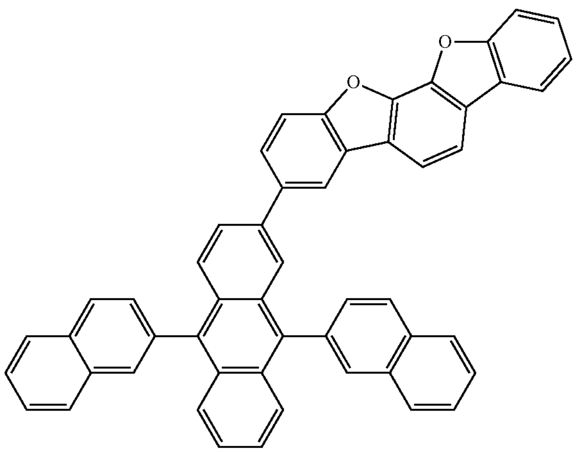
H106
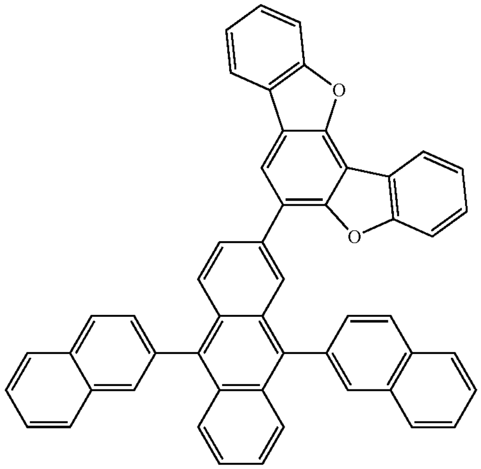
H107
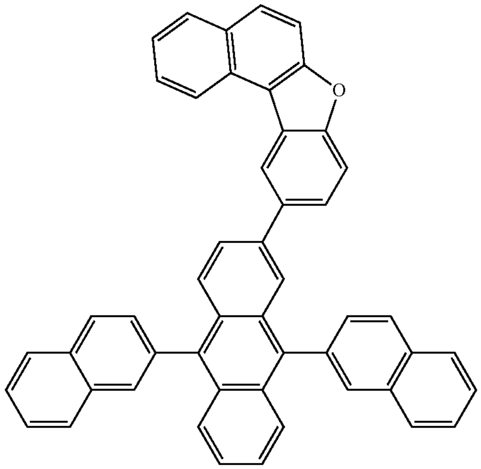
-continued
H108
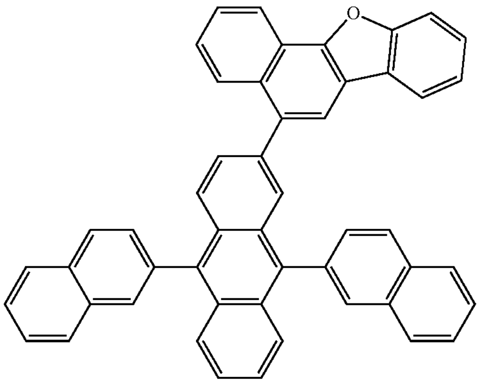
H109
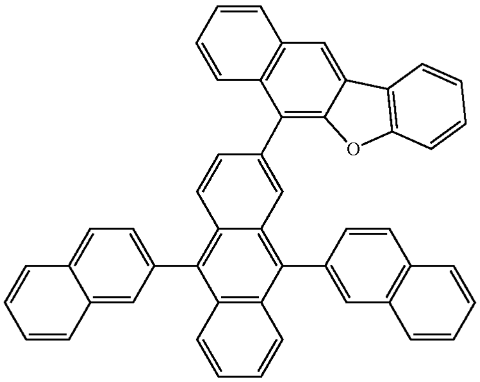
H110
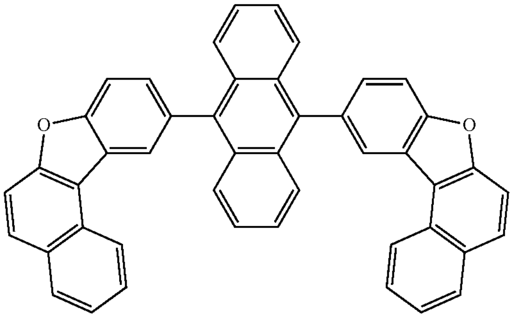
H111
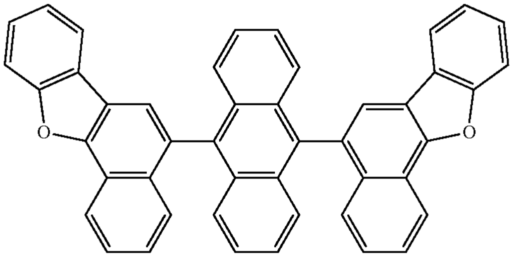

-continued
H112
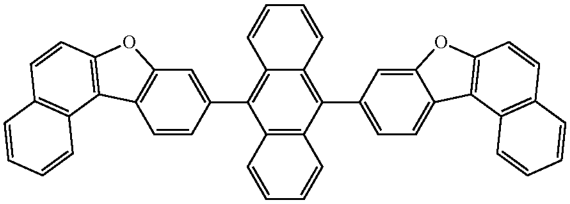
H113
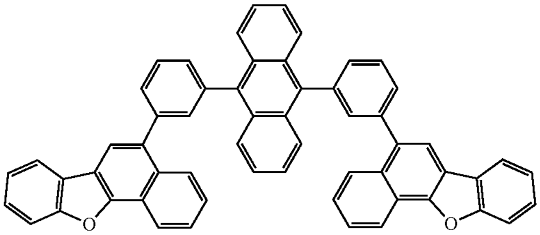
H114
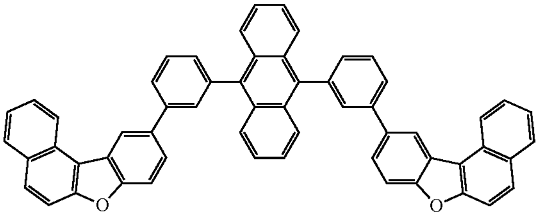
H115
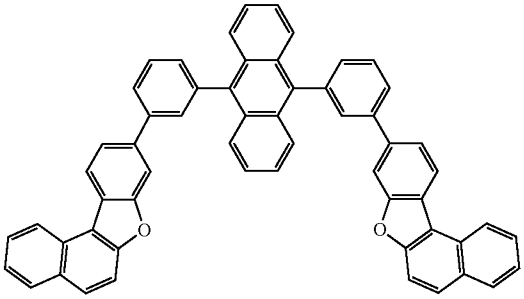
H116
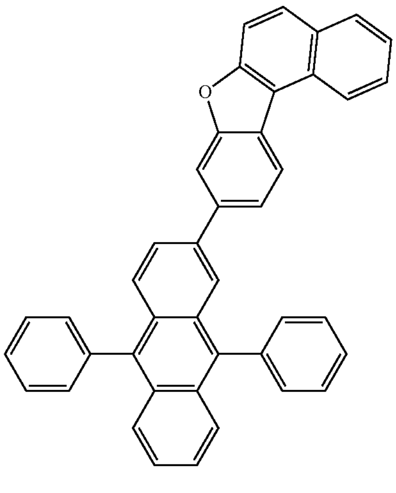
-continued
H117
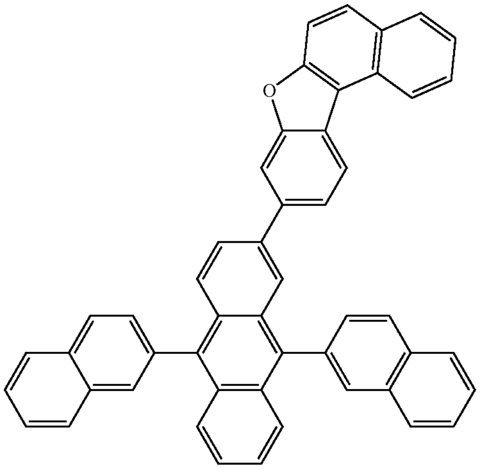
H118
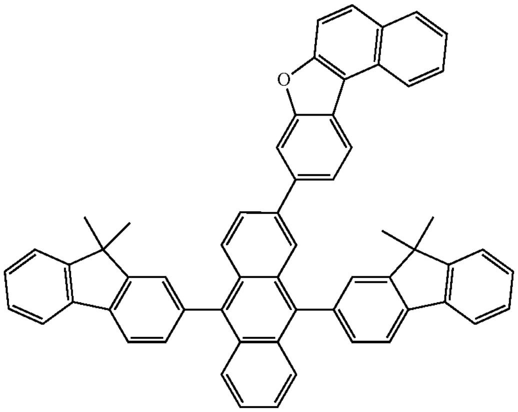
H119
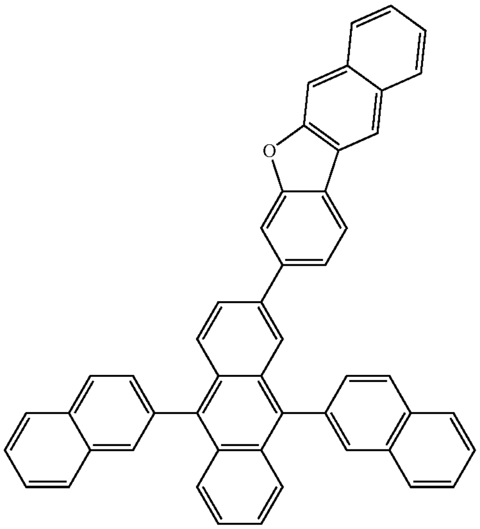

-continued

H120

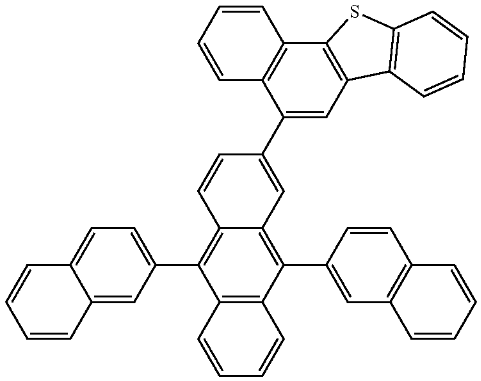

H121

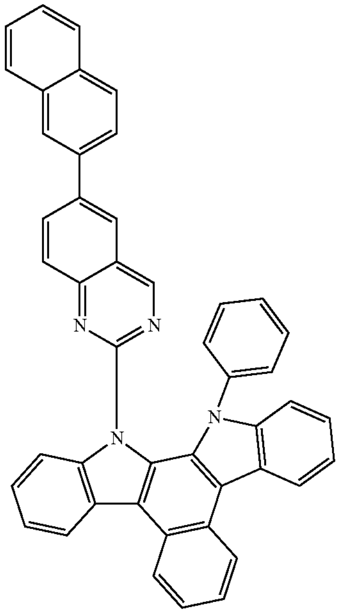

H122

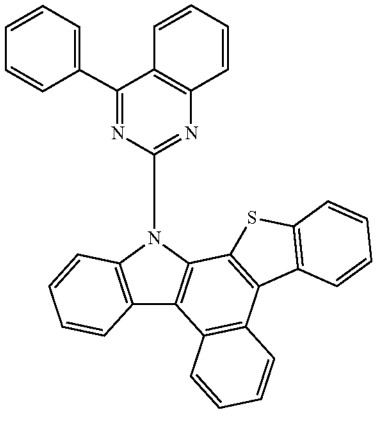

-continued

H123

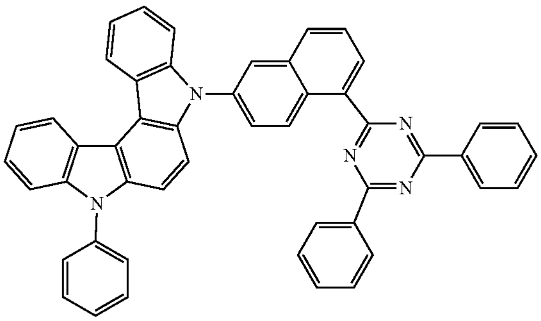

H124

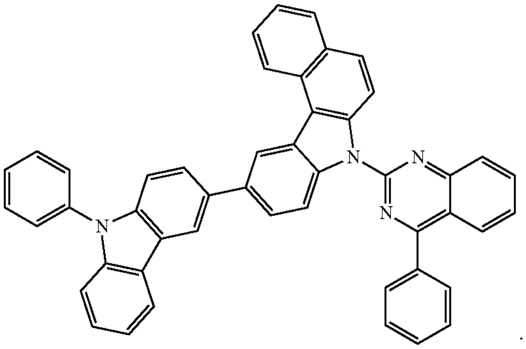

.

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

Formula 401

$$M(L_{401})_{xc1}(L_{402})_{xc2}$$

Formula 402

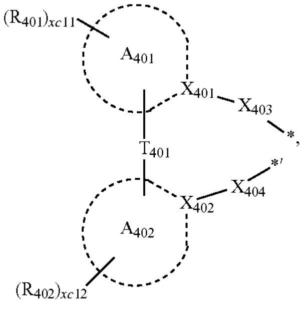

wherein, in Formulae 401 and 402,

M may be a transition metal (for example, iridium (Ir), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 is 1, 2, or 3, wherein, when xc1 is 2 or more, two or more of $L_{401}$ may be identical to or different from each other, $L_{402}$ may be an organic ligand, and xc2 may be 0, 1, 2, 3, or 4, wherein, when xc2 is 2 or more, two or more of $L_{402}$ may be identical to or different from each other, $X_{401}$ and $X_{402}$ may each independently be nitrogen or carbon, rings $A_{401}$ and $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordination (or coordinate) bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer of 0 to 10, and

* and *' in Formula 402 each indicate a binding site to M in Formula 401.

For example, in Formula 402, i) $X_{401}$ may be nitrogen and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group. $T_{402}$ and $T_{403}$ may each independently be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

The phosphorescent dopant may include, for example, one of compounds PD8 to PD25, or any combination thereof:

PD8

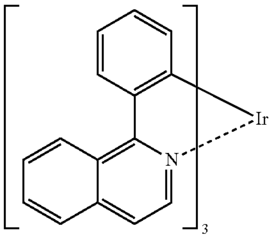

-continued

PD9

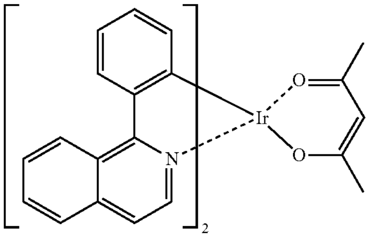

PD10

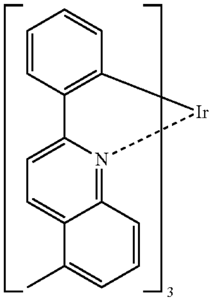

PD11

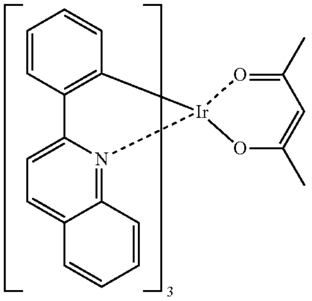

PD12

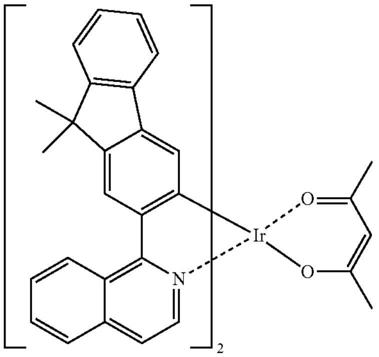

PD13

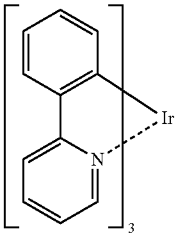

-continued
PD14
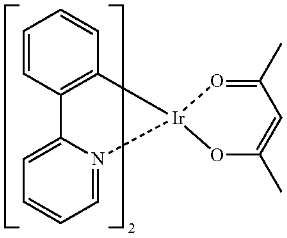
PD15
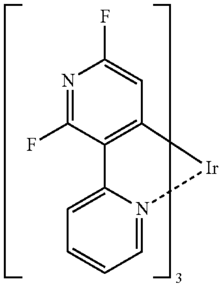
PD16
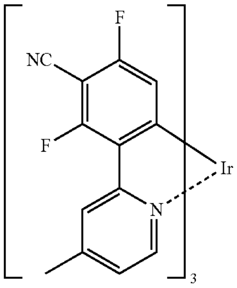
PD17
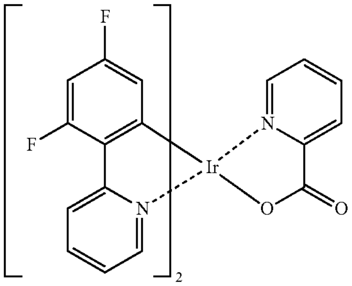
PD18
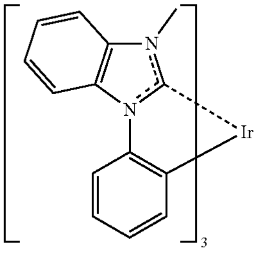
-continued
PD19
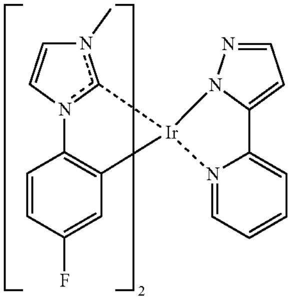
PD20
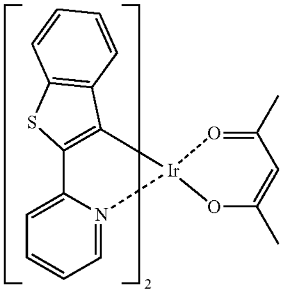
PD21
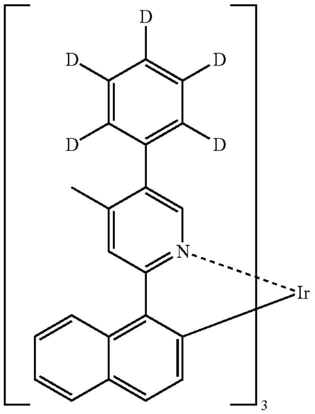
PD22
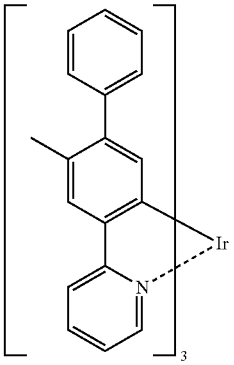

-continued

PD23

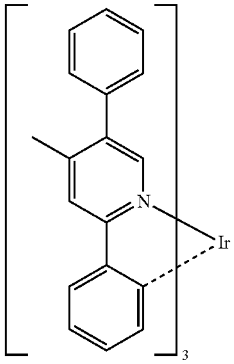

PD24

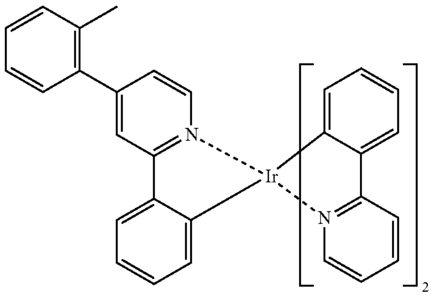

PD25

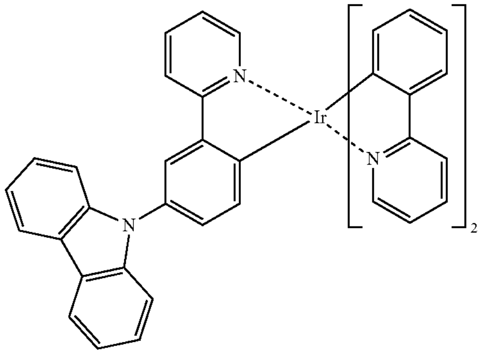

[Fluorescent Dopant]

The fluorescent dopant may include an amine group-containing compound, a styryl group-containing compound, or any combination thereof.

For example, the fluorescent dopant may include a compound represented by Formula 501:

Formula 501

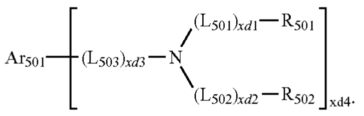

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, a pyrene group, etc.) in which three or more monocyclic groups are condensed together.

In one or more embodiments, xd4 in Formula 501 may be 2.

For example, the fluorescent dopant may include: one or more of Compounds FD1 to FD36; DPVBi; DPAVBi; or any combination thereof:

FD1

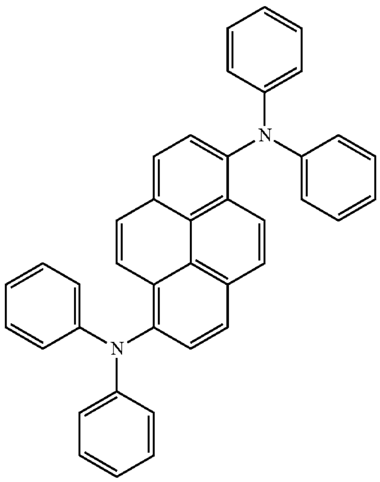

FD2

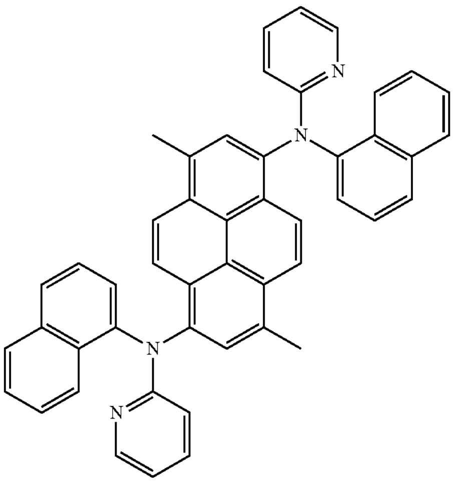

-continued
FD3
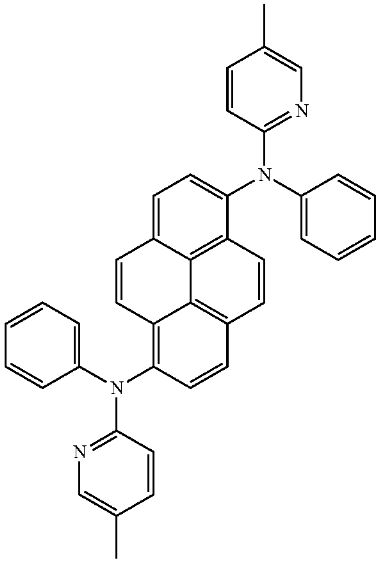
FD4
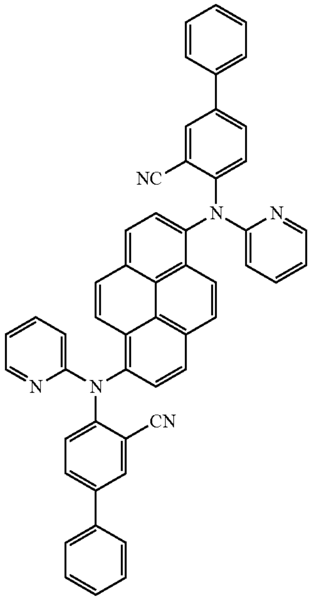
FD5
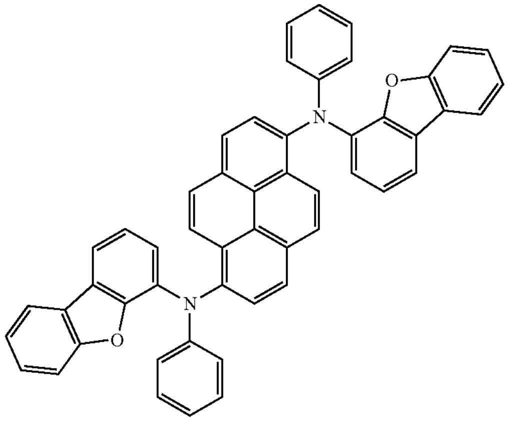
FD6
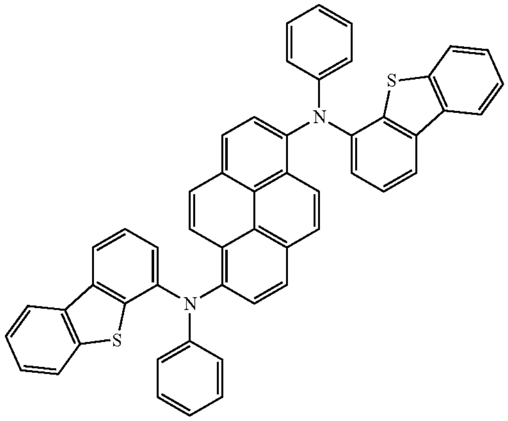
FD7
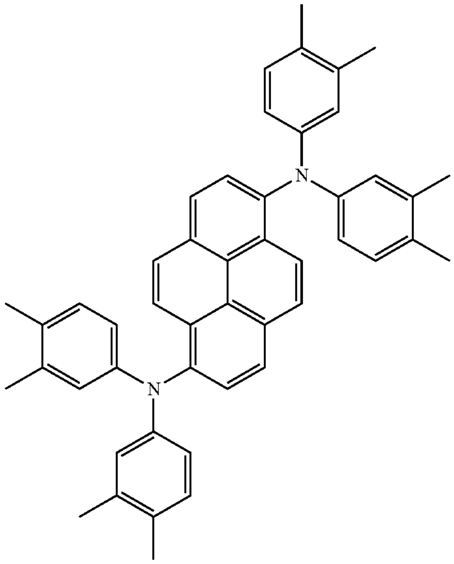
FD8
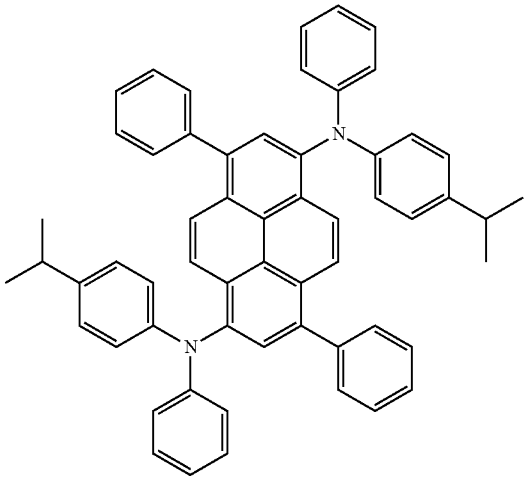

-continued
FD9
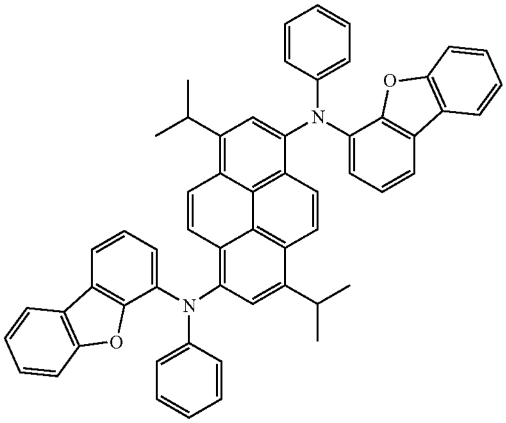
FD10
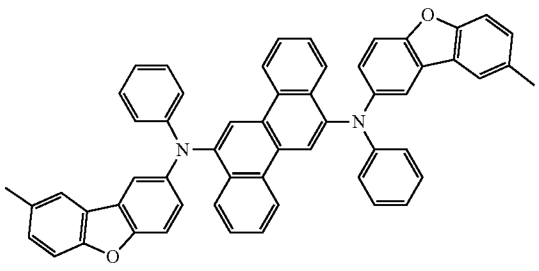
FD11
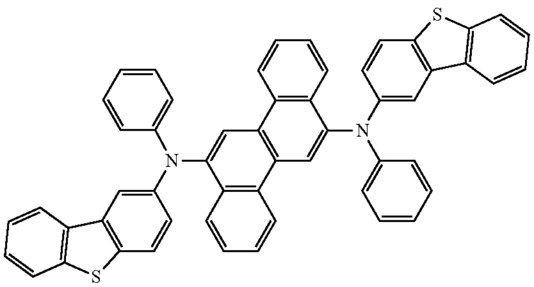
FD12
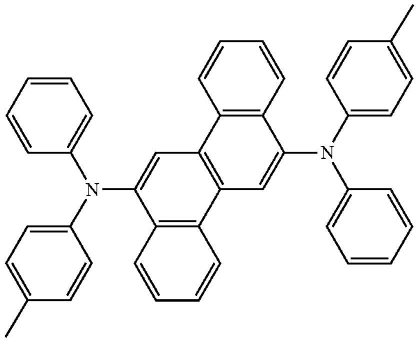
FD13
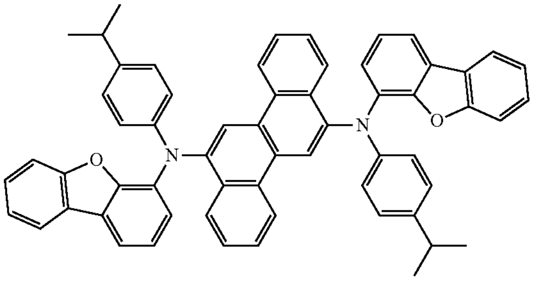
FD14
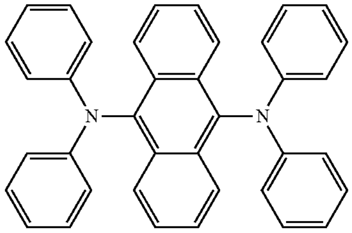
FD15
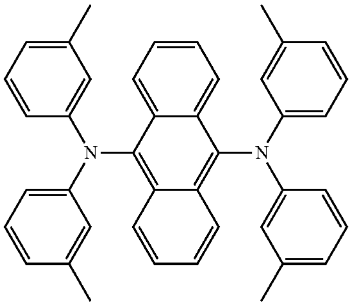
FD16
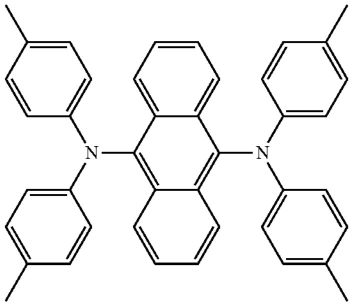

-continued
FD17
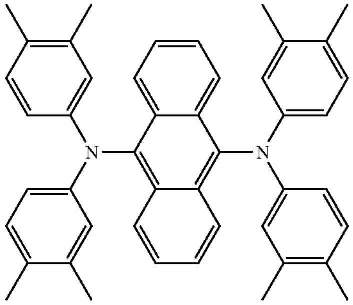
FD18
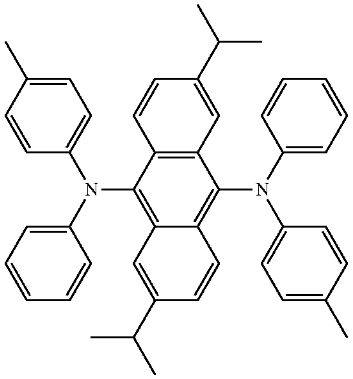
FD19
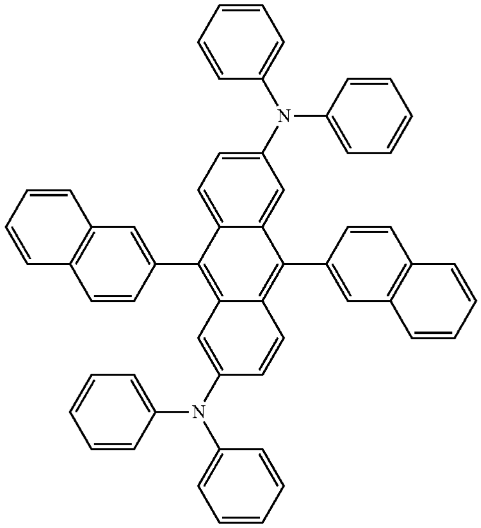
FD20
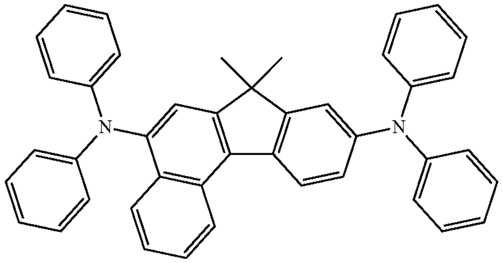
FD21
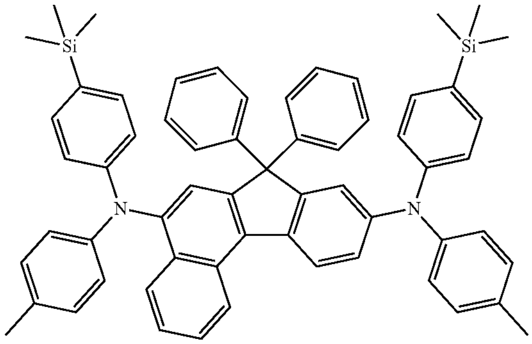
FD22
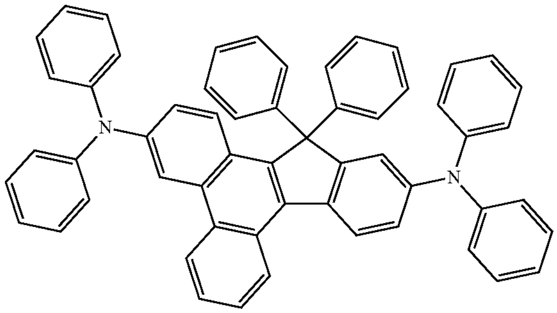
FD23
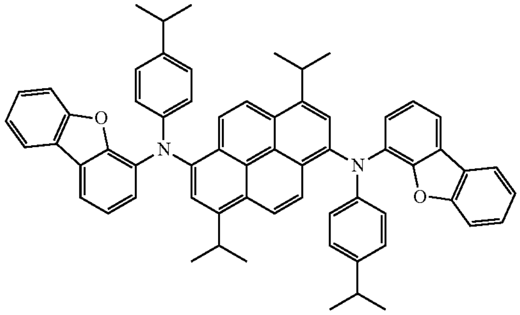
FD24
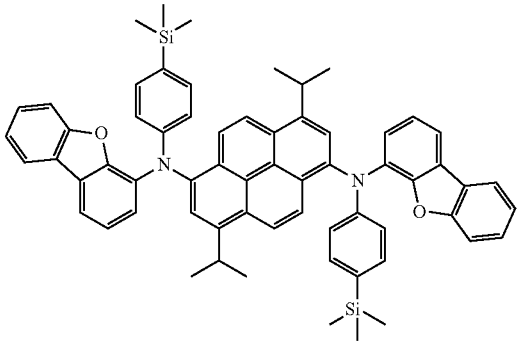

-continued
FD25
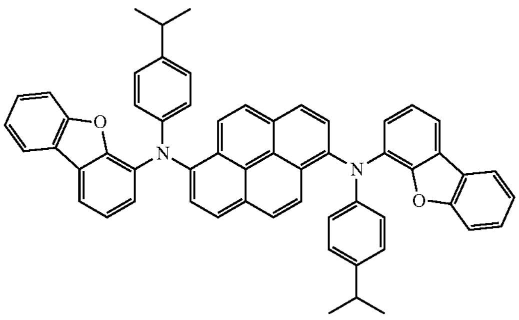
FD26
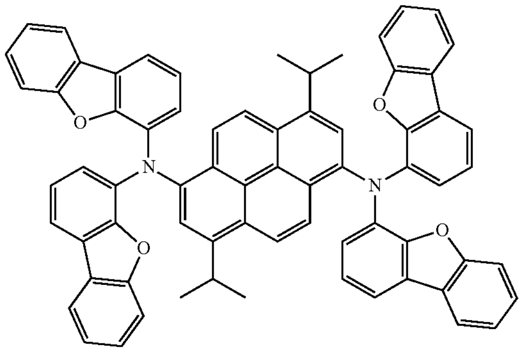
FD27
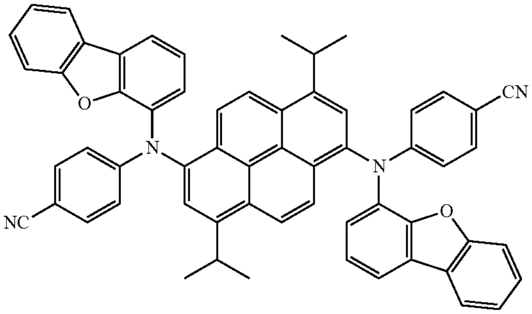
FD28
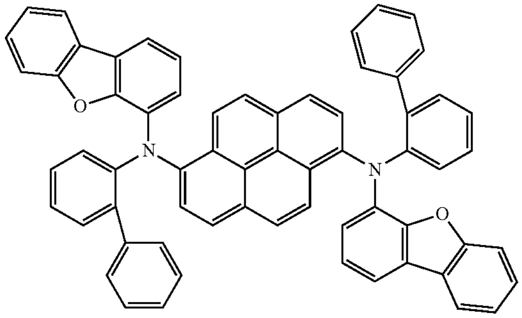
FD29
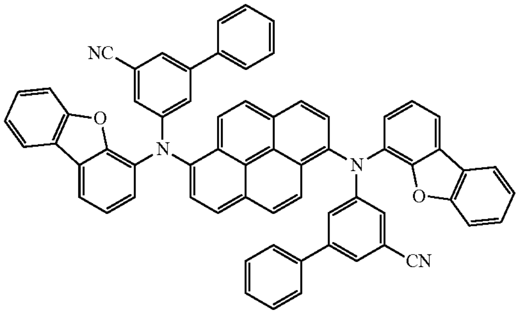
FD30
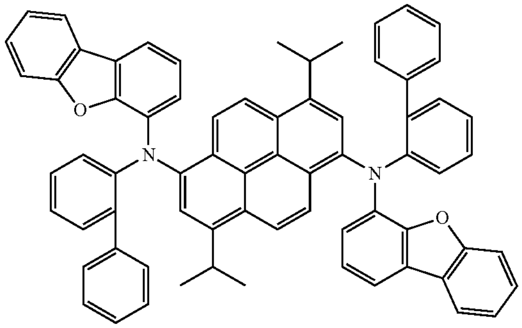
FD31
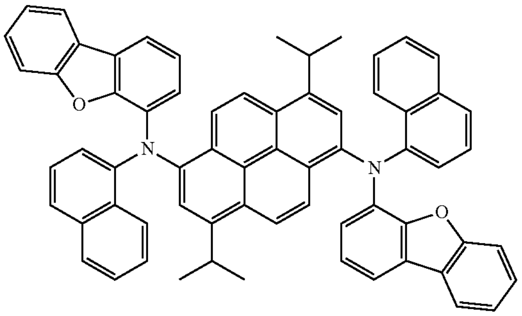
FD32
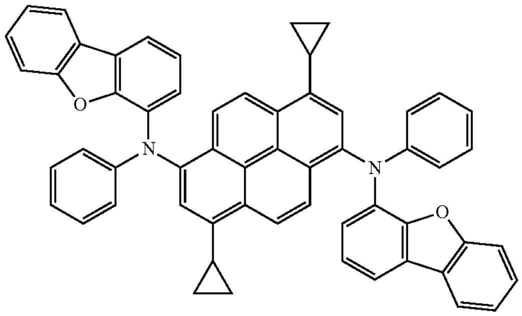

-continued

FD33

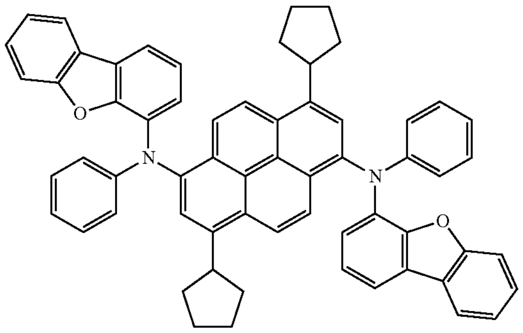

FD34

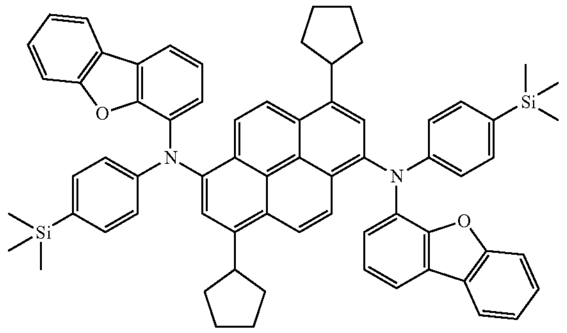

FD35

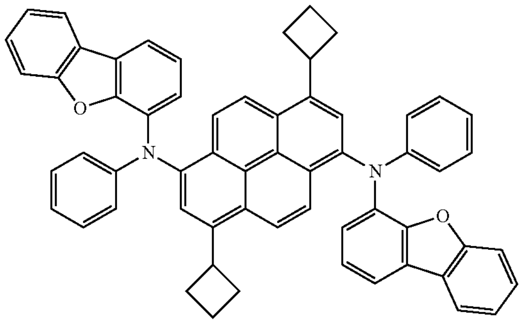

FD36

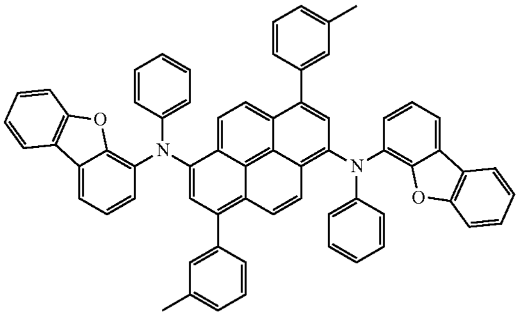

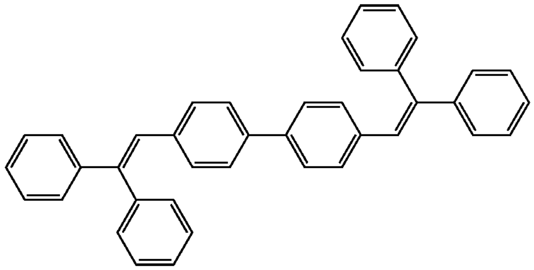

DPVBi

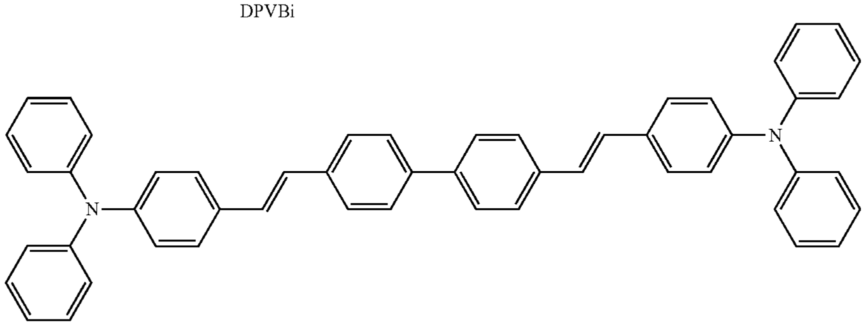

DPAVBi

.

[Delayed Fluorescence Material]

The emission layer may include a delayed fluorescence material.

In the present specification, the delayed fluorescence material may be selected from compounds capable of emitting delayed fluorescence based on a delayed fluorescence emission mechanism.

The delayed fluorescence material included in the emission layer may act as a host or a dopant depending on the type or kind of other materials included in the emission layer.

In one or more embodiments, a difference between a triplet energy level (eV) of the delayed fluorescence material and the singlet energy level (eV) of the delayed fluorescence material may be 0 eV or more and 0.5 eV or less. When the difference between the triplet energy level (eV) of the delayed fluorescence material and the singlet energy level (eV) of the delayed fluorescence material is satisfied within the range above, up-conversion from the triplet state to the singlet state of the delayed fluorescence materials may effectively or suitably occur, and thus, the light-emitting device 10 may have improved luminescence efficiency.

For example, the delayed fluorescence material may include: i) a material including at least one electron donor (for example, a π electron-rich $C_3$-$C_{60}$ cyclic group and/or the like, such as a carbazole group) and at least one electron acceptor (for example, a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other while sharing boron (B), and/or the like.

Examples of the delayed fluorescence material may include at least one of Compounds DF1 to DF9:

DF1

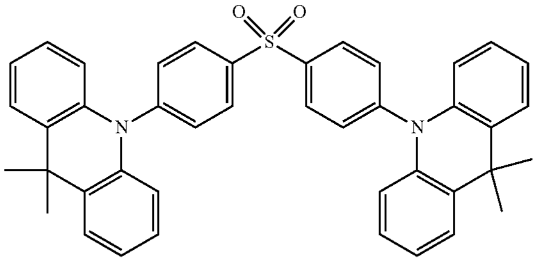

(DMAC-DPS)

DF2

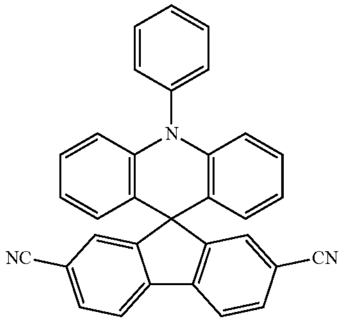

(ACRFLCN)

DF3

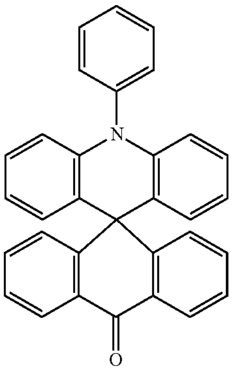

(ACRSA)

-continued

DF4

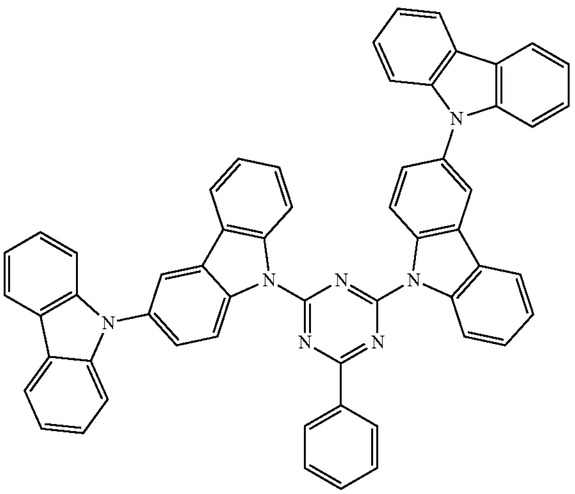

(CC2TA)

DF5

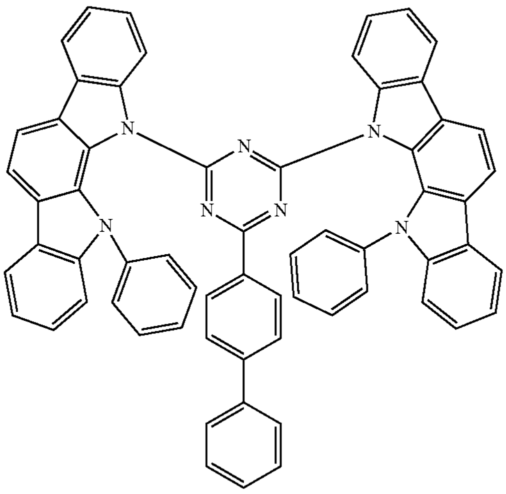

(PIC-TRZ)

DF6

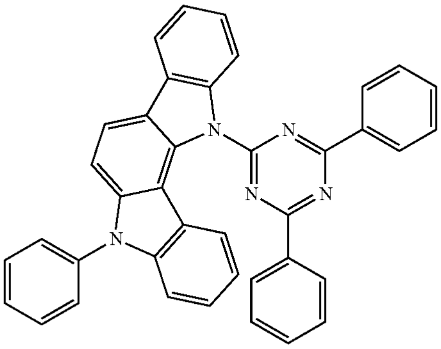

(PIC-TRZ2)

-continued

DF7

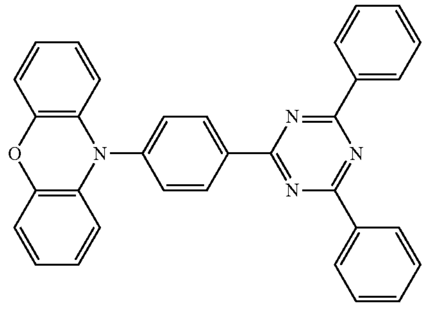

(PXZ-TRZ)

DF8

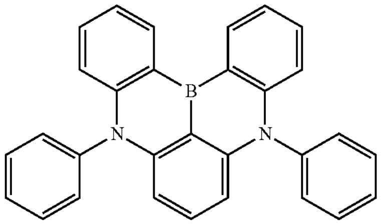

(DABNA-1)

DF9

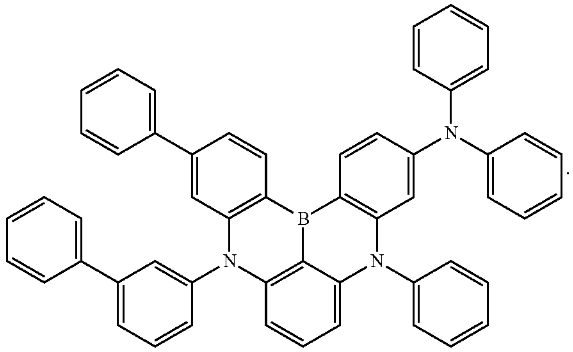

(DABNA-2)

[Quantum Dot]

The emission layer may include a quantum dot.

The term "quantum dot" as utilized herein refers to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any suitable process similar thereto.

The wet chemical process is a method including mixing a precursor material with an organic solvent and then growing quantum dot particle crystals. When the crystal grows, the organic solvent naturally acts as a dispersant coordinated on the surface of the quantum dot crystal and controls the growth of the crystal so that the growth of quantum dot particles can be suitably controlled or selected through a process which costs lower, and is relatively easier than vapor deposition methods, such as metal organic chemical vapor deposition (MOCVD) and/or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; and any combination thereof.

Examples of the Group III-V semiconductor compound may include: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; and any combination thereof. In one or more embodiments, the Group III-V semiconductor compound may further include a Group II element. Examples of the Group III-V semiconductor compound further including the Group II element may include InZnP, InGaZnP, InAlZnP, and the like.

Examples of the Group III-VI semiconductor compound may include: a binary compound, such as GaS, GaSe, $Ga_2Se_3$, GaTe, InS, InSe, $In_2S_3$, $In_2Se_3$, InTe, and/or the like; a ternary compound, such as $InGaS_3$, $InGaSe_3$, and/or the like; and any combination thereof.

Examples of the Group I-III-VI semiconductor compound may include: a ternary compound, such as AgInS, $AgInS_2$, CuInS, $CuInS_2$, $CuGaO_2$, $AgGaO_2$, $AgAlO_2$, and/or the like; and any combination thereof.

Examples of the Group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; and any combination thereof.

Examples of the Group IV element or compound may include: a single element compound, such as Si, Ge, and/or the like; a binary compound, such as SiC, SiGe, and/or the like; and any combination thereof.

Each element included in a multi-element compound, such as the binary compound, the ternary compound, and/or the quaternary compound, may be present at a substantially uniform concentration or non-substantially uniform concentration in a particle.

In one or more embodiments, the quantum dot may have a single structure in which the concentration of each element in the quantum dot is substantially uniform, or may have a core-shell dual structure. For example, a material included in the core and a material included in the shell may be different from each other.

The shell of the quantum dot may act as a protective layer which prevents or reduces chemical denaturation of the core to maintain semiconductor characteristics, and/or as a charging layer which impart electrophoretic characteristics to the quantum dot. The shell may be a single layer or a multilayer. The interface between the core and the shell may have a concentration gradient in which the concentration of an element existing in the shell decreases toward the center of the core.

Examples of the shell of the quantum dot may include an oxide of metal, an oxide of metalloid, and an oxide of non-metal, a semiconductor compound, and combinations thereof. Examples of the oxide of metal, oxide of metalloid, and oxide of non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; a ternary compound, such as $MgAl_2O_4$, $CoFe_2O_4$, $NiFe_2O_4$, $CoMn_2)_4$, and/or the like; and any combination thereof. Examples of the semiconductor compound may include: as described herein, a Group II-VI semiconductor compound; a Group III-V semiconductor compound; a Group III-VI semiconductor compound; a Group I-III-VI semiconductor compound; a Group IV-VI semiconductor compound; and any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and any combination thereof.

The quantum dot may have a full width of half maximum (FWHM) of the emission wavelength spectrum of about 45 nm or less, about 40 nm or less, or for example, about 30 nm or less. When the FWHM of the quantum dot is within these ranges, the quantum dot may have improved color purity and/or color reproducibility. In some embodiments, because light emitted through the quantum dot is emitted in all directions, the wide viewing angle may be improved.

In some embodiments, the quantum dot may be in the form of spherical, pyramidal, multi-arm, and/or cubic nanoparticles, nanotubes, nanowires, nanofibers, and/or nanoplate particles.

Because the energy band gap may be adjusted by controlling the size of the quantum dot, light having one or more suitable wavelength bands may be obtained from the quantum dot emission layer. Accordingly, by utilizing quantum dot of different sizes, a light-emitting device that emits light of one or more suitable wavelengths may be implemented. In one or more embodiments, the size of the quantum dot may be selected to emit red, green and/or blue light. In some embodiments, the size of the quantum dot may be configured to emit white light by combination of light of one or more suitable colors.

[Electron Transport Region in Interlayer 130]

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituent layers of each structure are sequentially stacked from the emission layer.

In one or more embodiments, the electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

For example, the electron transport region may include a compound represented by Formula 601:

Formula 601

$$[Ar_{601}]_{xe11}—[(L_{601})_{xe1}—R_{601}]_{xe21},$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{601})(Q_{602})(Q_{603})$, $—C(=O)(Q_{601})$, $—S(=O)_2(Q_{601})$, or $—P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, or $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$ may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

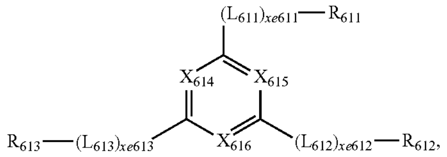

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one or more of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:
ET1
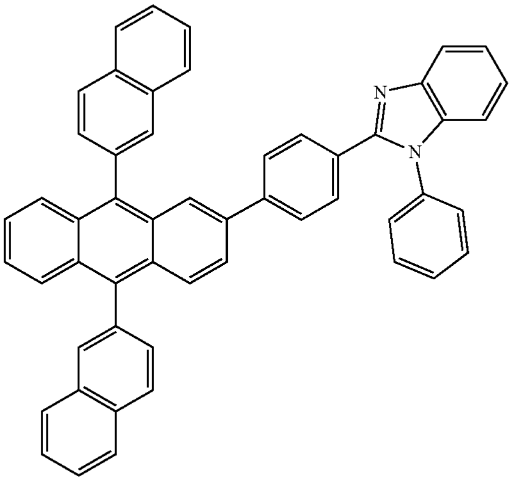
ET2
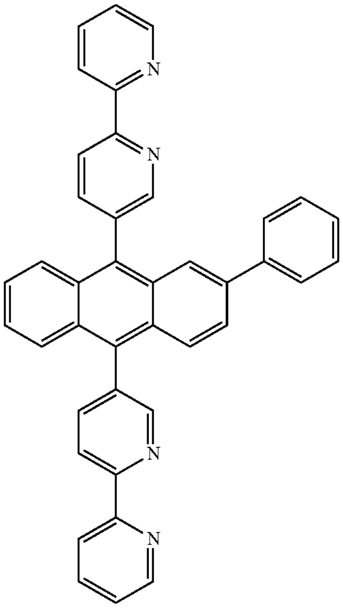
-continued
ET3
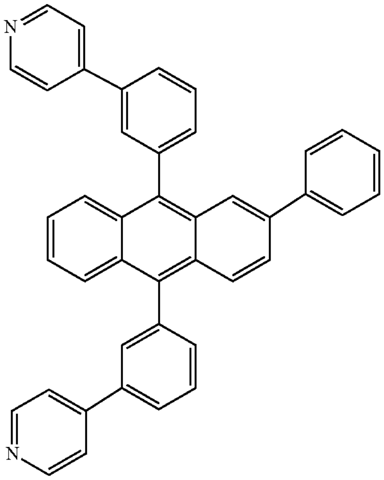
ET4
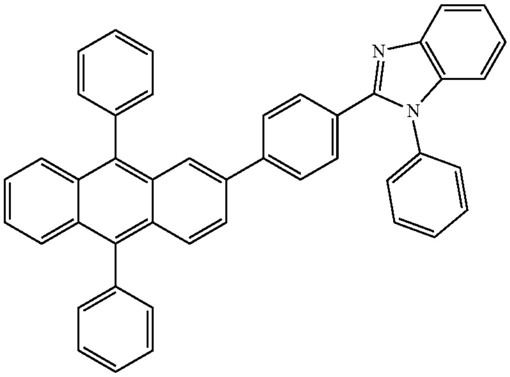
ET5
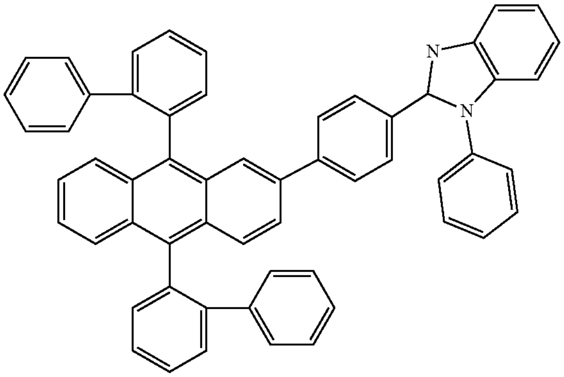

-continued
ET6
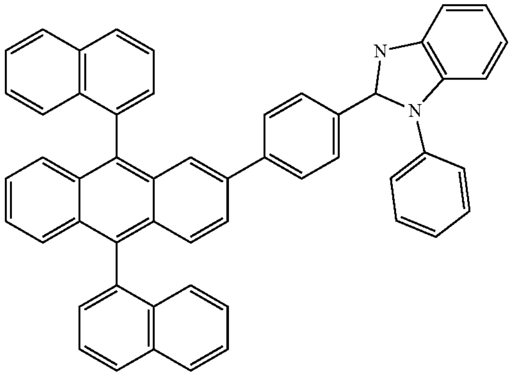
ET7
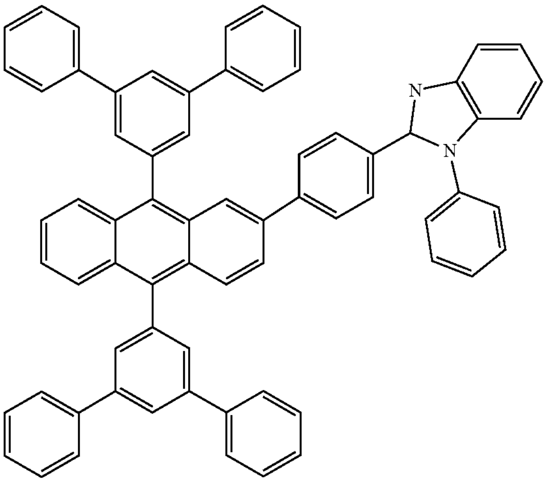
ET8
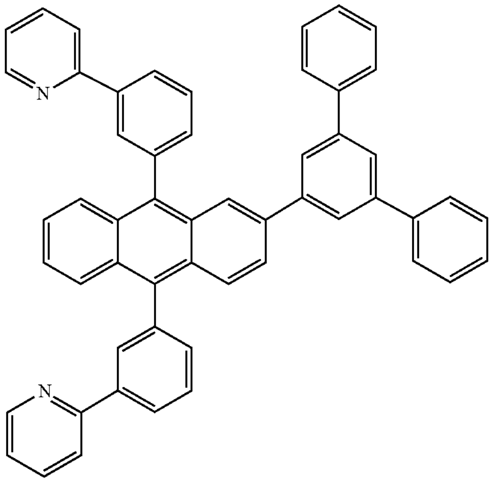
-continued
ET9
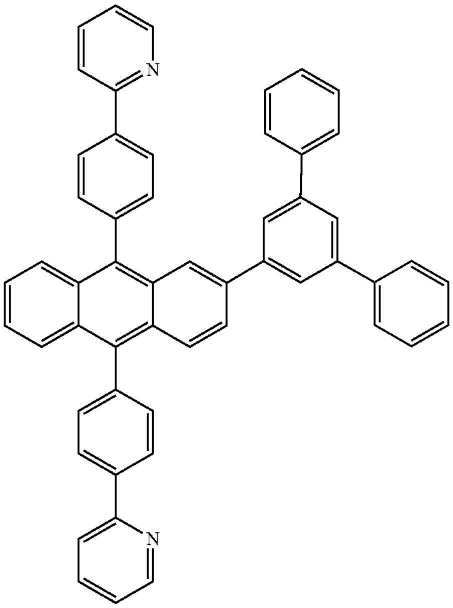
ET10
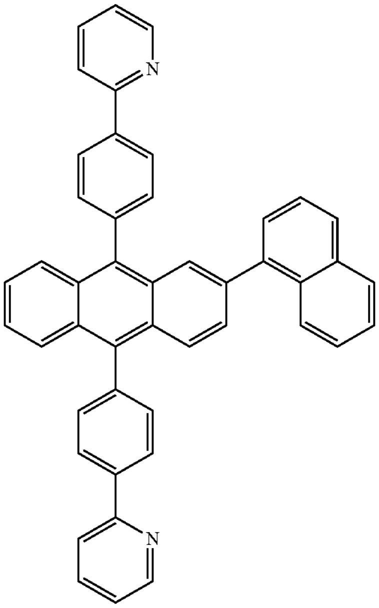

-continued
ET11
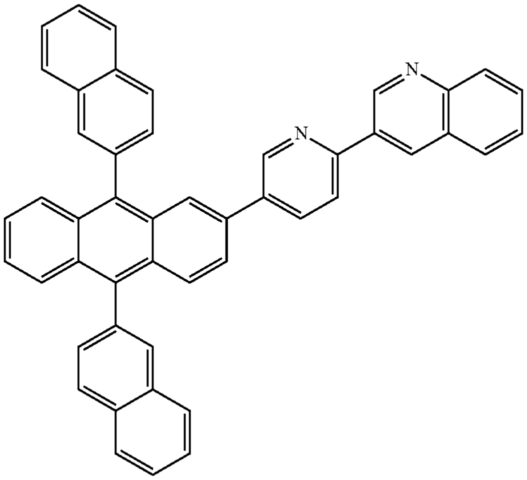
ET12
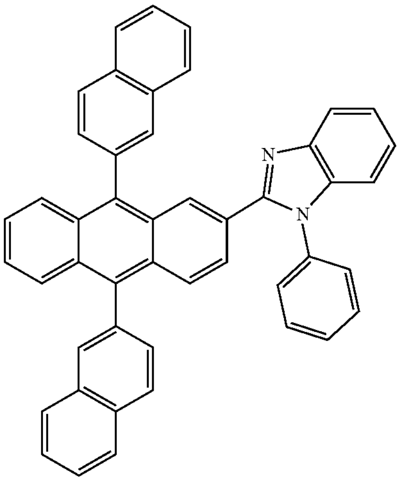
ET13
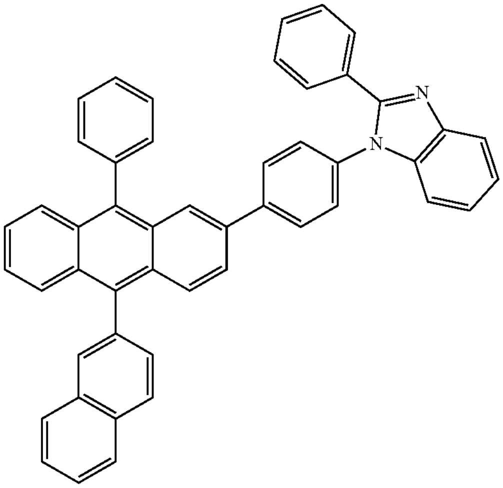
-continued
ET14
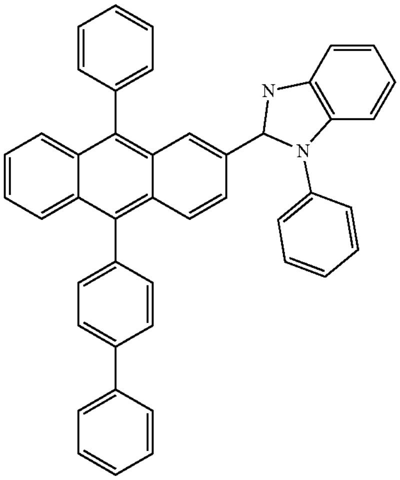
ET15
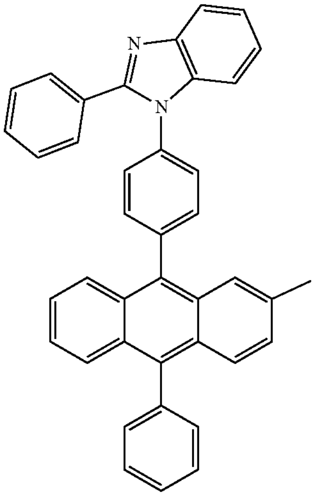
ET16
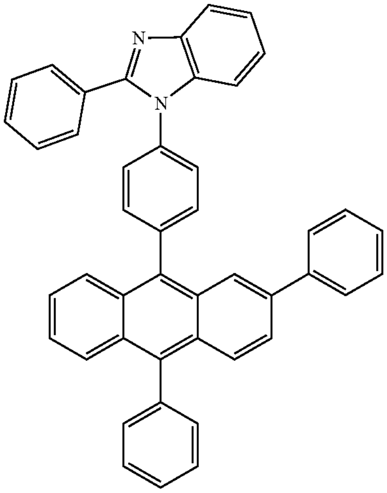

-continued
ET17
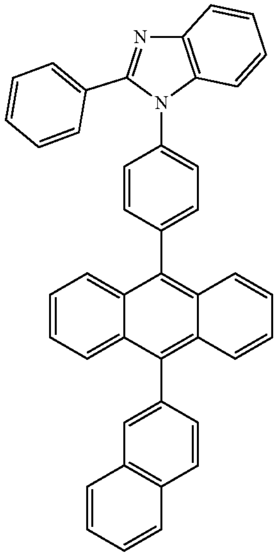
ET18
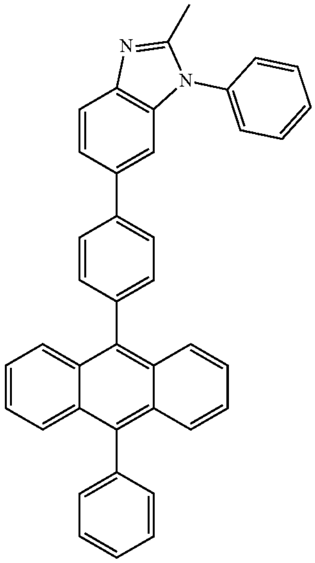
ET19
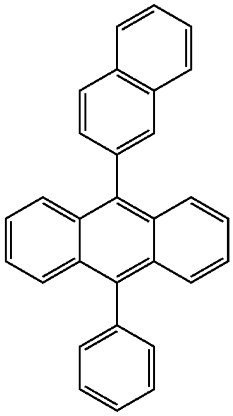
-continued
ET20
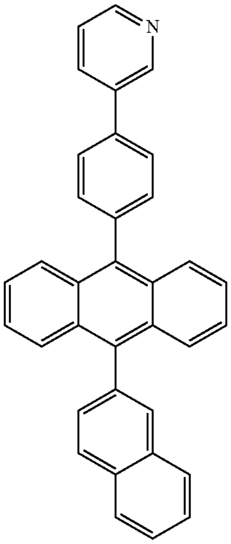
ET21
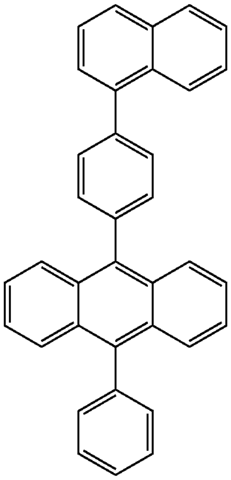
ET22
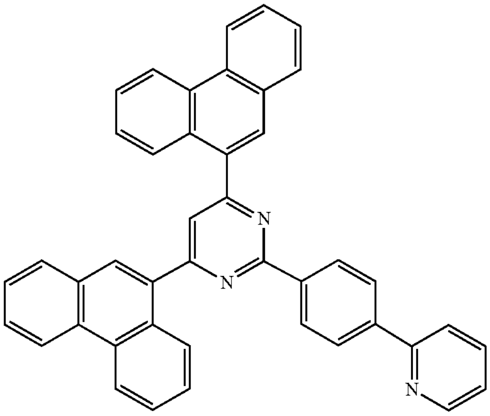

-continued
ET23
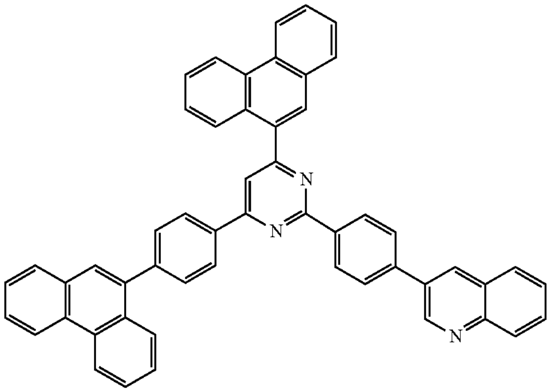
ET24
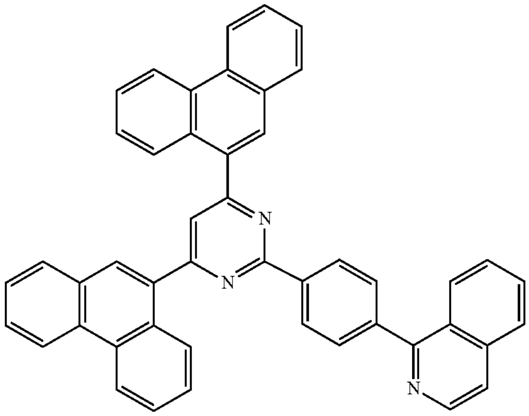
ET25
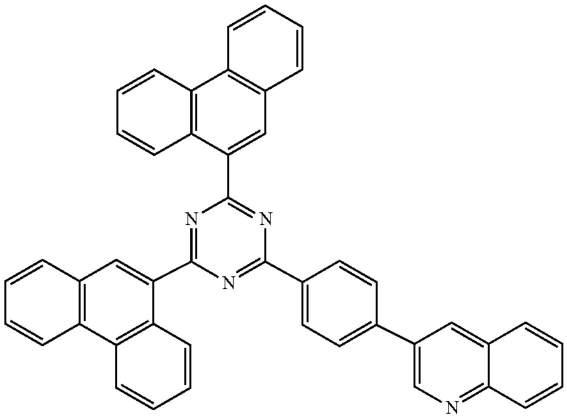
-continued
ET26
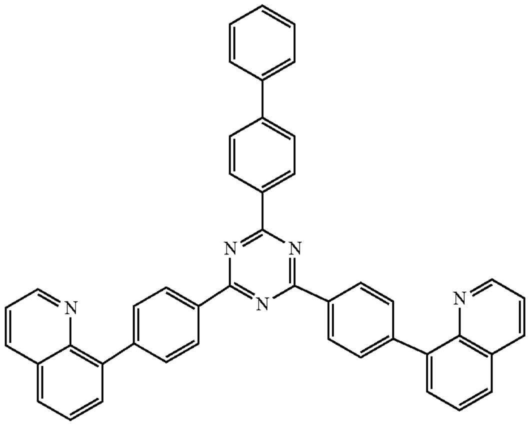
ET27
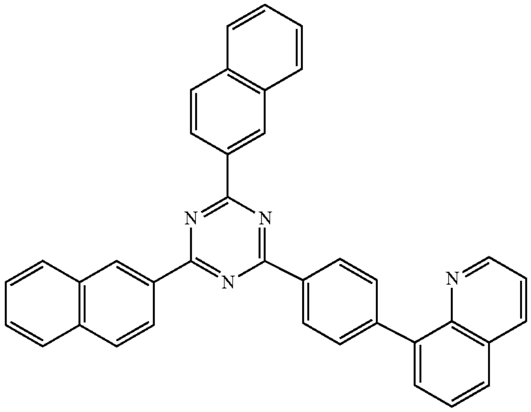
ET28
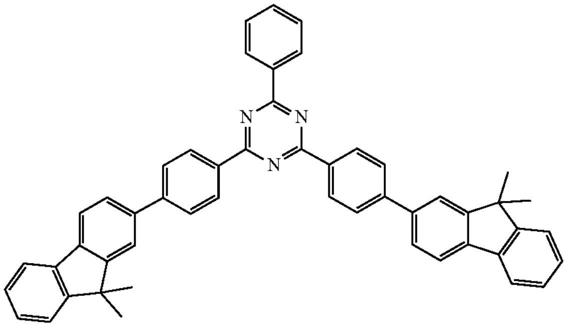

-continued
ET29
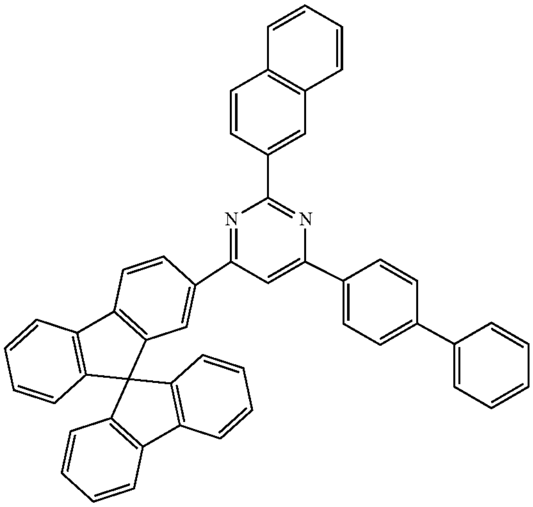
ET30
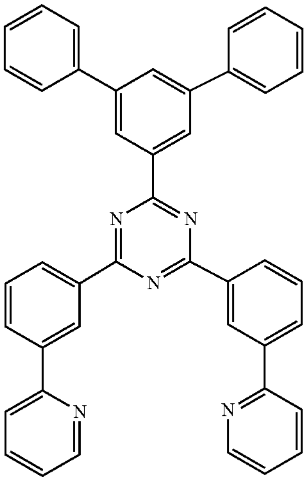
ET31
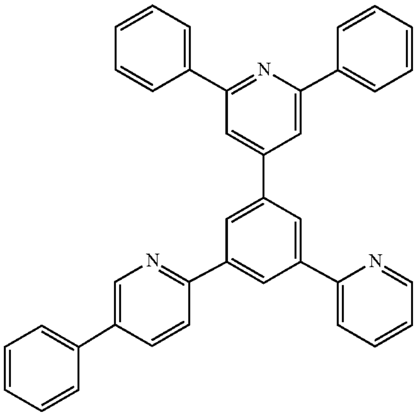
-continued
ET32
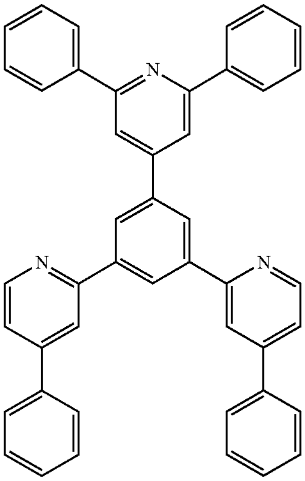
ET33
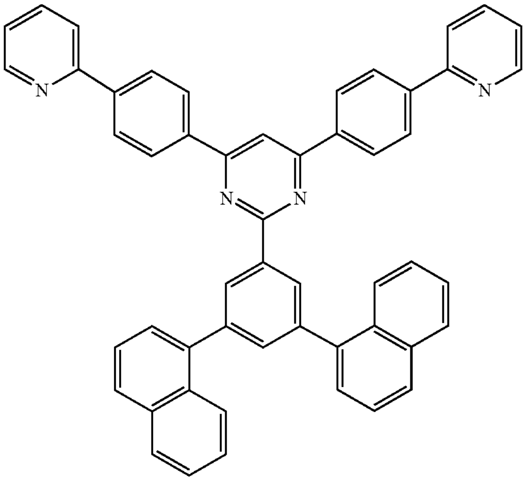
ET34
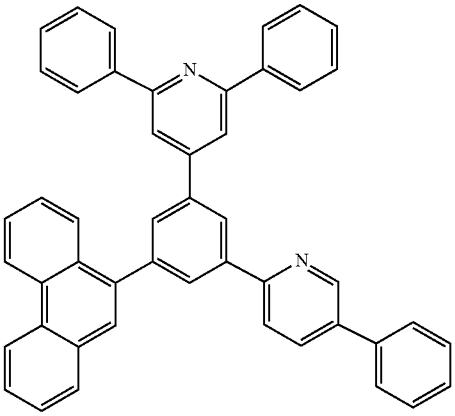

-continued
ET35
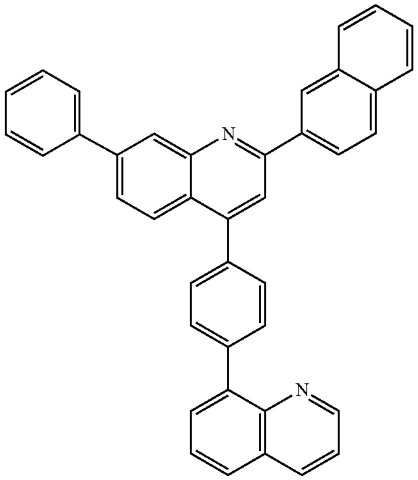
ET36
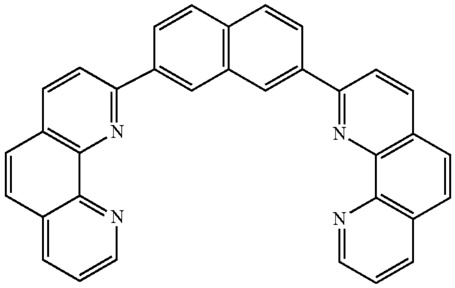
ET37
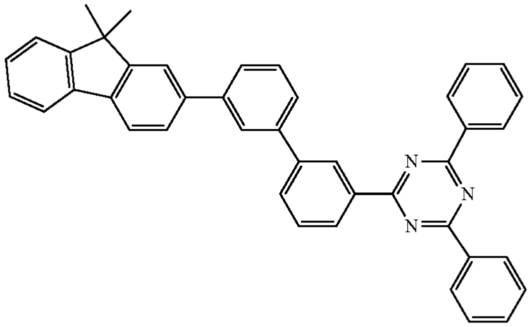
ET38
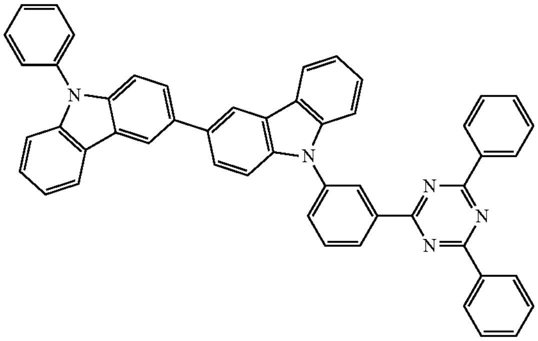
-continued
ET39
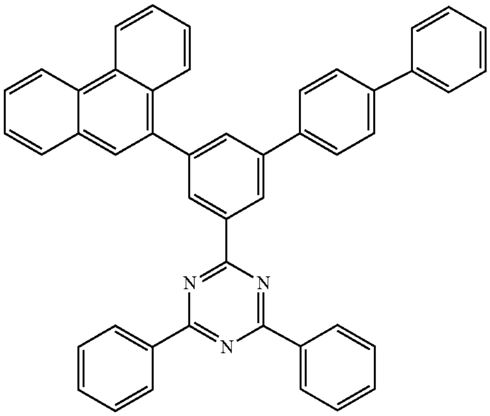
ET40
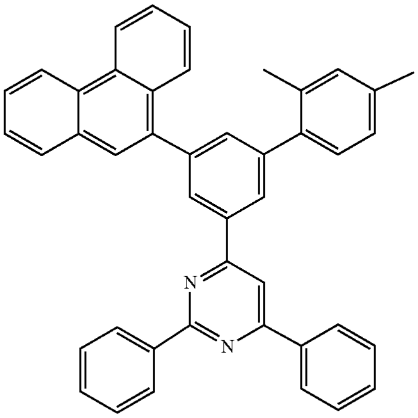
ET41
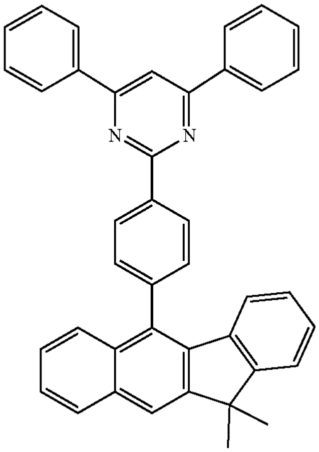

-continued

ET42

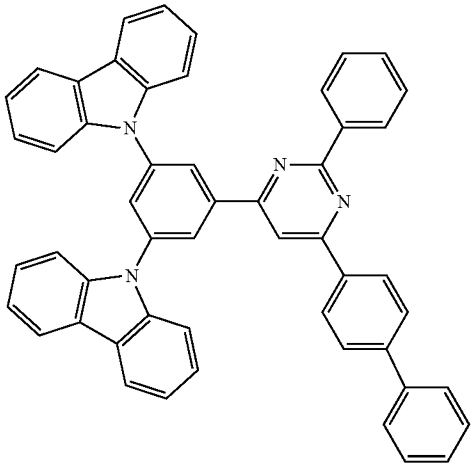

ET43

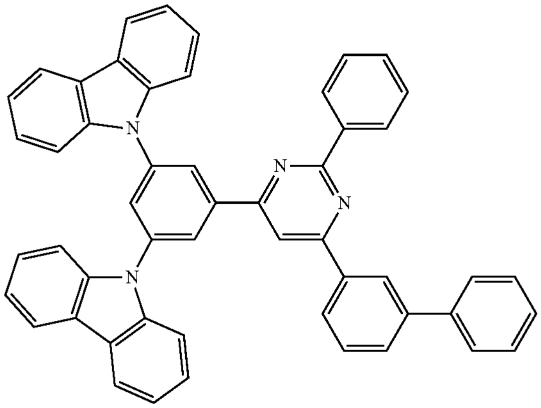

ET44

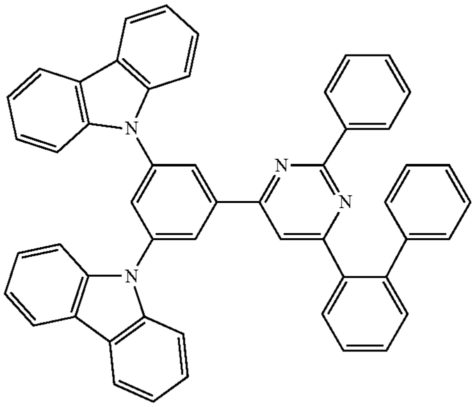

ET45

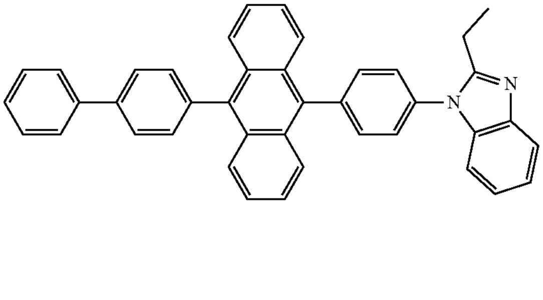

-continued

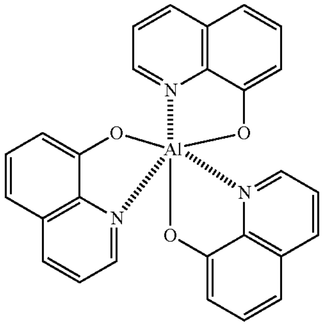

Alq3

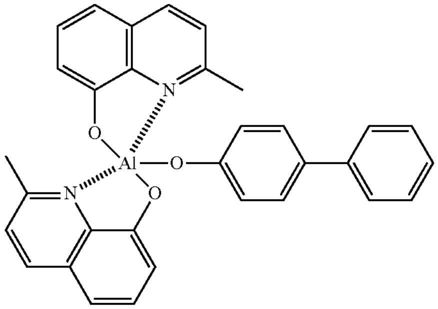

BAlq

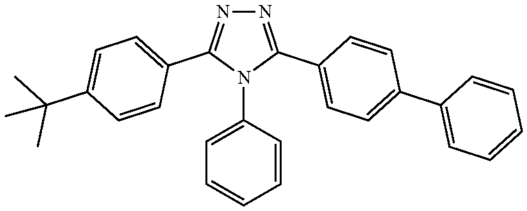

TAZ

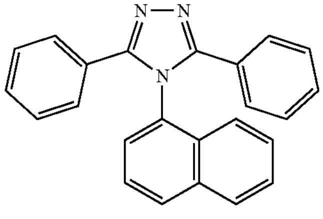

NTAZ .

A thickness of the electron transport region may be in a range of about 100 Å to about 5,000 Å, for example, about 160 Å to about 4,000 Å. When the electron transport region includes a buffer layer, a hole blocking layer, an electron control layer, an electron transport layer, or any combination thereof, a thickness of the buffer layer, the hole blocking layer, and/or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport region are within any of their respective ranges, satisfactory or suitable electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) and/or Compound ET-D2:

ET-D1

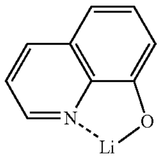

ET-D2

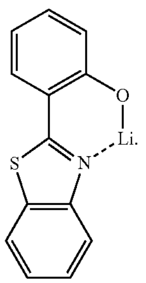

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may each independently be oxides, halides (for example, fluorides, chlorides, bromides, iodides, etc.), and/or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and/or the like; alkali metal halides, such as LiF, NaF, CsF, KF, LiI, NaI, CsI, KI, and/or the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

In one or more embodiments, the electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of) i) an alkali metal-containing compound (for example, alkali metal halide), ii) a) an alkali metal-containing compound (for example, alkali metal halide); and b) an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be substantially uniformly or substantially non-uniformly dispersed in a matrix including the organic material.

A thickness of the electron injection layer may be in a range of about 1 Å to about 100 Å, and, for example, about 3 Å to about 90 Å. When the thickness of the electron injection layer is within any of the ranges above, satisfactory or suitable electron injection characteristics may be obtained without a substantial increase in driving voltage.

[Second Electrode 150]

The second electrode 150 may be arranged on the interlayer 130 having a structure as described above. The second electrode 150 may be a cathode, which is an electron injection electrode, and as a material for forming the second electrode 150, a metal, an alloy, an electrically conductive compound, or any combination thereof, each having a low-work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

[Capping Layer]

A first capping layer may be arranged outside the first electrode 110, and/or a second capping layer may be arranged outside the second electrode 150. For example, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in an emission layer of the interlayer 130 of the light-emitting device 10 may be extracted toward the outside through the first electrode 110 which is a semi-transmissive electrode or a transmissive electrode, and the first capping layer. Light generated in an emission layer of the interlayer 130 of the light-emitting device 10 may be extracted toward the outside through the second electrode 150 which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

The first capping layer and the second capping layer may each independently include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and/or the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and/or the amine group-containing compound may optionally be substituted with a substituent including O, N, S, Se, Si, F, Cl, Br, I, or any combination thereof. In one or more embodiments, at least one of the first capping layer and/or the second capping layer may each independently include an amine group-containing compound.

In one or more embodiments, at least one of the first capping layer and/or the second capping layer may each independently include a compound represented by Formula 201, a compound represented by Formula 202, or any combination thereof.

In one or more embodiments, at least one of the first capping layer and/or the second capping layer may each independently include: one or more of Compounds HT28 to HT33; one or more of Compounds CP1 to CP6; β-NPB; or any combination thereof:

CP1

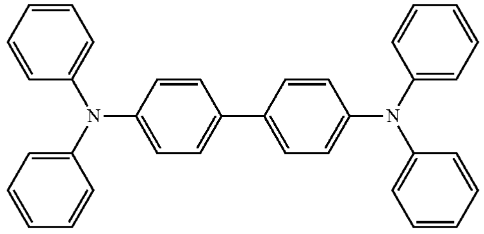

CP2

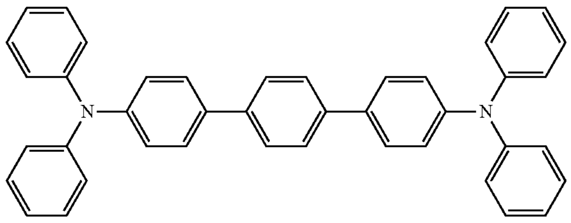

CP3

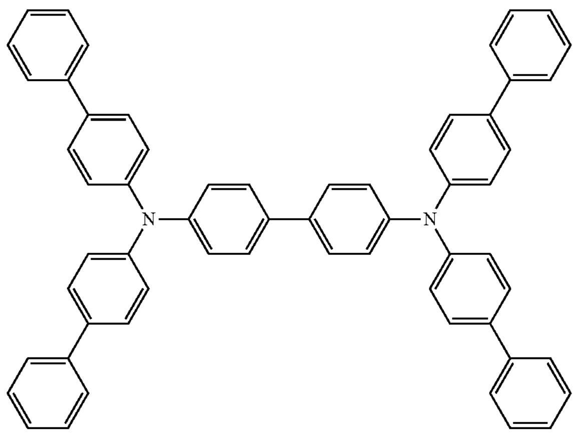

-continued

CP4

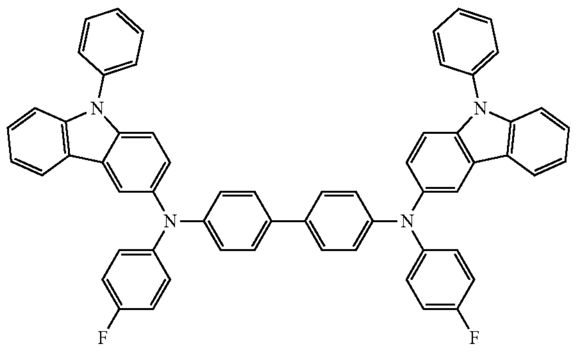

CP5

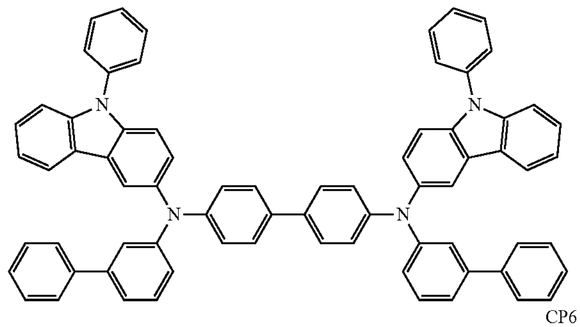

CP6

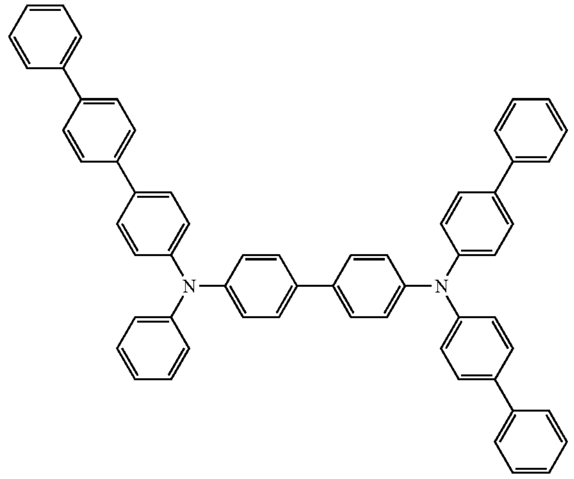

β-NPB

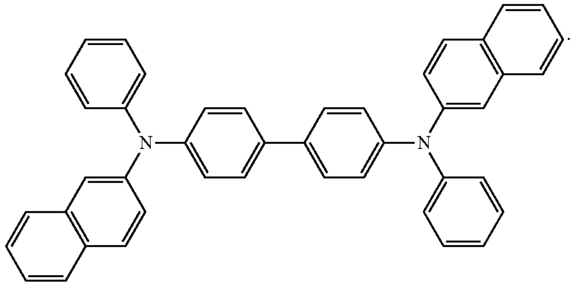

[Film]

The heterocyclic compound represented by Formula 1 may be included in one or more suitable films. Accordingly, another aspect of the present disclosure provides a film including the heterocyclic compound represented by Formula 1. The film may be, for example, an optical member (or a light control means) (for example, a color filter, a color conversion member, a capping layer, a light extraction efficiency enhancement layer, a selective light absorbing layer, a polarizing layer, a quantum dot-containing layer, and/or like), a light-blocking member (for example, a light reflective layer, a light absorbing layer, and/or the like), and/or a protective member (for example, an insulating layer, a dielectric layer, and/or the like).

[Electronic Apparatus]

The light-emitting device may be included in one or more suitable electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be arranged in at least one traveling direction of light emitted from the light-emitting device. For example, the light emitted from the light-emitting device may be blue light or white light. The light-emitting device may be the same as described herein. In one or more embodiments, the color conversion layer may include a quantum dot. The quantum dot may be, for example, the quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be arranged among the subpixel areas to define each of the subpixel areas.

The color filter may further include a plurality of color filter areas and light-shielding patterns arranged among the color filter areas, and the color conversion layer may further include a plurality of color conversion areas and light-shielding patterns arranged among the color conversion areas.

The plurality of color filter areas (or the plurality of color conversion areas) may include a first area emitting (e.g., configured to emit) first color light, a second area emitting (e.g., configured to emit) second color light, and/or a third area emitting (e.g., configured to emit) third color light, wherein the first color light, the second color light, and/or the third color light may have different maximum emission wavelengths from one another. For example, the first color light may be red light, the second color light may be green light, and the third color light may be blue light. For example, the plurality of color filter areas (or the plurality of color conversion areas) may include quantum dots. For example, the first area may include a red quantum dot, the second area may include a green quantum dot, and the third area may not include (e.g., may exclude) a quantum dot. The quantum dot may be the same as described herein. The first area, the second area, and/or the third area may each include a scatter.

For example, the light-emitting device may be to emit first light, the first area may be to absorb the first light to emit first-first color light, the second area may be to absorb the first light to emit second-first color light, and the third area may be to absorb the first light to emit third-first color light. Here, the first-first color light, the second-first color light, and the third-first color light may have different maximum emission wavelengths. For example, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein any one of the source electrode or the drain electrode may be electrically connected to any one of the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be arranged between the light-emitting device and the color filter and/or the color conversion layer. The sealing portion allows light from the light-emitting device to be extracted to the outside, and concurrently (e.g., simultaneously) prevents or reduces penetration of ambient air and/or moisture into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

One or more suitable functional layers may be additionally arranged on the sealing portion, in addition to the color filter and/or the color conversion layer, according to the intended use of the electronic apparatus. Examples of the functional layers may include a touch screen layer, a polarizing layer, and the like. The touch screen layer may be a pressure-sensitive touch screen layer, a capacitive touch screen layer, and/or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device as described above, a biometric information collector.

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, one or more suitable measuring instruments, meters (for example, meters for a vehicle, an aircraft, and/or a vessel), projectors, and/or the like.

Figure 2:
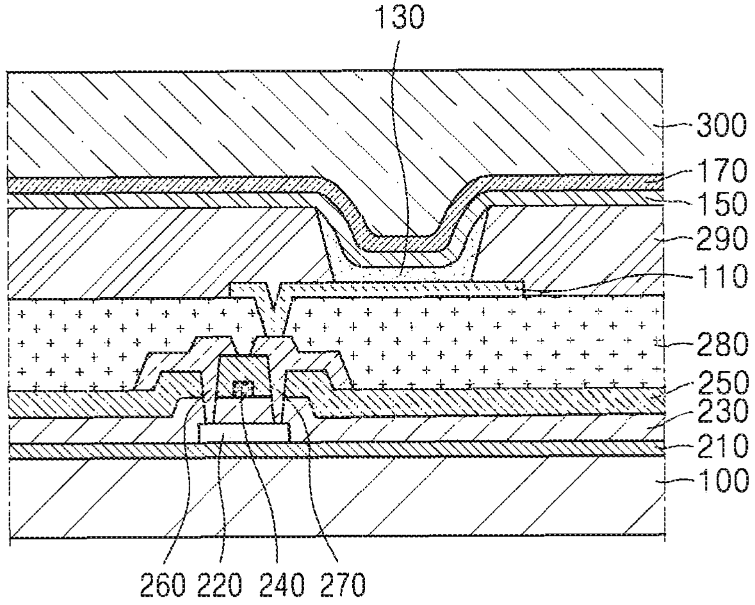
FIG. 2 is a schematic view of an electronic apparatus according to one or more embodiments.
Figure 3:
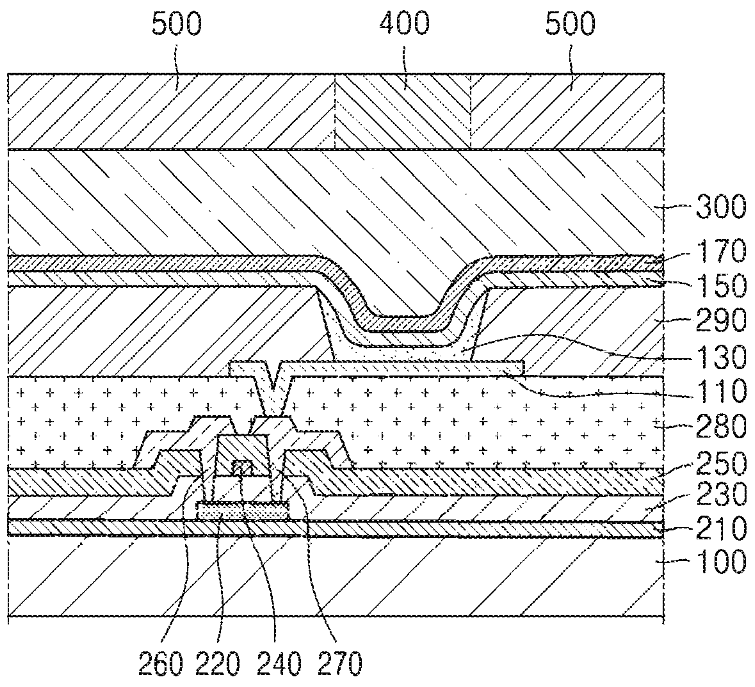
FIG. 3 shows a schematic view of an electronic apparatus according to another embodiment.

[Description of FIGS. 2 and 3]

FIG. 2 is a cross-sectional view showing a light-emitting apparatus according to one or more embodiments of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be arranged on the substrate 100. The buffer layer 210 may prevent or reduce penetration of impurities through the substrate 100 and may provide a substantially flat surface on the substrate 100.

A TFT may be arranged on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region, and a channel region.

A gate insulating film 230 for insulating the activation layer 220 from the gate electrode 240 may be arranged on the activation layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to insulate from one another.

The source electrode 260 and the drain electrode 270 may be arranged on the interlayer insulating film 250. The interlayer insulating film 250 and the gate insulating film 230 may be formed to expose the source region and the drain region of the activation layer 220, and the source electrode 260 and the drain electrode 270 may be arranged in contact with the exposed portions of the source region and the drain region of the activation layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include a first electrode 110, an interlayer 130, and a second electrode 150.

The first electrode 110 may be arranged on the passivation layer 280. The passivation layer 280 may be arranged to expose a portion of the drain electrode 270, not fully covering the drain electrode 270, and the first electrode 110 may be arranged to be connected to the exposed portion of the drain electrode 270.

A pixel defining layer 290 including an insulating material may be arranged on the first electrode 110. The pixel defining layer 290 may expose a certain region of the first electrode 110, and an interlayer 130 may be formed in the exposed region of the first electrode 110. The pixel defining layer 290 may be a polyimide or polyacrylic organic film. In one or more embodiments, at least some layers of the interlayer 130 may extend beyond the upper portion of the pixel defining layer 290 to be arranged in the form of a common layer.

The second electrode 150 may be arranged on the interlayer 130, and a capping layer 170 may be additionally formed on the second electrode 150. The capping layer 170 may be formed to cover the second electrode 150.

The encapsulation portion 300 may be arranged on the capping layer 170. The encapsulation portion 300 may be arranged on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic films and the organic films.

FIG. 3 shows a cross-sectional view showing a light-emitting apparatus according to one or more other embodiments of the present disclosure.

The light-emitting apparatus of FIG. 3 is the same as the light-emitting apparatus of FIG. 2, except that a light-shielding pattern 500 and a functional region 400 are additionally arranged on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

[Manufacturing Method]

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as utilized herein refers to a cyclic group consisting of carbon atoms only as a ring-forming atoms and having three to sixty carbon atoms, and the term "$C_1$-$C_{60}$ heterocyclic group" as utilized herein refers to a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each independently be a monocyclic group consisting of one ring or a polycyclic group in which two or more rings are condensed with each other. For example, the number of ring-forming atoms of the $C_1$-$C_{60}$ heterocyclic group may be from 3 to 61.

The "cyclic group" as utilized herein may include both the $C_3$-$C_{60}$ carbocyclic group and the $C_1$-$C_{60}$ heterocyclic group.

The term "π electron-rich $C_3$-$C_{60}$ cyclic group" as utilized herein refers to a cyclic group that has three to sixty carbon atoms and does not include *—N=*' as a ring-forming moiety, and the term "π electron-deficient nitrogen-containing $C_1$-$C_{60}$ cyclic group" as utilized herein refers to a heterocyclic group that has one to sixty carbon atoms and includes *—N=*' as a ring-forming moiety.

For example, the $C_3$-$C_{60}$ carbocyclic group may be i) a T1 group or ii) a condensed cyclic group in which two or more T1 groups are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like.), the π electron-rich $C_3$-$C_{60}$ cyclic group may be i) a T1 group, ii) a condensed cyclic group in which at least two T1 groups are condensed with each other, iii) a T3 group, iv) a condensed cyclic group in which at least two T3 groups are condensed with each other, or v) a condensed cyclic group in which at least one T3 group and at least one T1 group are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like.), the π electron-deficient nitrogen-containing $C_1$-$C_{60}$ cyclic group may be i) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as utilized herein may refer to a monovalent group, a polyvalent group (for example, a divalent group, a trivalent group, a tetravalent group, etc.), or a group condensed to any cyclic group, according to the structure of a formula for which the corresponding term is utilized. For example, the "benzene group" may be a benzo group (e.g., a benzene ring), a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle and/or at the terminus of the $C_2$-$C_{60}$ alkyl group, and examples thereof may include an ethenyl group, a propenyl group, a butenyl group, and the like. The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle and/or at the terminus of the $C_2$-$C_{60}$ alkyl group, and examples thereof may include an ethynyl group, a propynyl group, and the like. The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by —$OA_{101}$ (wherein $A_{101}$ is the $C_1$-$C_{60}$ alkyl group), and examples thereof may include a methoxy group, an ethoxy group, an isopropyloxy group, and the like.

The term "$C_3$-$C_{10}$ cycloalkyl group" as utilized herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as utilized herein refers to a divalent group having the same structure as the $C_1$-$C_{10}$ heterocycloalkyl group.

The term "$C_3$-$C_{10}$ cycloalkenyl group" as utilized herein refers to a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as utilized herein refers to a divalent group having the same structure as the $C_1$-$C_{10}$ heterocycloalkenyl group.

The term "$C_6$-$C_{60}$ aryl group" as utilized herein refers to a monovalent group having a carbocyclic aromatic system of 6 to 60 carbon atoms, and the term "$C_6$-$C_{60}$ arylene group" as utilized herein refers to a divalent group having the same structure as the $C_6$-$C_{60}$ aryl group. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as utilized herein refers to a divalent group having the same structure as the $C_1$-$C_{60}$ heteroaryl group. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be condensed with each other.

The term "monovalent non-aromatic condensed polycyclic group" as utilized herein refers to a monovalent group having two or more rings condensed to each other, only carbon atoms as ring-forming atoms (for example, having 8 to 60 carbon atoms), and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as utilized herein refers to a divalent group having the same structure as the monovalent non-aromatic condensed polycyclic group described above.

The term "monovalent non-aromatic condensed heteropolycyclic group" as utilized herein refers to a monovalent group having two or more rings condensed to each other, further including, in addition to carbon atoms (for example, 1 to 60 carbon atoms), at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and the like. The term "divalent non-aromatic condensed heteropolycyclic group" as utilized herein refers to a divalent group having the same structure as the monovalent non-aromatic condensed heteropolycyclic group described above.

The term "$C_6$-$C_{60}$ aryloxy group" as utilized herein may refer to a monovalent group represented by —$OA_{102}$ (wherein $A_{102}$ is the $C_6$-$C_{60}$ aryl group), and the term "$C_6$-$C_{60}$ arylthio group" as utilized herein may refer to a monovalent group represented by —$SA_{103}$ (wherein $A_{103}$ is the $C_6$-$C_{60}$ aryl group).

The term "$C_7$-$C_{60}$ aryl alkyl group" as utilized herein may refer to a monovalent group represented by -$A_{104}A_{105}$ (wherein $A_{104}$ is a $C_1$-$C_{54}$ alkylene group, and $A_{105}$ is a $C_6$-$C_{59}$ aryl group), and the term "$C_2$-$C_{60}$ heteroarylalkyl group" as utilized herein may refer to a monovalent group represented by -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as utilized herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

In the present specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as utilized herein refers to any atom other than a carbon atom. Examples of the heteroatom may include O, S, N, P, Si, B, Ge, Se, and any combination thereof.

The term "third-row transition metal" as utilized herein includes Hf, Ta, W, Re, Os, Ir, Pt, Au, and/or the like.

"Ph" as utilized herein refers to a phenyl group, "Me" as utilized herein refers to a methyl group, "Et" as utilized herein refers to an ethyl group, "tert-Bu" or "$Bu^t$" as utilized herein refers to a tert-butyl group, and "OMe" as utilized herein refers to a methoxy group.

The term "biphenyl group" as utilized herein refers to "a phenyl group substituted with a phenyl group." For example, the "biphenyl group" is a substituted phenyl group having a $C_6$-$C_{60}$ aryl group as a substituent.

The term "terphenyl group" as utilized herein refers to "a phenyl group substituted with a biphenyl group." In For example, the "terphenyl group" is a substituted phenyl group having, as a substituent, a $C_6$-$C_{60}$ aryl group substituted with a $C_6$-$C_{60}$ aryl group.

* and *' as utilized herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The wording "B was utilized instead of A" in describing Synthesis Examples may refer to an identical molar equivalent of B being utilized in place of A.

EXAMPLES

Synthesis Example 1: Synthesis of Compound 6

Compound 6, which is a heterocyclic compound according to one or more embodiments, may be, for example, synthesized by a method such as Reaction Scheme 1:

Reaction Scheme 1

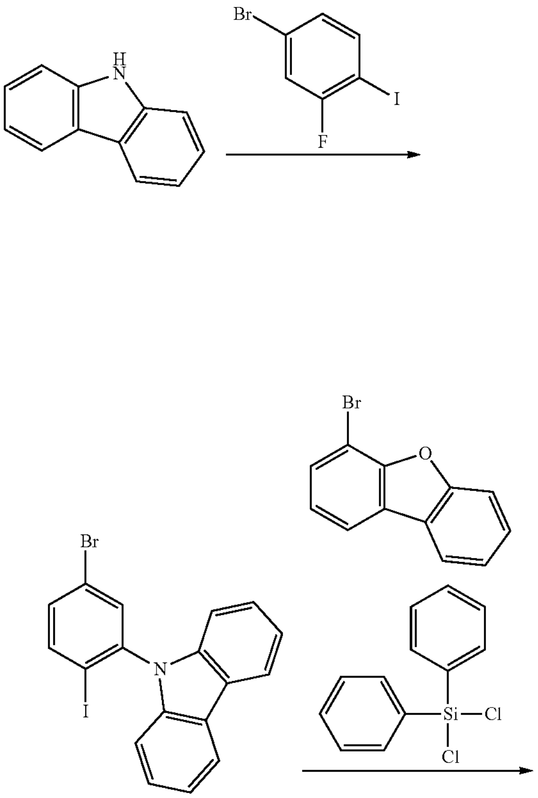

6-1

-continued

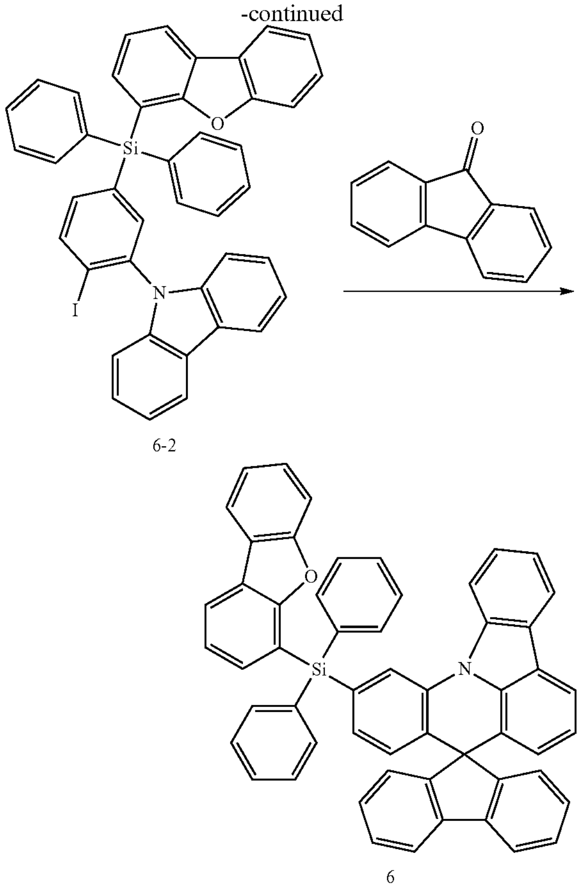

6-2

6

(Synthesis of Intermediate 6-1)

By a reaction between 9H-carbazole (CAS No: 86-74-8) and 4-bromo-2-fluoro-1-iodobenzene (CAS No: 105931-73-5), Intermediate 6-1 was obtained. Intermediate 6-1 was analyzed by liquid chromatography-mass spectrometry (LC-MS), and a M+1 peak value was identified as:

$C_{18}H_{11}BrIN$: M+1 447.93

(Synthesis of Intermediate 6-2)

Intermediate 6-1 and 4-bromodibenzofuran (CAS No: 89827-45-2) were each reacted with n-BuLi, and then with dichlorodiphenylsilane (CAS No: 80-10-4) in sequence, and Intermediate 6-2 was obtained. Intermediate 6-2 was analyzed by LC-MS, and a M+1 peak value was identified as:

$C_{42}H_{28}INOSi$: M+1 718.12

(Synthesis of Compound 6)

5 g of Intermediate 6-2 was dissolved in a reaction vessel containing 45 mL of TFT to prepare a reaction solution. The reaction solution was maintained at −78° C. After 3.2 mL of 2.5 M n-BuLi was added dropwise thereto, the reaction solution was stirred at −78° C. for 1 hour. After 1.25 g of 9H-fluorenone (CAS No: 486-25-9) dissolved in 45 mL of THF was added dropwise thereto, the reaction solution was stirred again for 24 hours at room temperature. After completion of the reaction, an extraction process was performed thereon utilizing dichloromethane, and an organic layer was collected from the reaction solution. The collected organic layer was dried utilizing magnesium sulfate, and the residue obtained by evaporating the solvent therefrom was separated and obtained by silica gel column chromatography. the intermediate was dissolved in 40 mL of acetic acid and 4 mL of hydrochloric acid, and the mixed solution was refluxed for 6 hours. To the solution cooled after completion of the reflux, 500 mL of cold water was added, and a solid was obtained through stirring and filtration. The solid was then separated and purified by silica gel column chromatography. As a result, 3.7 g (yield: 70%) of Compound 6 was obtained. Compound 6 was identified by LC-MS and $^1$H-NMR.

Synthesis Example 2: Synthesis of Compound 12

Compound 12 which is a heterocyclic compound according to one or more embodiments may be, for example, synthesized by a method substantially such as Reaction Scheme 2:

Reaction Scheme 2

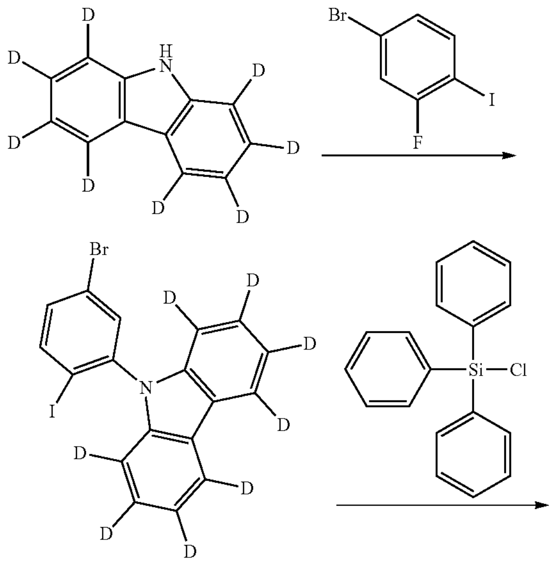

12-1

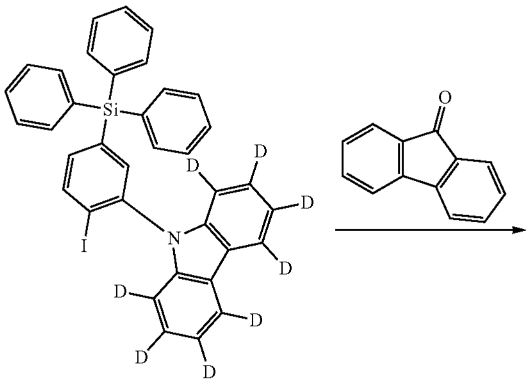

12-2

-continued

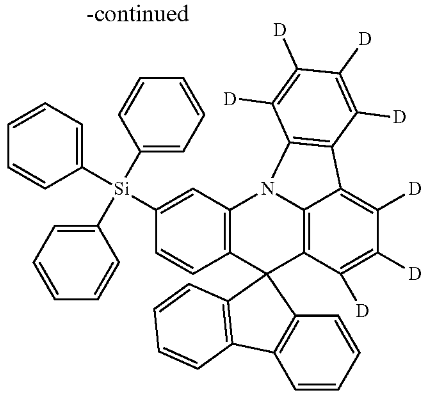

12

(Synthesis of Intermediate 12-1)

By a reaction between 9H-carbazole-1,2,3,4,5,6,7,8-d8 (CAS No: 38537-24-5) and 4-bromo-2-fluoro-1-iodobenzene (CAS No: 105931-73-5), Intermediate 12-1 was obtained. Intermediate 12-1 was analyzed by LC-MS, and a M+1 peak value was identified as:

$C_{18}H_3D_8BrIN$: M+1 455.99

(Synthesis of Intermediate 12-2)

Intermediate 12-1 was reacted with n-BuLi, and then with chlorotriphenylsilane (CAS No: 76-86-8) in sequence, and Intermediate 12-2 was obtained. Intermediate 12-2 was analyzed by LC-MS, and a M+1 peak value was identified as:

$C_{36}H_{18}D_8INSi$: M+1 646.11

(Synthesis of Compound 12)

Compound 12 was synthesized in substantially the same manner as in Synthesis Example 1, except that Intermediate 12-2 was utilized instead of Intermediate 6-2 of Synthesis Example 1. 3.8 g (yield: 72%) of Compound 12 was obtained. Compound 12 was identified by LC-MS and $^1$H-NMR.

Synthesis Example 3: Synthesis of Compound 33

Compound 33 which is a heterocyclic compound according to one or more embodiments may be, for example, synthesized by a method such as Reaction Scheme 3:

Reaction Scheme 3

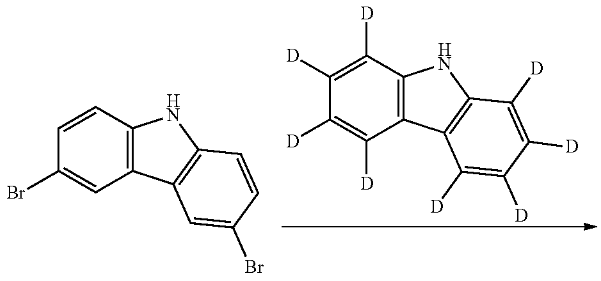

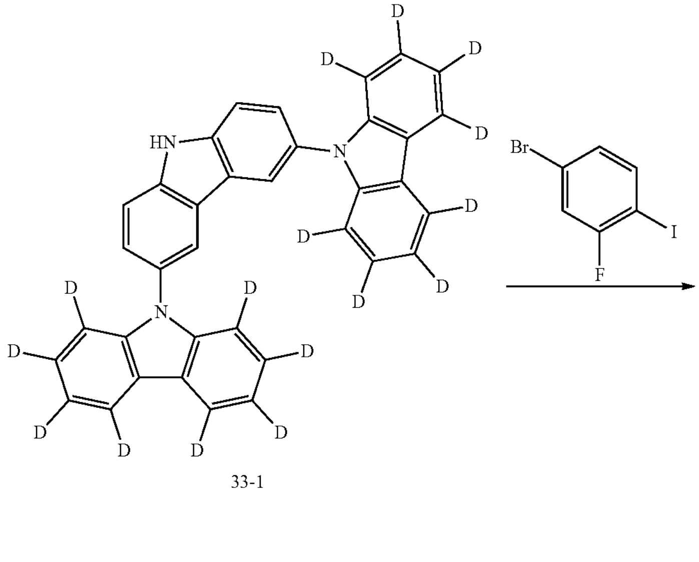

33-1

-continued
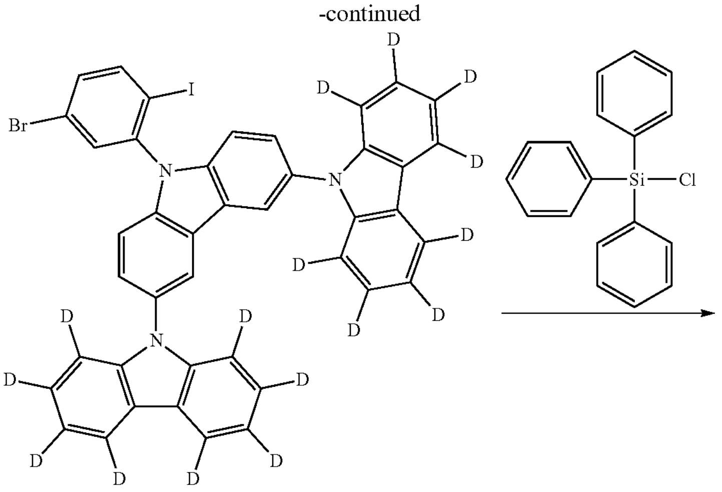
33-2
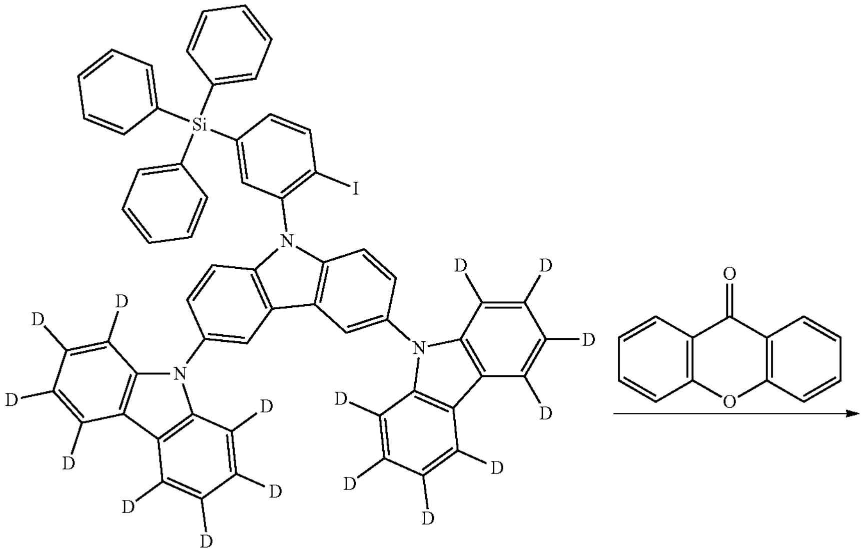
33-3
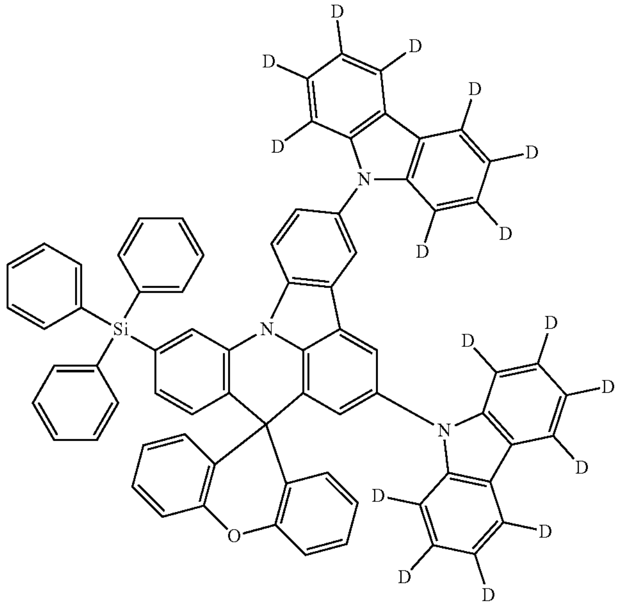
33

(Synthesis of Intermediate 33-1)

3,6-dibromo-9H-carbazole (CAS No: 6825-20-3) and 9H-carbazole-1,2,3,4,5,6,7,8-$d_8$ (CAS No: 38537-24-5) were reacted in the presence of a Pd catalyst, and Intermediate 33-1 was obtained. Intermediate 33-1 was analyzed by LC-MS, and a M+1 peak value was identified as:

$C_{36}H_7D_{16}N_3$: M+1 514.33

(Synthesis of Intermediate 33-2)

By a reaction between Intermediate 33-1 and 4-bromo-2-fluoro-1-iodobenzene (CAS No: 105931-73-5), Intermediate 33-2 was obtained. Intermediate 33-2 was analyzed by LC-MS, and a M+1 peak value was identified as:

$C_{42}H_9D_{16}BrIN_3$: M+1 794.15

(Synthesis of Intermediate 33-3)

Intermediate 33-1 was reacted with n-BuLi, and then with chlorotriphenylsilane (CAS No: 76-86-8) in sequence, and Intermediate 33-3 was obtained. Intermediate 33-3 was analyzed by LC-MS, and a M+1 peak value was identified as:

$C_{60}H_{24}D_{16}IN_3Si$: M+1 974.38

(Synthesis of Compound 33)

Compound 33 was synthesized in substantially the same manner as in Synthesis Example 1, except that Intermediate 33-3 and 9H-xanthenone (CAS No: 90-47-1) were utilized instead of Intermediate 6-2 and 9H-fluorenone (CAS No: 486-25-9) of Synthesis Example 1, respectively. 4.8 g (yield: 65%) of Compound 33 was obtained. Compound 33 was identified by LC-MS and $^1$H-NMR.

Synthesis Example 4: Synthesis of Compound 44

Compound 44 which is a heterocyclic compound according to one or more embodiments may be, for example, synthesized by a method such as Reaction Scheme 4:

Reaction Scheme 4

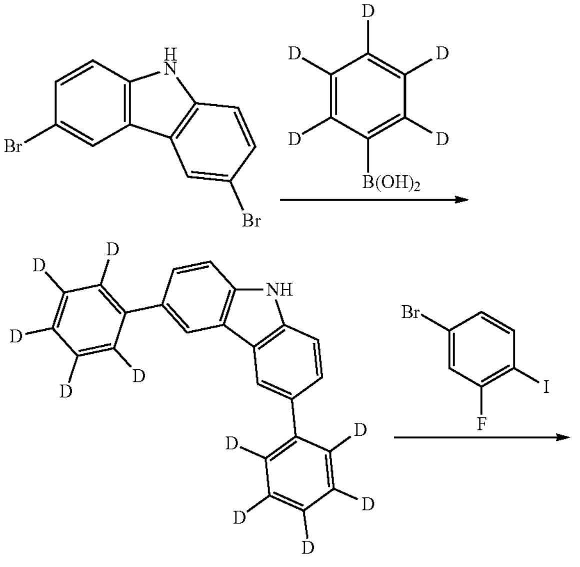

44-1

-continued

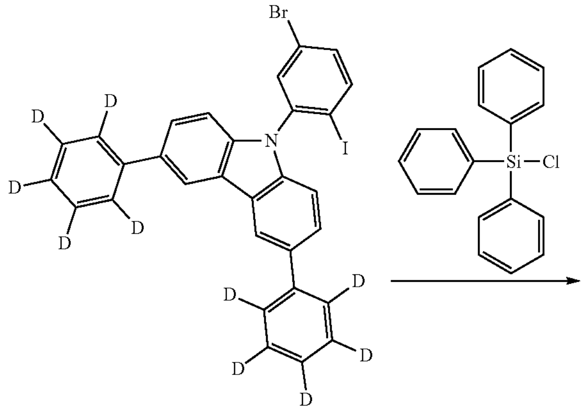

44-2

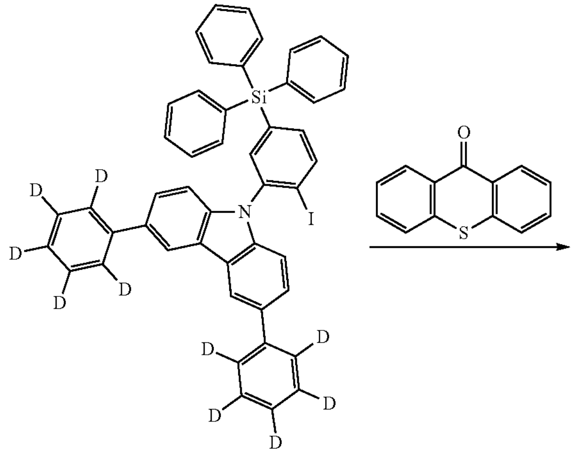

44-3

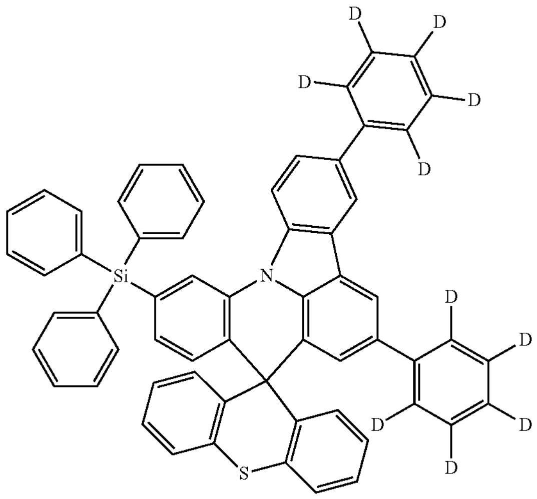

44

(Synthesis of Intermediate 44-1)

3,6-dibromo-9H-carbazole (CAS No: 6825-20-3) and phenyl-d5-boronic acid (CAS No: 215527-70-1) were reacted in the presence of a Pd catalyst, and Intermediate 44-1 was obtained. Intermediate 44-1 was analyzed by LC-MS, and a M+1 peak value was identified as:

$C_{24}H_7D_{10}N$: M+1 330.20

(Synthesis of Intermediate 44-2)

By a reaction between Intermediate 44-1 and 4-bromo-2-fluoro-1-iodobenzene (CAS No: 105931-73-5), Intermediate 44-2 was obtained. Intermediate 44-2 was analyzed by LC-MS, and a M+1 peak value was identified as:

$C_{30}H_9D_{10}BrIN$: M+1 610.01

(Synthesis of Intermediate 44-3)

Intermediate 44-2 was reacted with n-BuLi, and then with chlorotriphenylsilane (CAS No: 76-86-8) in sequence, and Intermediate 44-3 was obtained. Intermediate 44-3 was analyzed by LC-MS, and a M+1 peak value was identified as:

$C_{48}H_{24}D_{10}INSi$: M+1 790.25

(Synthesis of Compound 44)

Compound 44 was synthesized in substantially the same manner as in Synthesis Example 1, except that Intermediate 44-3 and 9H-thioxanthenone (CAS No: 492-22-8) were utilized instead of Intermediate 6-2 and 9H-fluorenone (CAS No: 486-25-9) of Synthesis Example 1, respectively. 4.4 g (yield: 68%) of Compound 44 was obtained. Compound 44 was identified by LC-MS and $^1$H-NMR.

Synthesis Example 5: Synthesis of Compound 53

Compound 53 which is a heterocyclic compound according to one or more embodiments may be, for example, synthesized by a method such as Reaction Scheme 5:

Reaction Scheme 5

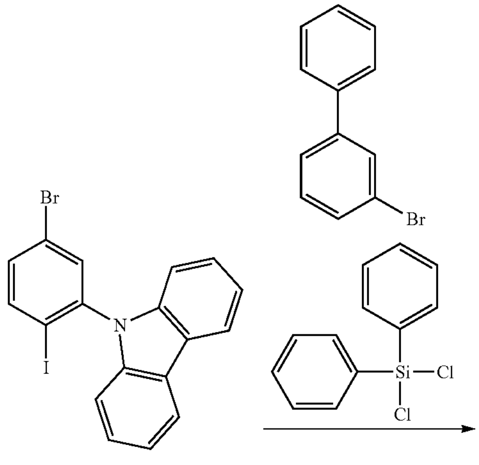

6-1

-continued

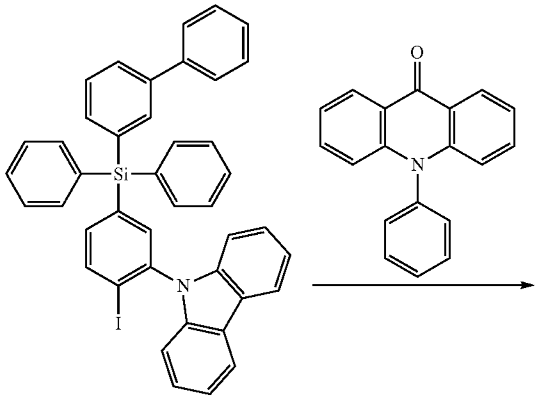

53-1

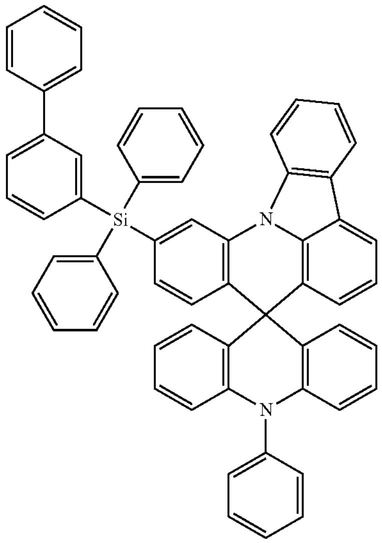

53

(Synthesis of Intermediate 53-1)

Intermediate 6-1 and 3-bromo-1,1'-biphenyl(AS No: 2113-57-7) were each reacted with n-BuLi, and then with dichlorodiphenylsilane (GAS No: 80-10-4) in sequence, and Intermediate 53-1 was obtained. Intermediate 53-1 was analyzed by LC-MS, and a M+1 peak value was identified as:

$C_{42}H_{30}INSi$: M+1 704.18

(Synthesis of Compound 53)

Compound 53 was synthesized in substantially the same manner as in Synthesis Example 1, except that Intermediate 53-1 and 10-phenylacridinone (GAS No: 5472-23-1) were utilized instead of Intermediate 6-2 and 9H-fluorenone (GAS No: 486-25-9) of Synthesis Example 1, respectively. 4.3 g (yield: 73%) of Compound 53 was obtained. Compound 53 was identified by LC-MS and $^1$H-NMR.

Synthesis Example 6: Synthesis of Compound 64

Compound 64 which is a heterocyclic compound according to one or more embodiments may be, for example, synthesized by a method such as Reaction Scheme 6:

Reaction Scheme 6

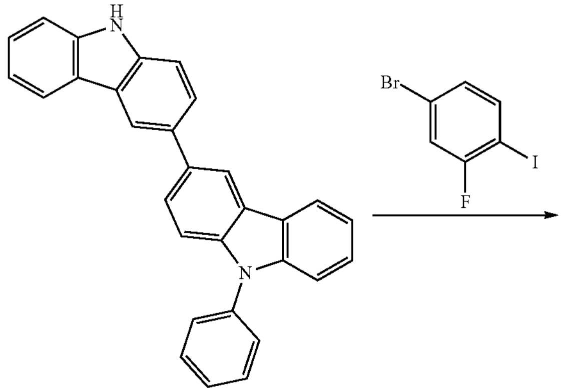

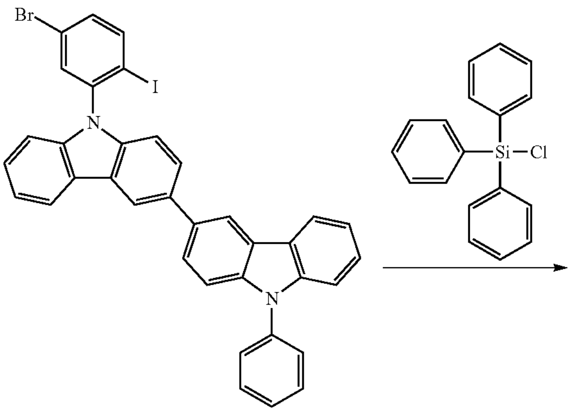

64-1

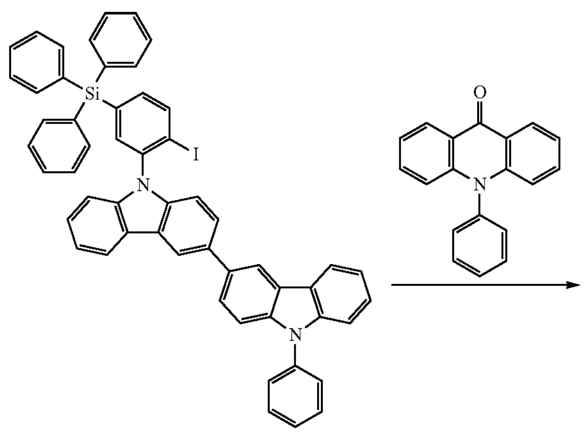

64-2

-continued

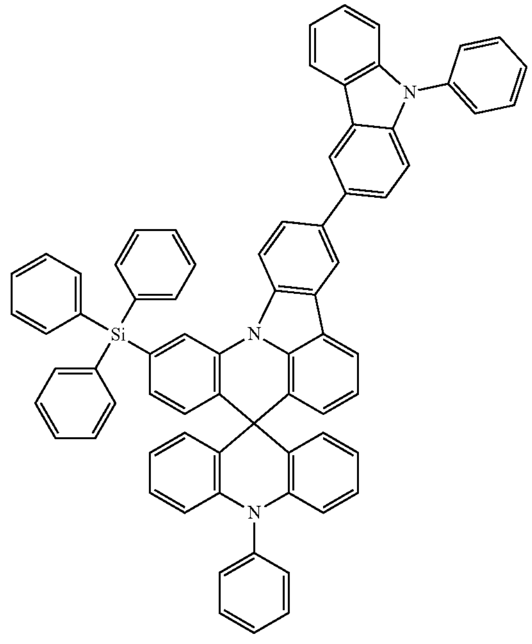

64

(Synthesis of Intermediate 64-1)

By a reaction between 9-phenyl-9H,9'H-3,3'-bicarbazole (CAS No: 1060735-14-9) and 4-bromo-2-fluoro-1-iodobenzene (CAS No: 105931-73-5), Intermediate 64-1 was obtained. Intermediate 64-1 was analyzed by LC-MS, and a M+1 peak value was identified as:

$C_{36}H_{22}BrIN_2$: M+1 689.01

(Synthesis of Intermediate 64-2)

Intermediate 64-1 was reacted with n-BuLi, and then with chlorotriphenylsilane (CAS No: 76-86-8) in sequence, and Intermediate 64-2 was obtained. Intermediate 64-2 was analyzed by LC-MS, and a M+1 peak value was identified as:

$C_{54}H_{37}IN_2Si$: M+1 869.14

(Synthesis of Compound 64)

Compound 64 was synthesized in substantially the same manner as in Synthesis Example 1, except that Intermediate 64-2 and 10-phenylacridinone (CAS No: 5472-23-1) were utilized instead of Intermediate 6-2 and 9H-fluorenone (CAS No: 486-25-9) of Synthesis Example 1, respectively. 4.8 g (yield: 70%) of Compound 64 was obtained. Compound 64 was identified by LC-MS and $^1$H-NMR.

Synthesis Example 7: Synthesis of Compound 85
Compound 85 which is a heterocyclic compound according to one or more embodiments may be, for example, synthesized by a method such as Reaction Scheme 7:
Reaction Scheme 7
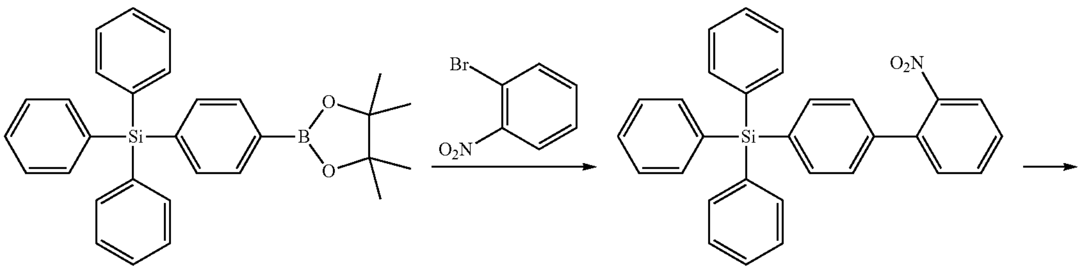
85-1
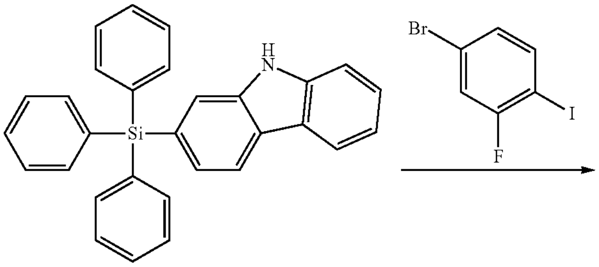
85-2
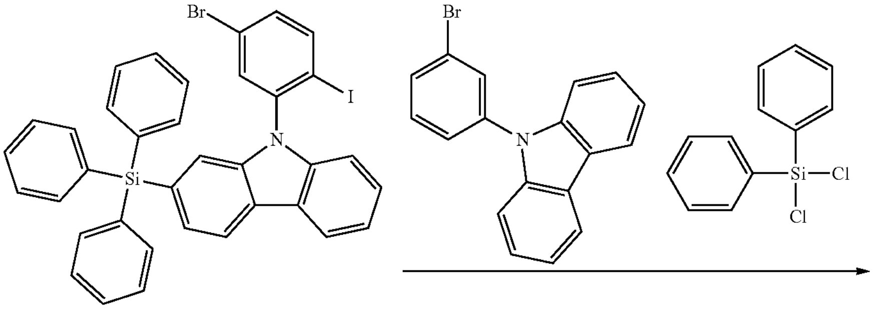
85-3
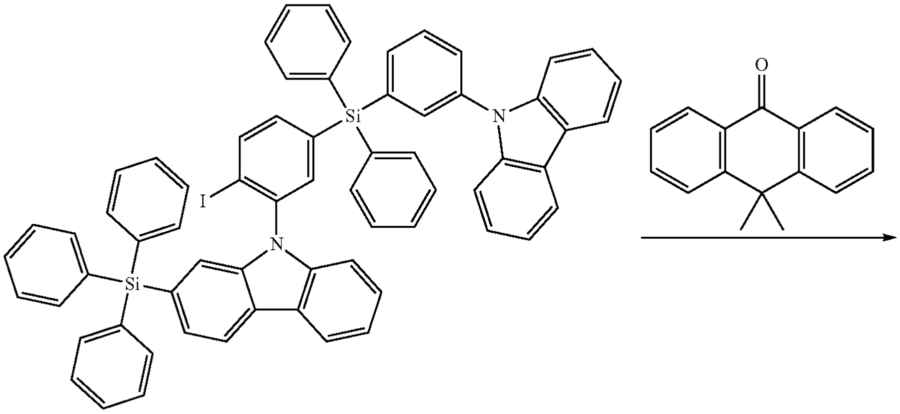
85-4

-continued

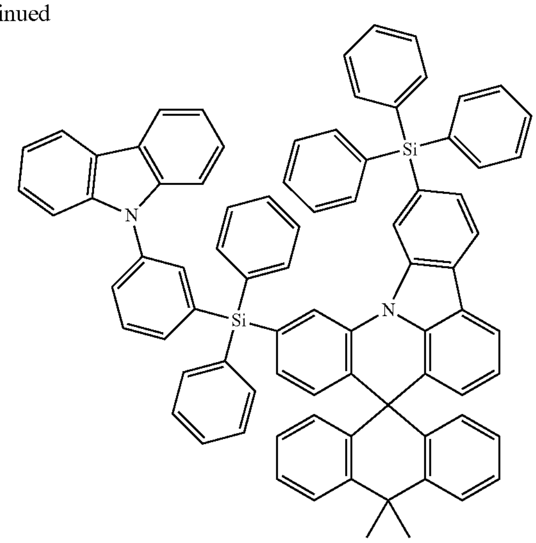

85

(Synthesis of Intermediate 85-1)

Triphenyl(4-(4,4,5,5-tetramethyl-1,3,2-dioxabororenyl)phenyl)silane (CAS No: 1197180-13-4) and 1-bromo-2-nitrobenzene (CAS No: 577-19-5) were reacted in the presence of a Pd catalyst, and Intermediate 85-1 was obtained. Intermediate 85-1 was analyzed by LC-MS, and a M+1 peak value was identified as:

$C_{30}H_{23}NO_2Si$: M+1 458.18

(Synthesis of Intermediate 85-2)

By a reaction between Intermediate 85-1 and triphenylphosphine (CAS No: 603-35-0), Intermediate 85-2 was obtained. Intermediate 85-2 was analyzed by LC-MS, and a M+1 peak value was identified as:

$C_{19}H_{14}BrNO_2S$: M+1 339.98

(Synthesis of Intermediate 85-3)

By a reaction between Intermediate 85-2 and 4-bromo-2-fluoro-1-iodobenzene (CAS No: 105931-73-5), Intermediate 85-3 was obtained. Intermediate 85-3 was analyzed by LC-MS, and a M+1 peak value was identified as:

$C_{36}H_{25}BrINSi$: M+1 706.01

(Synthesis of Intermediate 85-4)

Intermediate 85-3 and 9-(3-bromophenyl)-9H-carbazole (CAS No: 185112-61-2) were each reacted with n-BuLi, and then with dichlorodiphenylsilane (CAS No: 80-10-4) in sequence, and Intermediate 85-4 was obtained. Intermediate 85-4 was analyzed by LC-MS, and a M+1 peak value was identified as:

$C_{66}H_{47}IN_2Si_2$: M+1 1051.25

(Synthesis of Compound 85)

Compound 85 was synthesized in substantially the same manner as in Synthesis Example 1, except that Intermediate 85-4 and 10,10-dimethylanthracenone (CAS No: 5447-86-9) were utilized instead of Intermediate 6-2 and 9H-fluorenone (CAS No: 486-25-9) of Synthesis Example 1, respectively. 3.5 g (yield: 64%) of Compound 85 was obtained. Compound 85 was identified by LC-MS and $^1$H-NMR.

Synthesis Example 8: Synthesis of Compound 88

Compound 88 which is a heterocyclic compound according to one or more embodiments may be, for example, synthesized by a method such as Reaction Scheme 8:

Reaction Scheme 8

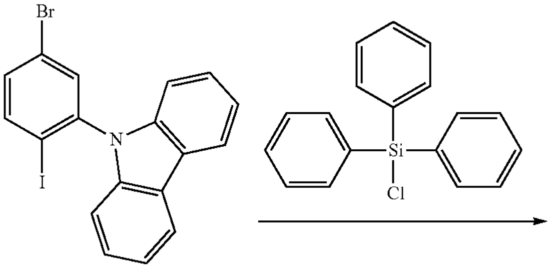

6-1

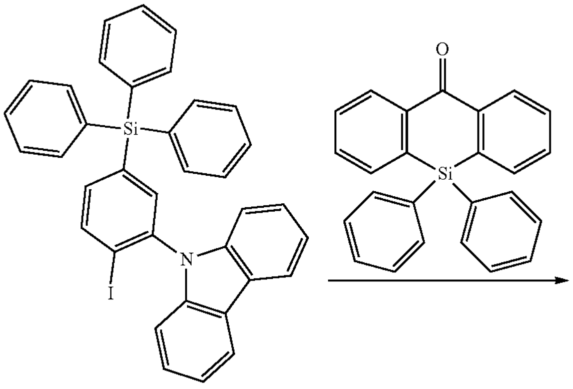

88-1

-continued

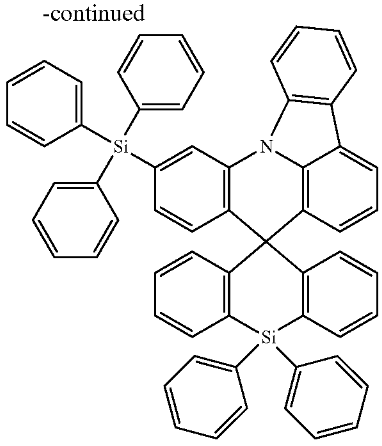

88

(Synthesis of Intermediate 88-1)

Intermediate 6-1 was reacted with n-BuLi, and then with chlorotriphenylsilane (CAS No: 76-86-8) in sequence, and Intermediate 88-1 was obtained. Intermediate 88-1 was analyzed by LC-MS, and a M+1 peak value was identified as:

$C_{36}H_{26}INSi$: M+1 628.11

(Synthesis of Compound 88)

Compound 88 was synthesized in substantially the same manner as in Synthesis Example 1, except that Intermediate 88-1 and 5,5-diphenyldibenzosilinone (CAS No: 53689-83-1) were utilized instead of Intermediate 6-2 and 9H-fluorenone (CAS No: 486-25-9) of Synthesis Example 1, respectively. 5.4 g (yield: 67%) of Compound 88 was obtained. Compound 88 was identified by LC-MS and $^1$H-NMR.

Regarding Compounds 6, 12, 33, 44, 53, 64, 85, and 88 synthesized as described above, 1H-NMR and MS observation data are as shown in Table 1.

TABLE 1

| Target to be measured | H NMR (δ) | MS/FAB calc. | MS/FAB found |
|---|---|---|---|
| Compound 6 | 8.45(d, 1H), 8.19(d, 1H), 8.08(d, 1H), 7.98(d, 1H), 7.90(d, 2H), 7.65(s, 1H), 7.58-7.20(m, 27H), 6.98(d, 1H) | 753.25 | 754.30 |
| Compound 12 | 7.90(d, 2H), 7.65(s, 1H), 7.55(d, 2H), 7.46-7.38(m, 19H), 7.28(t, 2H) | 670.28 | 671.24 |
| Compound 33 | 7.80(s, 1H), 7.72(d, 1H), 7.67(s, 1H), 7.65(s, 1H), 7.57(s, 1H), 7.46-7.31(m, 20H), 7.17(d, 2H), 7.14(d, 2H), 7.01(t, 2H) | 1025.45 | 1026.48 |
| Compound 44 | 8.69(s, 1H), 7.99(d, 1H), 7.89(s, 1H), 7.79(s, 1H), 7.77(d, 1H), 7.69(d, 2H), 7.65(s, 1H), 7.42-7.33(m, 19H), 7.03-6.98(m, 4H) | 857.34 | 858.33 |
| Compound 53 | 8.45(d, 1H), 8.19(d, 1H), 7.88(s, 1H), 7.75(d, 2H), 7.64-7.38(m, 21H), 7.57-6.95(m, 16H) | 830.31 | 831.28 |
| Compound 64 | 8.45(d, 1H), 8.30(d, 1H), 8.19(d, 1H), 8.13(d, 1H), 7.99(d, 1H), 7.89(s, 2H), 7.77(d, 1H), 7.62-7.38(m, 25H), 7.24-6.95(m, 16H) | 995.37 | 996.34 |
| Compound 85 | 8.55(d, 1H), 8.45(d, 1H), 8.20(t, 2H), 7.94(d, 1H), 7.68-7.58(m, 6H), 7.50-7.16(m, 42H), 6.98(d, 1H), 1.69(s, 6H) | 1128.43 | 1129.45 |

TABLE 1-continued

| Target to be measured | H NMR (δ) | MS/FAB calc. | MS/FAB found |
|---|---|---|---|
| Compound 88 | 8.45(d, 1H), 8.19(d, 1H), 7.65(s, 1H), 7.58(d, 1H), 7.50-7.38(m, 32H), 7.27-7.20(m, 6H), 6.98(d, 1H) | 845.29 | 846.32 |

Evaluation Example 1

Regarding the compounds of Synthesis Examples, the LUMO and HOMO values were measured according to methods described in Table 2, and the HOMO, LUMO, and $T_1$ values were calculated utilizing the DFT method of the Gaussian 09 program (structural optimization at B3LYP, 6-311G(d,p) levels). Based on the calculation results, each of Compounds 6, 12, 33, 44, 53, 64, 85, and 88 was found to satisfy the following conditions:

i) $T_1$ is in a range of about 2.95 eV to about 3.05 eV;

ii) HOMO is in a range of about −5.60 eV to about −5.35 eV; and iii) LUMO is in a range of about −2.30 eV to about −1.75 eV.

TABLE 2

| | |
|---|---|
| HOMO energy level evaluation method | By utilizing differential pulse voltammetry (DPV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the output value of the graph, the HOMO energy level of each compound was calculated. |
| LUMO energy level evaluation method | By utilizing differential pulse voltammetry (DPV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the output value of the graph, the LUMO energy level of each compound was calculated. |

Example 1

As an anode, a substrate with an ITO deposited thereon was cut to a size of 50 mm×50 mm×0.7 mm, sonicated with acetone, isopropyl alcohol, and pure water, each for 15 minutes, and then cleaned by exposure to ultraviolet rays and ozone for 30 minutes. Then, the glass substrate was provided to a vacuum deposition apparatus.

N,N'-di(1-naphthyl)-N,N'-diphenylbenzidine (Compound NPB) was vacuum-deposited on the ITO substrate to form a hole injection layer having a thickness of 300 Å, and 1,3-di-9-carbazolylbenzene (mCP) was vacuum-deposited on the hole injection layer to form a hole transport layer having a thickness of 200 Å.

Compound 6 and $Ir(pmp)_3$ (which is a suitable blue phosphorescent dopant) were co-deposited on the hole transport layer at a weight ratio of 92:8 to form an emission layer having a thickness of 250 Å.

3-(4-biphenylyl)-4-phenyl-5-tert-butylphenyl-1,2,4-triazole) (TAZ) was deposited on the emission layer to form an electron transport layer having a thickness of 200 Å, and LiF which is a halogenated alkali metal was deposited on the electron transport layer to a thickness of 10 Å and Al was vacuum-deposited thereon to a thickness of 100 Å to form a LiF/Al cathode electrode, thereby completing the manufacture of a light-emitting device.

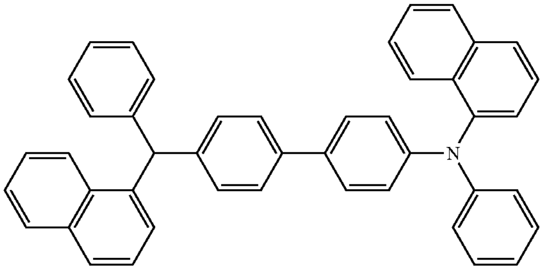

NPB

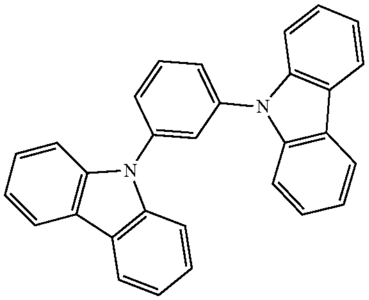

mCP

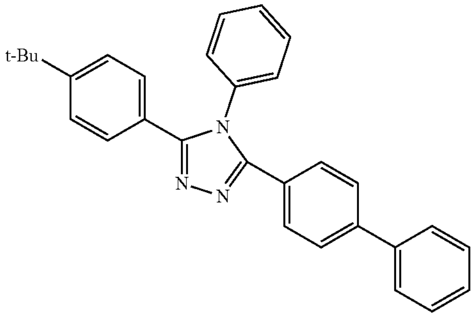

TAZ

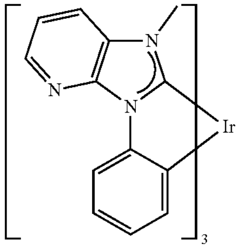

Ir(pmp)3

Examples 2 to 8

Light-emitting devices were prepared in substantially the same manner as in Example 1, except that different hosts shown in Table 4 were utilized in forming the emission layer.

Comparative Examples 1 to 4

Light-emitting devices were prepared in substantially the same manner as in Example 1, except that different hosts shown in Table 4 were utilized in forming the emission layer.

To evaluate characteristics of the organic light-emitting devices of Examples and Comparative Examples, driving voltage and maximum quantum dot efficiency were measured at a current density of 2.3 mA/cm$^2$. Here, the driving voltage and current density of the organic light-emitting devices were measured utilizing a source meter (Keithley Instrument, 2400 series), and the maximum quantum efficiency was measured utilizing the external quantum efficiency measurement device C9920-2-12 of Hamamatsu Photonics Inc. In evaluating the maximum quantum efficiency, the luminance/current density was measured utilizing a luminance meter that was calibrated for wavelength sensitivity, and the maximum quantum efficiency was converted by assuming an angular luminance distribution (Lambertian) which introduced a perfect reflecting diffuser. Evaluation results of the characteristics of the light-emitting devices of Examples and Comparative Examples are shown in Table 3.

TABLE 3

| | | Host of emission layer | Driving voltage (V) | Current density (mA/cm$^2$) | Maximum quantum efficiency (%) | Emission color |
|---|---|---|---|---|---|---|
| Example | 1 | Compound 6 | 4.5 | 2.3 | 27.1 | Blue |
| | 2 | Compound 12 | 4.3 | 2.3 | 27.7 | Blue |
| | 3 | Compound 33 | 4.6 | 2.3 | 28.4 | Blue |
| | 4 | Compound 44 | 4.3 | 2.3 | 25.8 | Blue |
| | 5 | Compound 53 | 4.5 | 2.3 | 26.6 | Blue |
| | 6 | Compound 64 | 4.5 | 2.3 | 27.3 | Blue |
| | 7 | Compound 85 | 4.5 | 2.3 | 26.7 | Blue |
| | 8 | Compound 88 | 4.6 | 2.3 | 25.9 | Blue |
| Comparative Example | 1 | Comparative Compound 1 | 5.5 | 2.3 | 22.5 | Blue |
| | 2 | Comparative Compound 2 | 5.1 | 2.3 | 24.3 | Blue |
| | 3 | Comparative Compound 3 | 5.2 | 2.3 | 23.4 | Blue |
| | 4 | Comparative Compound 4 | 4.9 | 2.3 | 24.9 | Blue |

1) Structural Formula of Comparative Compound 1

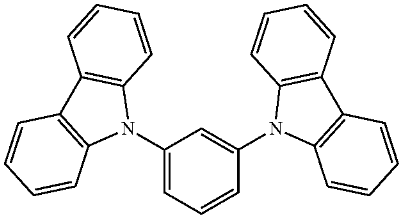 [SMILES: c1cc(-n2c3ccccc3c3ccccc32)cc(-n2c3ccccc3c3ccccc32)c1]

2) Structural Formula of Comparative Compound 2

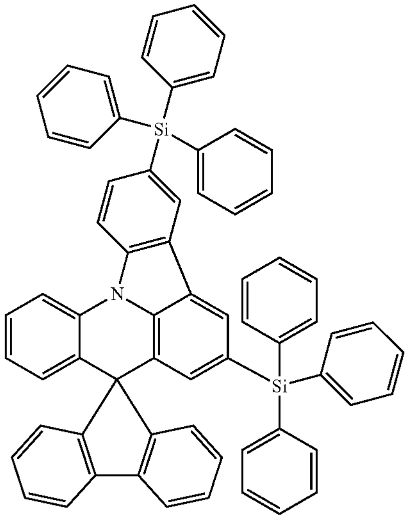 [SMILES: c1ccc([Si](c2ccccc2)(c2ccccc2)c2ccc3c(c2)c2cc([Si](c4ccccc4)(c4ccccc4)c4ccccc4)cc4c2n3-c2ccccc2C42c3ccccc3-c3ccccc32)cc1]

3) Structural Formula of Comparative Compound 3

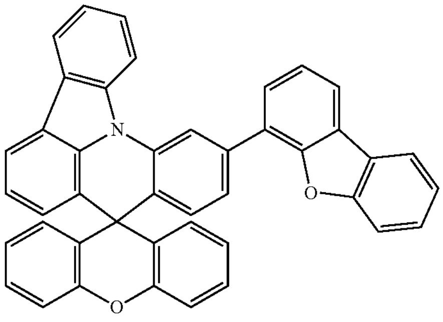 [SMILES: c1ccc2c(c1)Oc1ccccc1C21c2ccc(-c3cccc4c3oc3ccccc34)cc2-n2c3ccccc3c3cccc1c32]

4) Structural Formula of Comparative Compound 4

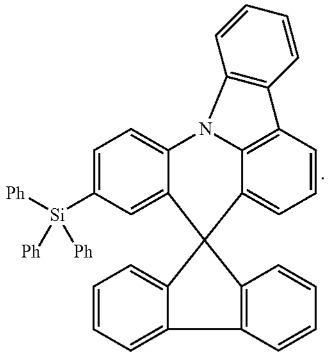 [SMILES: c1ccc([Si](c2ccccc2)(c2ccccc2)c2ccc3c(c2)C2(c4ccccc4-c4ccccc42)c2cccc4c5ccccc5n-3c24)cc1]

Referring to Table 4, it was confirmed that the light-emitting devices of Examples had uniformly superior driving voltage (V) and maximum quantum efficiency (%) as compared with the light-emitting devices of Comparative Examples 1 to 4.

According to the one or more embodiments, the use of a heterocyclic compound may enable the manufacture a light-emitting device having high efficiency and a long lifespan and accordingly a high-quality electronic apparatus including the light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device comprising:

a first electrode;

a second electrode facing the first electrode;

an interlayer between the first electrode and the second electrode, the interlayer comprising an emission layer; and a heterocyclic compound represented by Formula 1:

Formula 1

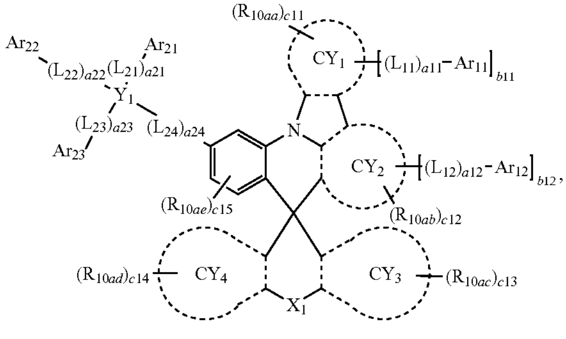

wherein in Formula 1, $X_1$ is a single bond, O, S, $N(Q_1)$, $P(Q_1)$, $C(Q_1)(Q_2)$, or $Si(Q_1)(Q_2)$, $Y_1$ is C or Si, rings $CY_1$ to $CY_4$ are each independently a $C_6$-$C_{60}$ carbocyclic group or a $C_3$-$C_{60}$ heterocyclic group, $L_{11}$, $L_{12}$, $L_{21}$, $L_{22}$, $L_{23}$, $L_{24}$, $Ar_{11}$, $Ar_{12}$, $Ar_{21}$, $Ar_{22}$, and $Ar_{23}$ are each independently a $C_6$-$C_{60}$ carbocyclic group unsubstituted or substituted with at least one $R_{10a}$ or a $C_3$-$C_{60}$ heterocyclic group unsubstituted or substituted with at least one $R_{10a}$, a11, a12, a21, a22, a23, and a24 are each independently an integer from 0 to 3, $*-(L_{11})_{a11}-*'$ is a single bond when a11 is 0, $*-(L_{12})_{a12}-*'$ is a single bond when a12 is 0, $*-(L_{21})_{a21}-*'$ is a single bond when a21 is 0, $*-(L_{22})_{a22}-*'$ is a single bond when a22 is 0, $*-(L_{23})_{a23}-*'$ is a single bond when a23 is 0, $*-(L_{24})_{a24}-*'$ is a single bond when a24 is 0,

* and *' each indicate a binding site to a neighboring atom, b11 and b12 are each independently an integer of 0 to 4, $R_{10a}$, $R_{10aa}$, $R_{10ab}$, $R_{10ac}$, $R_{10ad}$, and $R_{10ae}$ are each independently:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), c11 to c14 are each independently an integer from 0 to 8, c15 is an integer from 0 to 3, a sum of b11+c11 is 8 or less, a sum of b12+c12 is 8 or less, $Q_1$, $Q_2$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

2. The light-emitting device of claim 1, wherein the interlayer comprises the heterocyclic compound represented by Formula 1.

3. The light-emitting device of claim 1, wherein the emission layer comprises the heterocyclic compound represented by Formula 1.

4. The light-emitting device of claim 1, wherein the first electrode is an anode, the second electrode is a cathode, the interlayer further comprises a hole transport region between the first electrode and the emission layer, and an electron transport region between the emission layer and the second electrode, the hole transport region comprises a hole injection layer, a hole transport layer, an emission auxiliary layer, an electron blocking layer, or any combination thereof, and the electron transport region comprises a hole blocking layer, an electron transport layer, an electron injection layer, or any combination thereof.

5. The light-emitting device of claim 3, further comprising a first capping layer and/or a second capping layer, wherein at least one of the first capping layer or the second capping layer is on a surface of the second electrode.

6. The light-emitting device of claim 3, further comprising a first capping layer and/or a second capping layer, wherein one of the first capping layer or the second capping layer comprises the heterocyclic compound represented by Formula 1.

7. The light-emitting device of claim 1, wherein the emission layer is configured to emit blue light.

8. An electronic apparatus comprising the light-emitting device of claim 1.

9. The electronic apparatus of claim 8, further comprising a thin-film transistor, wherein the thin-film transistor comprises a source electrode and a drain electrode, and the first electrode of the light-emitting device is electrically connected to one of the source electrode or the drain electrode of the thin-film transistor.

10. The electronic apparatus of claim 8, further comprising a color filter, a color conversion layer, a touch screen layer, a polarizing layer, or any combination thereof.

11. A heterocyclic compound represented by Formula 1:

Formula 1

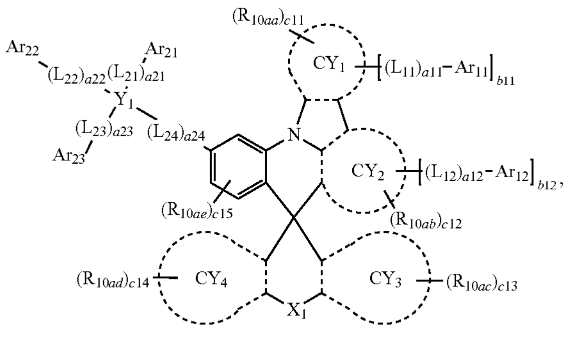

wherein in Formula 1, $X_1$ is a single bond, O, S, N($Q_1$), P($Q_1$), C($Q_1$)($Q_2$), or Si($Q_1$)($Q_2$), $Y_1$ is C or Si, rings $CY_1$ to $CY_4$ are each independently a $C_6$-$C_{60}$ carbocyclic group or a $C_3$-$C_{60}$ heterocyclic group, $L_{11}$, $L_{12}$, $L_{21}$, $L_{22}$, $L_{23}$, $L_{24}$, $Ar_{11}$, $Ar_{12}$, $Ar_{21}$, $Ar_{22}$, and $Ar_{23}$ are each independently a $C_6$-$C_{60}$ carbocyclic group unsubstituted or substituted with at least one $R_{10a}$ or a $C_3$-$C_{60}$ heterocyclic group unsubstituted or substituted with at least one $R_{10a}$, a11, a12, a21, a22, a23, and a24 are each independently an integer from 0 to 3,

*-$(L_{11})_{a11}$-*' is a single bond when a11 is 0,

*-$(L_{12})_{a12}$-*' is a single bond when a12 is 0,

*-$(L_{21})_{a21}$-*' is a single bond when a21 is 0,

*-$(L_{22})_{a22}$-*' is a single bond when a22 is 0,

*-$(L_{23})_{a23}$-*' is a single bond when a23 is 0,

*-$(L_{24})_{a24}$-*' is a single bond when a24 is 0,

* and *' each indicate a binding site to a neighboring atom, b11 and b12 are each independently an integer from 0 to 4, $R_{10a}$, $R_{10aa}$, $R_{10ab}$, $R_{10ac}$, $R_{10ad}$, and $R_{10ae}$ are each independently:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof; or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, c11 to c14 are each independently an integer from 0 to 8, c15 is an integer from 0 to 3, a sum of b11+c11 is 8 or less, a sum of b12+c12 is 8 or less, $Q_1$, $Q_2$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

12. The heterocyclic compound of claim 11, wherein the heterocyclic compound satisfies at least one of Conditions i) to iv):

i) ring $CY_1$ is a benzene group and a sum of b11+c11 is 4 or less, or ring $CY_1$ is a naphthalene group and a sum of b11+c11 is 6 or less;

ii) ring $CY_2$ is a benzene group and a sum of b12+c12 is 4 or less, or ring $CY_2$ is a naphthalene group and a sum of b12+c12 is 6 or less;

iii) ring $CY_3$ is a benzene group and c13 is 4 or less, or ring $CY_3$ is a naphthalene group and c13 is 6 or less; and iv) ring $CY_4$ is a benzene group and c14 is 4 or less, or ring $CY_4$ is a naphthalene group and c14 is 6 or less.

13. The heterocyclic compound of claim 11, wherein $L_{11}$, $L_{12}$, $L_{21}$, $L_{22}$, $L_{23}$, $L_{24}$, $Ar_{11}$, $Ar_{12}$, $Ar_{21}$, $Ar_{22}$, and $Ar_{23}$ are each independently one of a benzene group unsubstituted or substituted with at least one $R_{10a}$, a naphthalene group unsubstituted or substituted with at least one $R_{10a}$, or a π electron-rich $C_3$-$C_{60}$ cyclic group unsubstituted or substituted with at least one $R_{10a}$.

14. The heterocyclic compound of claim 11, wherein $L_{11}$, $L_{12}$, $L_{21}$, $L_{22}$, $L_{23}$, and $L_{24}$ are each independently one of Formulae 1-5-1 to 1-5-3:

1-5-1

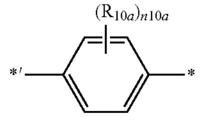

1-5-2

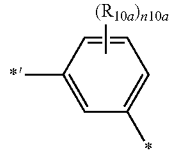

1-5-3

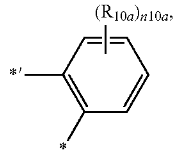

and wherein, in Formulae 1-5-1 to 1-5-3, $R_{10a}$ is as defined in Formula 1, n10a is an integer from 0 to 4, and

* and *' each indicate a binding site to a neighboring atom.

15. The heterocyclic compound of claim 11, wherein $L_{11}$, $L_{12}$, $L_{21}$, $L_{22}$, $L_{23}$, and $L_{24}$ are each independently one of Formulae 1-5-4 to 1-5-6:

1-5-4

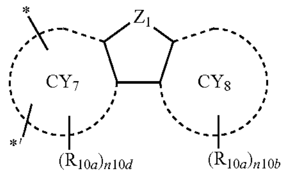

1-5-5

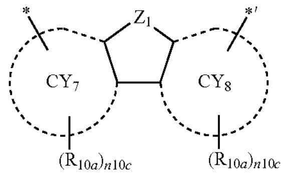

1-5-6

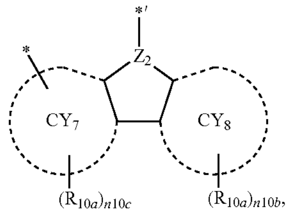

and wherein, in Formulae 1-5-4 to 1-5-6, $Z_1$ is O, S, N$(Q_5)$, P$(Q_5)$, C$(Q_5)(Q_6)$, or Si$(Q_5)(Q_6)$, $Z_2$ is N, P, C$(Q_5)$, or Si$(Q_6)$, $CY_7$ and $CY_8$ are each independently a $C_3$-$C_{30}$ carbocyclic group or a $C_1$-$C_{30}$ heterocyclic group, n10b is an integer from 0 to 6, n10c is an integer from 0 to 5, n10d is an integer from 0 to 4,

* and *' each indicate a binding site to a neighboring atom, and $Q_5$ and $Q_6$ are respectively as defined in connection with $Q_1$ and $Q_2$ in Formula 1.

16. The heterocyclic compound of claim 11, wherein $Ar_{11}$, $Ar_{12}$, $Ar_{21}$, $Ar_{22}$, and $Ar_{23}$ are each independently one of Formulae 1-6-1 and 1-6-2:

1-6-1

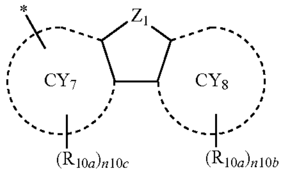

1-6-2

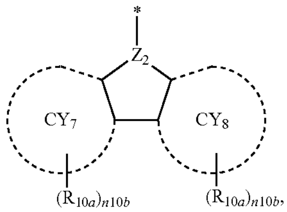

and wherein, in Formulae 1-6-1 and 1-6-2, $Z_1$ is O, S, $N(Q_5)$, $P(Q_5)$, $C(Q_5)(Q_6)$, or $Si(Q_5)(Q_6)$, $Z_2$ is N, P, $C(Q_5)$, or $Si(Q_6)$, $CY_7$ and $CY_8$ are each independently a $C_3$-$C_{30}$ carbocyclic group or a $C_1$-$C_{30}$ heterocyclic group, n10b is an integer from 0 to 6, n10c is an integer from 0 to 5,

* and *' each indicate a binding site to a neighboring atom, and $Q_5$ and $Q_6$ are respectively as defined in connection with $Q_1$ and $Q_2$ in Formula 1.

17. The heterocyclic compound of claim 11, wherein a portion represented by

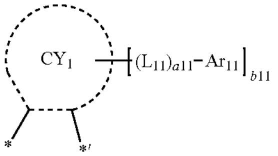

in Formula 1 is a group represented by one of Formulae 1-1-1 to 1-1-4:

1-1-1

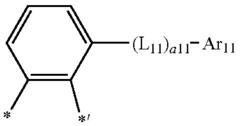

1-1-2

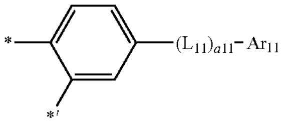

-continued 1-1-3

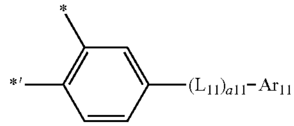

1-1-4

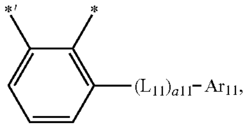

and wherein, in Formulae 1-1-1 to 1-1-4, $L_{11}$, a11, and $Ar_{11}$ are respectively as defined in connection with Formula 1, and

* and *' each indicate a binding site to a neighboring atom.

18. The heterocyclic compound of claim 11, wherein a portion represented by

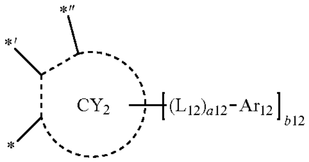

in Formula 1 is a group represented by one of Formulae 1-1-5 to 1-1-7:

1-1-5

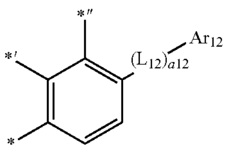

1-1-6

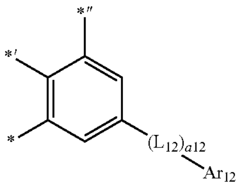

1-1-7

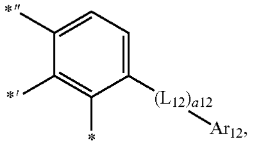

and wherein, in Formulae 1-1-5 to 1-1-7, $L_{12}$, $Ar_{12}$, and a12 are respectively as defined in connection with Formula 1, and

*, *' and *" each indicate a binding site to a neighboring atom.

19. The heterocyclic compound of claim 11, wherein a portion represented by
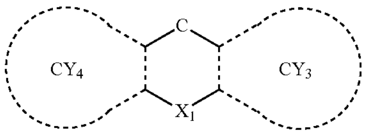
in Formula 1 is a group represented by one of Formulae 1-2-1 to 1-2-16:
1-2-1
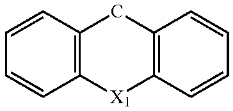
1-2-2
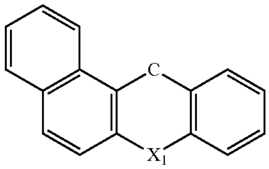
1-2-3
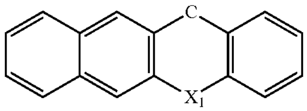
1-2-4
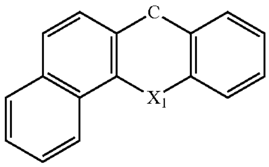
1-2-5
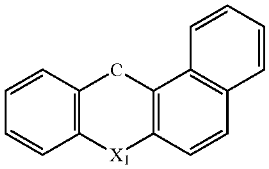
1-2-6
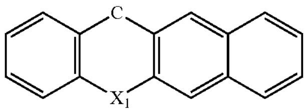
1-2-7
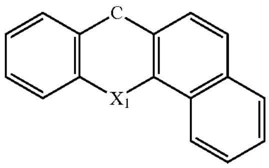
1-2-8
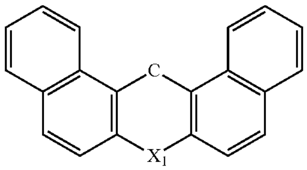
-continued
1-2-9
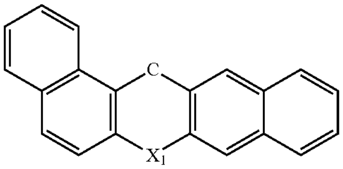
1-2-10
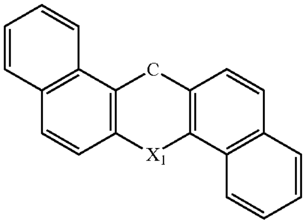
1-2-11
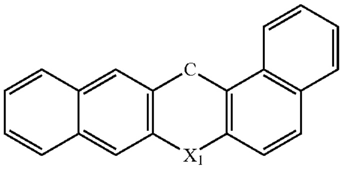
1-2-12
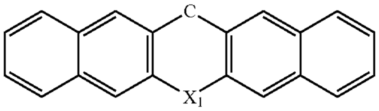
1-2-13
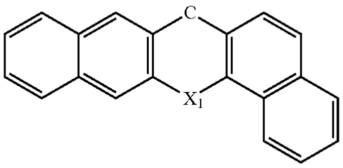
1-2-14
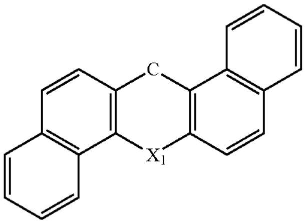
1-2-15
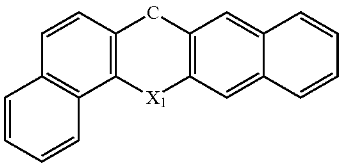
1-2-16
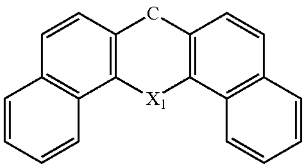
,
and
wherein, in Formulae 1-2-1 to 1-2-16,
$X_1$ is as defined in connection with Formula 1.

20. A heterocyclic compound satisfying both Conditions v and vi:

v) the heterocyclic compound comprises a core represented by Formula 1-1:

Formula 1-1

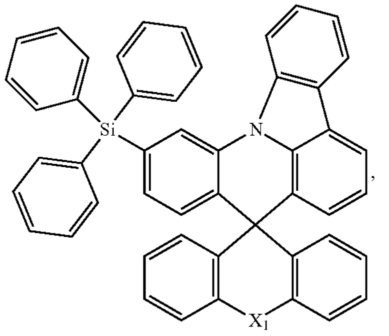

wherein in Formula 1-1, $X_1$ is a single bond, O, S, $N(Q_1)$, $P(Q_1)$, $C(Q_1)(Q_2)$, or $Si(Q_1)(Q_2)$, $Q_1$ and $Q_2$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and $Q_1$ and $Q_2$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$; and vi) a $T_1$ energy level of the heterocyclic compound is in a range of about 2.95 eV to about 3.05 eV, or a HOMO energy level of the heterocyclic compound is in a range of about −5.60 eV to about −5.35 eV, or a LUMO energy level of the heterocyclic compound is in a range of about −2.30 eV to about −1.75 eV.

* * * * *